United States Patent
Marakhtanov et al.

(10) Patent No.: US 10,916,409 B2
(45) Date of Patent: Feb. 9, 2021

(54) ACTIVE CONTROL OF RADIAL ETCH UNIFORMITY

(71) Applicant: Lam Research Corporation, Fremont, CA (US)

(72) Inventors: Alexei Marakhtanov, Albany, CA (US); Felix Leib Kozakevich, Sunnyvale, CA (US); John Holland, San Jose, CA (US); Bing Ji, Pleasanton, CA (US); Kenneth Lucchesi, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/011,442

(22) Filed: Jun. 18, 2018

(65) Prior Publication Data
US 2019/0385822 A1     Dec. 19, 2019

(51) Int. Cl.
| H01J 37/32 | (2006.01) |
| H01L 21/67 | (2006.01) |
| H05H 1/46 | (2006.01) |

(52) U.S. Cl.
CPC .. *H01J 37/32165* (2013.01); *H01J 37/32183* (2013.01); *H01L 21/67069* (2013.01); *H01J 2237/24507* (2013.01); *H01J 2237/327* (2013.01); *H01J 2237/3344* (2013.01)

(58) Field of Classification Search
CPC ........... H01J 37/32082; H01J 37/32174; H01J 37/32165; H01J 37/32091; H01J 37/321; H01J 37/32183; H01J 23/54; H01J 49/0036

USPC ............ 156/345.44, 345.47, 345.28, 345.48
See application file for complete search history.

(56) References Cited

U.S. PATENT DOCUMENTS

| | | | |
|---|---|---|---|
| 5,473,291 A * | 12/1995 | Brounley | H01J 37/32082 333/17.3 |
| 8,911,637 B2 | 12/2014 | Dhindsa et al. | |
| 9,337,000 B2 | 5/2016 | Marakhtanov et al. | |
| 9,401,264 B2 | 7/2016 | Marakhtanov et al. | |
| 9,578,731 B2 * | 2/2017 | Van Zyl | H05H 1/46 |
| 2006/0091878 A1 * | 5/2006 | Wilson | H01J 37/32082 324/76.14 |
| 2008/0178803 A1 | 7/2008 | Collins et al. | |
| 2010/0194195 A1 * | 8/2010 | Coumou | H01J 37/32165 307/24 |
| 2010/0283395 A1 * | 11/2010 | Van Zyl | H01J 37/32082 315/160 |

(Continued)

OTHER PUBLICATIONS

Title: Fundamental Frequency and Harmonics, Author: Tom Henderson (Year: 2001) p. 1-8.*

(Continued)

*Primary Examiner* — Wei (Victor) Y Chan
(74) *Attorney, Agent, or Firm* — Penilla IP, APC

(57) ABSTRACT

Systems and methods for active control of radial etch uniformity are described. One of the methods includes generating a radio frequency (RF) signal having a fundamental frequency and generating another RF signal having a harmonic frequency. The harmonic frequency, or a phase, or a parameter level, or a combination thereof of the other RF signal are controlled to control harmonics of RF plasma sheath within a plasma chamber to achieve radial etch uniformity.

29 Claims, 9 Drawing Sheets

(56) References Cited

U.S. PATENT DOCUMENTS

| | | |
|---|---|---|
| 2013/0002136 A1* | 1/2013 | Blackburn ............... H05H 1/24 |
| | | 315/111.21 |
| 2013/0122711 A1 | 5/2013 | Marakhtanov et al. |
| 2013/0199727 A1 | 8/2013 | Iwata et al. |
| 2013/0213934 A1* | 8/2013 | Valcore, Jr. ....... H01J 37/32091 |
| | | 216/67 |
| 2014/0305589 A1* | 10/2014 | Valcore, Jr. ....... H01J 37/32183 |
| | | 156/345.24 |
| 2014/0345802 A1 | 11/2014 | Umehara et al. |
| 2015/0262793 A1 | 9/2015 | Okunishi et al. |
| 2016/0027613 A1* | 1/2016 | Lane ................... H01J 37/3211 |
| | | 315/34 |
| 2016/0260584 A1* | 9/2016 | Marakhtanov .... H01J 37/32568 |
| 2018/0005802 A1 | 1/2018 | Chen et al. |

OTHER PUBLICATIONS

Title: Fundamental Frequency and Harmonics, Author: Tom Henderson p. 1-8 (Year: 2001).*
ISR PCT/US2019/0237220, dated Oct. 22, 2019, 4 pages.

* cited by examiner

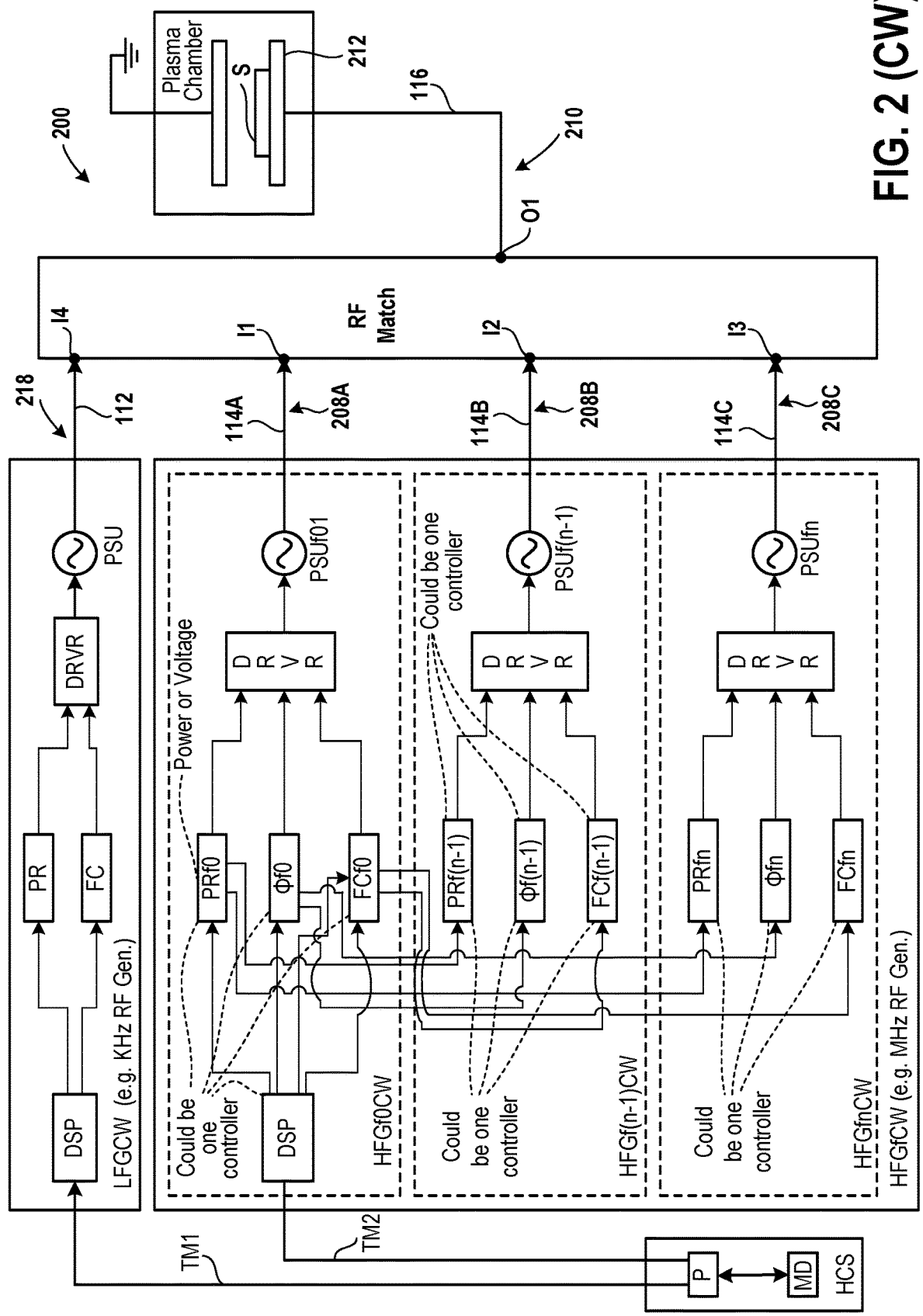
FIG. 2 (CW)

(Multi-state)

ACTIVE CONTROL OF RADIAL ETCH UNIFORMITY

FIELD

The present disclosure relates to systems and methods for active control of radial etch uniformity.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A plasma tool generally includes a radio frequency (RF) generator, and impedance matching circuit, and a plasma chamber. The RF generator generates a radio frequency signal that is supplied to the impedance matching circuit. The impedance matching circuit receives the radio frequency signal to output a radio frequency signal that is supplied to the plasma chamber. A wafer is processed within the plasma chamber by plasma generated when the radio frequency signal is supplied in conjunction with a process gas. For example, the wafer is etched within the plasma chamber pursuant to the radio frequency signal. When the wafer is etched, there are nonuniformities in etching the wafer.

It is in this context that embodiments described in the present disclosure arise.

SUMMARY

Embodiments of the disclosure provide systems, apparatus, methods and computer programs for active control of radial etch uniformity. It should be appreciated that the present embodiments can be implemented in numerous ways, e.g., a process, an apparatus, a system, a device, or a method on a computer readable medium. Several embodiments are described below.

Radial etch uniformity occurs in a plasma etcher, such as a parallel plate capacitively coupled plasma etcher. Localized center, mid-radius, edge, or extreme edge plasma nonuniformities create etch rate nonuniformities across a surface of a wafer. Examples of the etch rate nonuniformities include a center peak nonuniformity, a W-shape nonuniformity, and an M-shape nonuniformity. The etch rate nonuniformities are observed with various radio frequency (RF) drive frequencies, various process gaps, and various gas pressures. Due to its nature, plasma generated within the plasma etcher creates multiple harmonics of RF drive frequencies. Some of the harmonics that are of a high order create standing waves in the plasma that lead to the etch rate non-uniformities across the surface of the wafer. Due to the standing waves, it is difficult to increase radial etch uniformity by adjusting process parameters, such as a process gap between a chuck and an upper electrode of the plasma etcher, RF power ratios, gas center weight delivery, and pressure within the plasma etcher.

In some embodiments, the systems and methods described herein provide active control of radial plasma uniformity by controlling the harmonics. To provide the active control, additional RF power sources are provided within an RF generator in addition to a master high frequency RF source. The additional RF power sources provide high RF harmonic power signals that are phase adjustable or phase locked with respect to a fundamental frequency. Power magnitudes, frequencies, and phases of the high RF harmonic power signals are optimized to reduce standing wave effects in the plasma at the surface of the wafer to increase the radial etch uniformity.

In various embodiments, the master high frequency RF source supplies a fundamental driving frequency and phase associated with the fundamental driving frequency to the additional RF sources. The additional RF sources generate RF power at two times the fundamental driving frequency, three times the fundamental driving frequency, four times the fundamental driving frequency, and so on, with phases that are adjustable with respect to the phase associated with the fundamental driving frequency. By controlling the phases of the additional RF sources and controlling power levels of the additional RF sources, shapes of electromagnetic waves within the plasma, a radial shape of a plasma sheath of the plasma, and a radial plasma density at the surface of the wafer are controlled to adjust an etch rate uniformity across the surface of the wafer to increase the radial etch uniformity.

In several embodiments, a method for control of radial etch uniformity is described. The method includes generating a first RF signal having a fundamental frequency and a first phase. The method further includes generating a second RF signal having an (n−1)th harmonic frequency and a second phase based on the fundamental frequency and the first phase respectively. It should be noted that n is an integer greater than two. The method further includes generating a third RF signal having an nth harmonic frequency and a third phase based on the fundamental frequency and the first phase respectively. The method also includes receiving, by an RF match, the first, second, third RF signals. The method includes outputting, by the RF match, a modified RF signal to an electrode of a plasma chamber to control the radial etch uniformity across a surface of a substrate during an etch operation.

In some embodiments, a system for control of radial etch uniformity is described. The system includes a first RF generator configured to generate a first RF signal having a fundamental frequency and a first phase. The system further includes a second RF generator configured to generate a second RF signal having an (n−1)th harmonic frequency and a second phase based on the fundamental frequency and the first phase respectively. The system includes a third RF generator configured to generate a third RF signal having an nth harmonic frequency and a third phase based on the fundamental frequency and the first phase respectively. The system further includes an RF match coupled to the first, second, and third RF generators for receiving the first, second, third RF signals and outputting a modified RF signal. The modified RF signal is used to control the radial etch uniformity across a surface of a substrate during an etch operation in a plasma chamber.

In various embodiments, a system is described. The system includes a first controller configured to control a first RF power supply to generate a first RF signal having a fundamental frequency and a first phase. The system further includes a second controller configured to control a second RF power supply to generate a second RF signal having an (n−1)th harmonic frequency and a second phase based on the fundamental frequency and the first phase respectively. The system includes a third RF controller configured to control a third RF power supply to generate a third RF signal having an nth harmonic frequency and a third phase based on the fundamental frequency and the first phase respectively. The first, second, and third RF signals are configured to be supplied to an RF match and to be modified to generate a plurality of modified signals that are combined to generate a modified RF signal.

Some advantages of the herein described systems and methods include controlling radial etch uniformity across a surface of a substrate during an etch operation. The radial etch uniformity is controlled by controlling harmonics of plasma within a plasma chamber. The harmonics is adjusted by generating an RF signal having a harmonic frequency and adjusting the harmonic frequency, or a phase, or a parameter level, or a combination thereof, of the RF signal. By adjusting the harmonics, control of the radial etch uniformity is achieved.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2 is a diagram of an embodiment of a system to illustrate generation of multiple continuous wave RF signals.

DETAILED DESCRIPTION

The following embodiments describe systems and methods for active control of radial etch uniformity. It will be apparent that the present embodiments may be practiced without some or all of these specific details. In other instances, well known process operations have not been described in detail in order not to unnecessarily obscure the present embodiments.

Figure 1A:
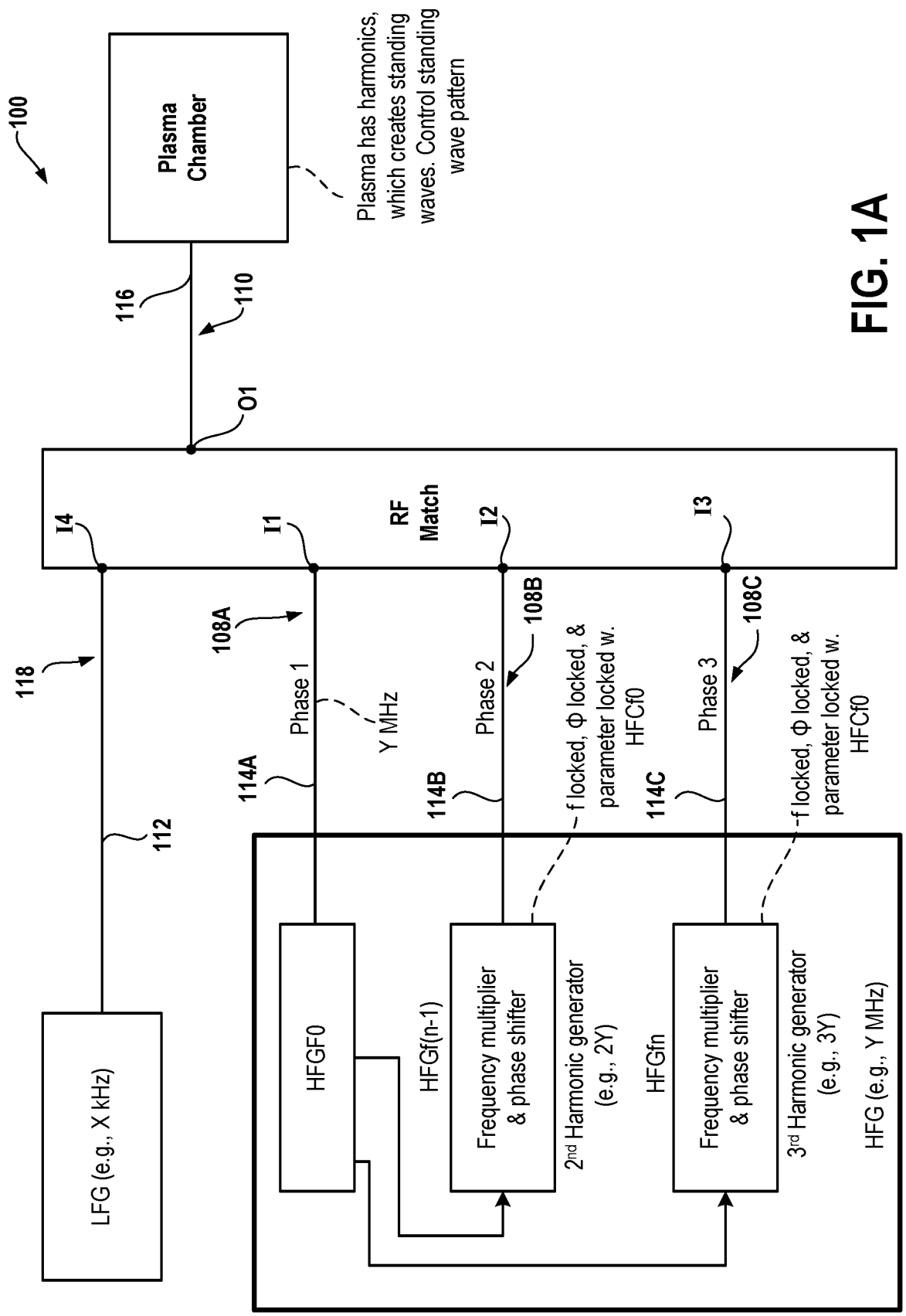
FIG. 1A is a diagram of an embodiment of a system to illustrate a control of uniformity in etching radially across a surface of a substrate.

FIG. 1A is a diagram of an embodiment of a system 100 to illustrate a control of uniformity in etching radially across a surface of a substrate. The system 100 includes a low frequency generator (LFG) and a high frequency generator (HFG). The low frequency generator LFG is a radiofrequency (RF) generator and the high frequency generator HFG is also an RF generator. The system 100 further includes an RF match and a plasma chamber. The low frequency generator LFG is coupled to an input I4 of the RF match via an RF cable 112.

The high frequency generator HFG includes a high frequency sub generator HFGf0 that operates at a fundamental frequency f0, another high frequency sub generator HFGf(n−1) that operates at an (n−1)th harmonic frequency f(n−1), and yet another high frequency sub generator HFGfn that operates at an nth harmonic frequency fn. A fundamental frequency, as used herein, is a first harmonic frequency. It should be noted that n, as used herein, is an integer greater than two. For example, the high frequency sub generator HFGf(n−1) operates at a second harmonic frequency and the high frequency sub generator HFGfn operates at a third harmonic frequency. As another example, n is 3.

The high frequency sub generator HFGf0 is coupled to an input I1 of the RF match via an RF cable 114A. Moreover, the high frequency sub generator HFGf(n−1) is coupled to an input I2 of the RF match via another RF cable 114B and the high frequency sub generator HFGfn is coupled to an input I3 of the RF match via yet another RF cable 114C. An output O1 of the RF match is coupled to the plasma chamber via an RF transmission line 116.

An example of the low frequency generator LFG includes an X kilohertz (kHz) RF generator, where X ranges from and including 50 kHz to 5 megahertz (MHz). To illustrate, the low frequency generator LFG is a 400 kHz RF generator. Another example of the low frequency generator LFG includes a 2 MHz RF generator. An example of the high frequency generator HFG includes a Y MHz RF generator, where Y ranges from and including 13 MHz to 100 MHz. For example, the Y MHz RF generator is a 60 MHz RF generator or a 40 MHz RF generator or a 27 MHz RF generator. As an example, the 60 MHz RF generator operates between 57 MHz and 63 MHz.

The RF match includes a plurality of variable components (VCs) (not shown), such as resistors, inductors, capacitors, or a combination thereof, which are coupled with each other in a series or parallel manner. The RF match matches an impedance of a load coupled to the output O1 of the RF match with that of a source coupled to the inputs I1, I2, and I3 of the RF match. An example of the load includes the RF transmission line 116 and the plasma chamber. An example of the source includes the RF cables 112 and 114A-114C and the RF generators LFG and HFG.

The low frequency generator LFG generates an RF signal 118 and supplies the RF signal 118 via the RF cable 112 to the input I4 of the RF match. The high frequency sub generator HFGf(n−1) obtains the fundamental frequency of an RF signal 108A that is generated by the high frequency sub generator HFGf0, a phase of the RF signal 108A at the fundamental frequency, and a parameter level of the RF signal 108A at the fundamental frequency. An example of the parameter level, as used herein, is a voltage or power level. The high frequency sub generator HFGf(n−1) multiplies the fundamental frequency with a multiplier (n−1) to generate the (n−1)th harmonic frequency f(n−1) and locks the harmonic frequency f(n−1) with the fundamental frequency. For example, if a difference between the (n−1)th harmonic frequency and the fundamental frequency is d1, when the fundamental frequency is tuned, e.g., slightly changed, the (n−1)th harmonic frequency is also tuned to maintain the difference to be d1. Similarly, the high frequency sub generator HFGf(n−1) modifies, such as shifts, the phase of the RF signal 108A having the fundamental frequency to generate a phase at the (n−1)th harmonic frequency and to lock the phase at the (n−1)th harmonic frequency with the phase at the fundamental frequency. To illustrate, if a difference between the phase at the (n−1)th harmonic frequency and the phase at the fundamental frequency is d2, when the phase at the fundamental frequency is tuned, e.g., slightly changed, the phase at the (n−1)th harmonic frequency is also tuned to maintain the difference to be d2.

Also, the high frequency sub generator HFG(n−1) changes, such as adds or subtracts, the parameter level at the fundamental frequency to generate a parameter level at the harmonic frequency f(n−1) and to lock the parameter level at the harmonic frequency f(n−1) with the parameter level at the fundamental frequency f0. For example, if a difference between the parameter level at the (n−1)th harmonic frequency and the parameter level at the fundamental frequency is d3, when the parameter level at the fundamental frequency is tuned, e.g., slightly changed, the parameter level at the (n−1)th harmonic frequency is also tuned to maintain the difference to be d3.

Similarly, the high frequency sub generator HFGfn multiplies the fundamental frequency with a multiplier n to generate the nth harmonic frequency fn and locks the harmonic frequency fn with the fundamental frequency. For example, if a difference between the nth harmonic frequency and the fundamental frequency is d4, when the fundamental frequency is tuned, e.g., slightly changed, the nth harmonic frequency is also tuned to maintain the difference to be d4. Similarly, the high frequency sub generator HFGfn modifies, such as shifts, the phase of the RF signal 108A having the fundamental frequency to generate a phase at the nth harmonic frequency and to lock the phase at the nth harmonic frequency with the phase at the fundamental frequency. To illustrate, if a difference between the phase at the nth harmonic frequency and the phase at the fundamental frequency is d5, when the phase at the fundamental frequency is tuned, e.g., slightly changed, the phase at the nth harmonic frequency is also tuned to maintain the difference to be d5.

Also, the high frequency sub generator HFGfn changes, such as adds or subtracts, the parameter level at the fundamental frequency to generate a parameter level at the harmonic frequency fn and to lock the parameter level at the harmonic frequency fn with the parameter level at the fundamental frequency f0. For example, if a difference between the parameter level at the nth harmonic frequency and the parameter level at the fundamental frequency is d6, when the parameter level at the fundamental frequency is tuned, e.g., slightly changed, the parameter level at the nth harmonic frequency is also tuned to maintain the difference to be d6.

The low frequency generator LFG generates the RF signal 118 that is sent via the RF cable 112 to the input I4. Moreover, the high frequency sub generator HFGf0 generates the RF signal 108A that has the fundamental frequency, the phase at the fundamental frequency, and the parameter level at the fundamental frequency and supplies the RF signal 108A via the RF cable 114A to the input I1 of the RF match. Similarly, the high frequency sub generator HFGf(n−1) generates an RF signal 108B that has the (n−1)th harmonic frequency f(n−1), the phase at the (n−1)th harmonic frequency, and the parameter level at the (n−1)th harmonic frequency, and supplies the RF signal 108B via the RF cable 114B to the input I2 of the RF match. Also, the high frequency sub generator HFGfn generates an RF signal 108C that has the nth harmonic frequency, the phase at the nth harmonic frequency, and the parameter level of the nth harmonic frequency, and supplies the RF signal 108C via the RF cable 114C to the input I3 of the RF match.

The RF match receives the RF signals 118 and 108A-108C and matches an impedance of the load with that of the source to generate a modified RF signal 110 from the RF signals 118 and 108A-108C and supplies the modified RF signal 110 via the RF transmission line 116 to the plasma chamber. When one or more process gases, such as fluorine containing gases, are supplied to the plasma chamber in addition to the modified RF signal 110, plasma is stricken or maintained within the plasma chamber to process the substrate. Examples of the fluorine containing gases include tetrafluoromethane ($CF_4$), sulfur hexafluoride ($SF_6$), and hexafluoroethane ($C_2F_6$), etc. Examples of processing the substrate include depositing materials on the substrate, etching the substrate, cleaning the substrate, and sputtering the substrate.

When the substrate is processed by applying the modified RF signal 110 that is generated based on the RF signals 108B through 108C, RF harmonics of a plasma sheath of the plasma within the plasma chamber is controlled to effect radial etch uniformity across a top surface of the substrate. Otherwise, when the RF harmonics of the plasma sheath is not controlled, standing waves may be created within the plasma which, in turn, would result in radial etch nonuniformity across a top surface of the substrate.

Figure 1B:
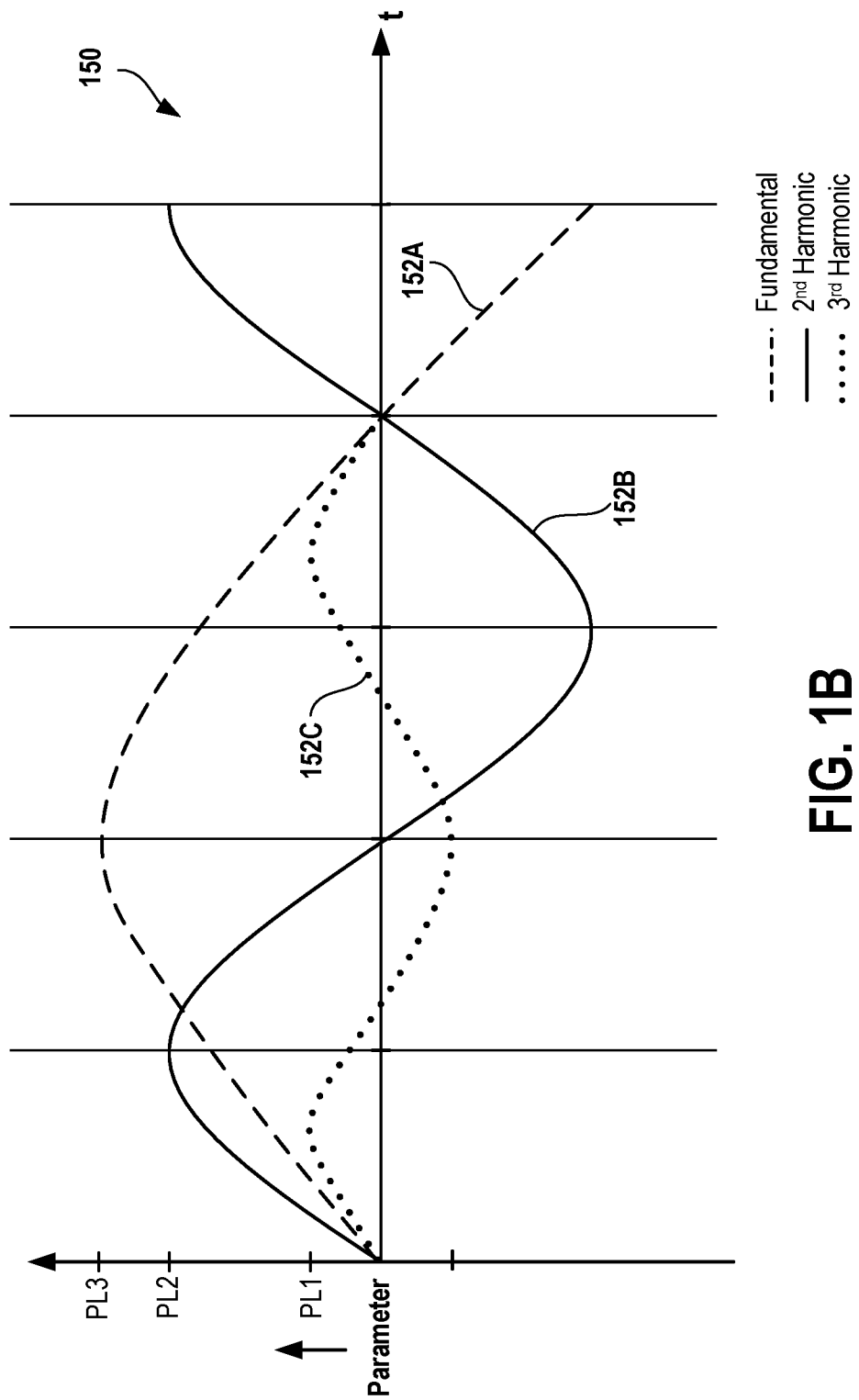
FIG. 1B is an embodiment of a graph to illustrate a fundamental frequency of a radio frequency (RF) signal of FIG. 1A, a second harmonic frequency of another RF signal of FIG. 1A, and a third harmonic frequency of yet another RF signal of FIG. 1A.

FIG. 1B is an embodiment of a graph 150 to illustrate the fundamental frequency of the RF signal 108A of FIG. 1A, the second harmonic frequency of the RF signal 108B of FIG. 1A, and the third harmonic frequency of the RF signal 108C of FIG. 1A. The graph 150 plots a parameter level PL3 at the fundamental frequency of an RF signal 152A, a parameter level PL2 at the second harmonic frequency of an RF signal 152B, and a parameter level PL1 at the third harmonic frequency of an RF signal 152C versus time t. The RF signal 152A is an example of the RF signal 108A, the RF signal 152B is an example of the RF signal 108B, and the RF signal 152C is an example of the RF signal 108C. Examples of a parameter level of an RF signal include an envelope of the RF signal, a peak-to-peak magnitude of the RF signal, or a zero-to-peak magnitude of the RF signal. The RF signals 152A through 152C are continuous wave (CW) signals that do not transition between multiple states and have one state. The parameter level PL3 is greater than the parameter level PL2. The parameter level PL2, in turn, is greater than the parameter level PL1.

As used herein, a continuous wave signal does not transition between multiple states, such as a high state and the low state. For example, all parameter values of a parameter level of the continuous wave signal are located within a pre-set range, such as a variance or a standard deviation of one of the parameter values. As another example, a difference between a lowest one of all parameter values of a parameter level of the continuous wave signal and the highest one of the parameter values is less than a preset threshold. To illustrate, the highest one of the parameter values is not greater than 20% from the lowest one of the parameter values. As yet another example, the continuous wave signal has a high state, such as a state S1, or has a low state, such as a state S0, but not both states S1 and S0. The states S1 and S0 are further explained below.

In some embodiments, a parameter level of the RF signal 152B is greater than the parameter level of the RF signal 152A. Moreover, in various embodiments, a parameter level of the RF signal 152C is greater than a parameter level of the RF signal 152A and is greater than a parameter level of the RF signal 152B. In several embodiments, a parameter level of the RF signal 152C is less than a parameter level of the RF signal 152A and is greater than a parameter level of the RF signal 152B. In some embodiments, a parameter level of the RF signal 152C is greater than a parameter level of the RF signal 152A and is less than a parameter level of the RF signal 152B.

FIG. 2 is a diagram of an embodiment of a system 200 to illustrate generation of multiple RF signals 208A, 208B, and 208C, which are continuous wave (CW) signals. The RF signal 208A is an example of the RF signal 108A of FIG. 1A, the RF signal 208B is an example of the RF signal 108B of FIG. 1A, and the RF signal 208C is an example of the RF signal 108C of FIG. 1A.

The system 200 includes a low frequency RF generator LFGCW and a high frequency RF generator HFGCW. The low frequency RF generator LFGCW is an example of the low frequency generator LFG of FIG. 1A and the high frequency RF generator HFGCW is an example of the high frequency generator HFG of FIG. 1A.

The low frequency generator LFGCW includes a digital signal processor DSP, a parameter controller PR, a frequency controller FC, a driver system DRVR, and a power supply PSU. The digital signal processor DSP is coupled to the parameter controller PR and to the frequency controller FC. The parameter controller PR and the frequency controller FC are coupled to the driver system DRVR, which is coupled to the power supply PSU. The power supply PSU is coupled via the RF cable 112 to the input I4 of the RF match.

As used herein, a processor is an application specific integrated circuit (ASIC), or a programmable logic device (PLD), or a central processing unit (CPU), or a microprocessor, or a microcontroller. As used herein, a controller includes an ASIC, or a PLD, or a CPU, or a microprocessor, or a microcontroller, or a processor, and further includes a memory device. Examples of a memory device, as used herein, include a random access memory (RAM) and a read-only memory (ROM). To illustrate, a memory device is a flash memory, a hard disk, or a storage device, etc. A memory device is an example of a computer-readable medium.

An example of a driver system, as used herein, includes one or more transistors that are coupled to each other to generate a current signal. An example of a power supply, as used herein, includes a radiofrequency oscillator that oscillates to generate a radio frequency signal.

The high frequency RF generator HFGCW includes a sub generator HFGf0CW that operates at the fundamental frequency, another sub generator HFGf(n−1)CW that operates at the (n−1)th harmonic frequency, and yet another sub generator HFGfnCW that operates at the nth harmonic frequency. The sub generator HFGf0CW includes a digital signal processor DSP, a parameter controller PRf0, a phase controller $\phi$f0, a frequency controller FCf0, a driver system DRVR, and a power supply PSUf0. The digital signal processor of the sub generator HFGf0CW is coupled to the parameter controller PRf0 of the sub generator HFGf0CW, to the phase controller $\phi$0 of the sub generator HFGf0CW, and to the frequency controller FCf0 of the sub generator HFGf0CW. The parameter controller PRf0 of the sub generator HFGf0CW, the phase controller $\phi$f0 of the sub generator HFGf0CW, and the frequency controller FCf0 of the sub generator HFGf0CW are coupled to the driver system DRVR of the sub generator HFGf0CW, and the driver system DRVR is coupled to the power supply PSUf0 of the sub generator HFGf0CW. The power supply PSUf0 of the sub generator HFGf0CW is coupled to the RF cable 114A.

Similarly, the sub generator HFGf(n−1)CW includes a parameter controller PRf(n−1), a phase controller $\phi$f(n−1), a frequency controller FCf(n−1), a driver system DRVR, and a power supply PSUf(n−1). The parameter controller PRf(n−1) of the sub generator HFGf(n−1)CW, the phase controller $\phi$f(n−1) of the sub generator HFGf(n−1)CW, and the frequency controller FCf(n−1) of the sub generator HFGf(n−1)CW are coupled to the driver system DRVR of the sub generator HFGf(n−1)CW, and the driver system DRVR of the sub generator HFGf(n−1)CW is coupled to the power supply PSUf(n−1) of the sub generator HFGf(n−1)CW. The power supply PSUf(n−1) of the sub generator HFGf(n−1)CW is coupled to the RF cable 114B.

Also, the sub generator HFGfnCW includes a parameter controller PRfn, a phase controller $\phi$fn, a frequency controller FCfn, a driver system DRVR, and a power supply PSUfn. The parameter controller PRfn of the sub generator HFGfnCW, the phase controller $\phi$fn of the sub generator HFGfnCW, and the frequency controller FCfn of the sub generator HFGfnCW are coupled to the driver system DRVR of the sub generator HFGfnCW, and the driver system DRVR of the sub generator HFGfnCW is coupled to the power supply PSUfn of the sub generator HFGfnCW. The power supply PSUfn of the sub generator HFGfnCW is coupled to the RF cable 114C.

Moreover, the parameter controller PRf(n−1) of the sub generator HFGf(n−1)CW is coupled to the parameter controller PRf0 of the sub generator HFGf0CW and the parameter controller PRfn of the sub generator HFGfnCW is coupled to the parameter controller PRf0 of the sub generator HFGf0CW. Furthermore, the phase controller $\phi$f(n−1) of the sub generator HFGf(n−1)CW is coupled to the phase controller $\phi$f0 of the sub generator HFGf0CW and the phase controller $\phi$fn of the sub generator HFGfnCW is coupled to the phase controller $\phi$f0 of the sub generator HFGf0CW. Also, the frequency controller FCf(n−1) of the sub generator HFGf(n−1)CW is coupled to the frequency controller FCf0 of the sub generator HFGf0CW and the frequency controller FCfn of the sub generator HFGfnCW is coupled to the frequency controller FCf0 of the sub generator HFGf0CW.

The system 200 includes a host computer system (HCS), which includes a processor (P) and a memory device (MD). The processor of the host computer system is coupled to the memory device of the host computer system.

The processor of the host computer system is coupled to the digital signal processor of the low frequency RF generator LFGCW via a transfer medium TM1 and to the digital signal processor of the high frequency RF generator HFGCW via another transfer medium TM2. As used herein, examples of a transfer medium include a parallel transfer cable, or a serial transfer cable, or a universal serial bus (USB) transfer cable.

The output O1 of the RF match is coupled via the transmission line 116 to a chuck 212, such as an electrostatic chuck, of the plasma chamber. The plasma chamber includes an upper electrode that faces the chuck 212. A substrate S is placed on a top surface of the chuck 212 for processing by the plasma that is generated within the plasma chamber. The chuck 212 includes a lower electrode that is made from metal, such as aluminum or an alloy of aluminum. Similarly, the upper electrode is fabricated from the metal. The upper electrode is coupled to a ground potential and the chuck 212 is coupled to the RF transmission line 116. A gap is formed between the upper electrode and the chuck 212 for generation of the plasma within the gap to process the substrate S.

The processor of the host computer system sends a data signal via the transfer medium TM1 to the digital signal processor of the low frequency RF generator LFGCW and the data signal includes a parameter level of an RF signal 218 to be generated by the low frequency RF generator LFGCW and a frequency of the RF signal 218. It should be noted that the RF signal 218 is an example of the RF signal 118 of FIG. 1A and is a continuous wave signal.

The digital signal processor of the low frequency RF generator LFGCW receives the parameter level and the frequency of the RF signal 218 and provides the parameter level to the parameter controller of the low frequency RF generator LFGCW and provides the frequency to the frequency controller of the low frequency RF generator LFGCW. Upon receiving the parameter level, the parameter controller of the low frequency RF generator LFGCW provides the parameter level to the driver system of the low frequency RF generator LFGCW. In addition, upon receiving the frequency, the frequency controller of the low frequency RF generator LFGCW provides the frequency to the driver system of the low frequency RF generator LFGCW. The driver system of the low frequency RF generator LFGCW generates a current signal based on the parameter level received from the parameter controller and the frequency received from the frequency controller, and provides the current signal to the power supply of the low frequency RF generator LFGCW. Upon receiving the current signal, the power supply of the low frequency RF generator LFGCW generates the RF signal 218 having the parameter level and the frequency that are received from the processor of the host computer system by the digital signal processor of the low frequency RF generator LFGCW. The RF signal 218 is supplied through the RF cable 112 to the input I4 of the RF match.

Similarly, the processor of the host computer system sends a data signal via the transfer medium TM2 to the digital signal processor of the sub generator HFGf0CW and the data signal includes a parameter level at a fundamental frequency, such as the frequency f0, of the RF signal 208A to be generated by the sub generator HFGf0CW, the fundamental frequency of the RF signal 208A, and a phase at the fundamental frequency of the RF signal 208A. The digital signal processor of the sub generator HFGf0CW receives the parameter level, the fundamental frequency and the phase of the RF signal 208A and provides the parameter level to the parameter controller of the sub generator HFGf0CW, provides the phase to the phase controller of the sub generator HFGf0CW, and provides the fundamental frequency to the frequency controller of the sub generator HFGf0CW. Upon receiving the parameter level, the parameter controller of the sub generator HFGf0CW provides the parameter level to the driver system of the sub generator HFGf0CW. Also, upon receiving the phase, the phase controller of the sub generator HFGf0CW provides the phase to the driver system of the sub generator HFGf0CW. In addition, upon receiving the fundamental frequency, the frequency controller of the sub generator HFGf0CW provides the fundamental frequency to the driver system of the sub generator HFGf0CW. The driver system of the sub generator HFGf0CW generates a current signal based on the parameter level received from the parameter controller of the sub generator HFGf0CW, the phase received from the phase controller of the sub generator HFGf0CW, and the fundamental frequency received from the frequency controller of the sub generator HFGf0CW, and provides the current signal to the power supply of the sub generator HFGf0CW. Upon receiving the current signal, the power supply of the sub generator HFGf0CW generates the RF signal 208A having the parameter level, the phase, and the fundamental frequency that are received from the processor of the host computer system by the digital signal processor of the sub generator HFGf0CW. The RF signal 208A is supplied through the RF cable 114A to the input I1 of the RF match.

The frequency controller of the sub generator HFGf(n−1)CW obtains the fundamental frequency of the RF signal 208A from the frequency controller of the sub generator HFGf0CW to generate an (n−1)th harmonic frequency of the RF signal 208B to be generated by the sub generator HFGf(n−1)CW. For example, the frequency controller of the sub generator HFGf(n−1)CW obtains the fundamental frequency of the RF signal 208A and multiplies the fundamental frequency by a multiplier, such as (n−1), to generate the (n−1)th harmonic frequency of the RF signal 208B. The frequency controller of the sub generator HFGf(n−1)CW generates the (n−1)th harmonic frequency of the RF signal 208B to achieve a pre-determined frequency difference between the (n−1)th harmonic frequency of the RF signal 208B and the fundamental frequency of the RF signal 208A to lock the (n−1)th harmonic frequency with the fundamental frequency. The frequency controller of the sub generator HFGf(n−1)CW provides the (n−1)th harmonic frequency of the RF signal 208B to the driver system of the sub generator HFGf(n−1)CW.

It should be noted that the pre-determined frequency difference corresponds to a pre-determined uniformity in an etch rate of etching the substrate S. For example, the frequency controller of the sub generator HFGf(n−1)CW stores within a memory device of the frequency controller a relationship, such as a one-to-one correspondence or a link, between the pre-determined frequency difference and the pre-determined uniformity in the etch rate. The frequency controller of the sub generator HFGf(n−1)CW accesses the pre-determined frequency difference from the memory device of the sub generator HFGf(n−1)CW to achieve the pre-determined uniformity in the etch rate.

Moreover, the parameter controller of the sub generator HFGf(n−1)CW obtains the parameter level at the fundamental frequency of the RF signal 208A from the parameter controller of the sub generator HFGf0CW to generate a parameter level at the (n−1)th harmonic frequency of the RF signal 208B to be generated by the sub generator HFGf(n−1)CW. For example, the parameter controller of the sub generator HFGf(n−1)CW obtains the parameter level of the RF signal 208A and adds to or subtracts from the parameter level to generate the parameter level at the (n−1)th harmonic frequency of the RF signal 208B. The parameter controller of the sub generator HFGf(n−1)CW generates the parameter level at the (n−1)th harmonic frequency of the RF signal 208B to achieve a pre-determined parameter level difference between the parameter level at the (n−1)th harmonic frequency of the RF signal 208B and the parameter level at the fundamental frequency of the RF signal 208A to lock the parameter level at the (n−1)th harmonic frequency with the parameter level at the fundamental frequency. The parameter controller of the sub generator HFGf(n−1)CW provides the parameter level at the (n−1)th harmonic frequency of the RF signal 208B to the driver system of the sub generator HFGf(n−1)CW.

It should be noted that the pre-determined parameter level difference corresponds to the pre-determined uniformity in the etch rate of etching the substrate S. For example, the parameter controller of the sub generator HFGf(n−1)CW stores within a memory device of the parameter controller a relationship, such as a one-to-one correspondence or a link, between the pre-determined parameter level difference and the pre-determined uniformity in the etch rate. The parameter controller of the sub generator HFGf(n−1)CW accesses the pre-determined parameter level difference from the memory device of the sub generator HFGf(n−1)CW to achieve the pre-determined uniformity in the etch rate.

Also, the phase controller of the sub generator HFGf(n−1)CW obtains the phase at the fundamental frequency of the RF signal 208A from the phase controller of the sub generator HFGf0CW to generate a phase at the (n−1)th harmonic frequency of the RF signal 208B to be generated by the sub generator HFGf(n−1)CW. For example, the phase controller of the sub generator HFGf(n−1)CW obtains the phase of the RF signal 208A and shifts along the time t the phase to generate the phase at the (n−1)th harmonic frequency of the RF signal 208B. The phase controller of the sub generator HFGf(n−1)CW generates the phase at the (n−1)th harmonic frequency of the RF signal 208B to achieve a pre-determined phase difference between the phase at the (n−1)th harmonic frequency of the RF signal 208B and the phase at the fundamental frequency of the RF signal 208A to lock the phase at the (n−1)th harmonic frequency with the phase at the fundamental frequency. The phase controller of the sub generator HFGf(n−1)CW provides the phase at the (n−1)th harmonic frequency of the RF signal 208B to the driver system of the sub generator HFGf(n−1)CW.

It should be noted that the pre-determined phase difference corresponds to the pre-determined uniformity in the etch rate of etching the substrate S. For example, the phase controller of the sub generator HFGf(n−1)CW stores within a memory device of the phase controller a relationship, such as a one-to-one correspondence or a link, between the pre-determined phase difference and the pre-determined uniformity in the etch rate. The phase controller of the sub generator HFGf(n−1)CW accesses the pre-determined phase difference from the memory device of the sub generator HFGf(n−1)CW to achieve the pre-determined uniformity in the etch rate. It should further be noted that the pre-determined uniformity in the etch rate is uniformity in etching radially across a top surface of the substrate S.

Upon receiving the frequency at the (n−1)th harmonic frequency, the phase at the (n−1)th harmonic frequency, and the parameter at the (n−1)th harmonic frequency, the driver system of the sub generator HFGf(n−1)CW generates a current signal from the frequency, the phase, and the parameter. Upon receiving the current signal from the driver system of the sub generator HFGf(n−1)CW, the power supply of the sub generator HFGf(n−1)CW generates the RF signal 208B having the frequency at the (n−1)th harmonic frequency, the phase at the (n−1)th harmonic frequency, and the parameter level at the (n−1)th harmonic frequency, and supplies the RF signal 208B via the RF cable 114B to the input I2 of the RF match.

Furthermore, in a similar manner, the frequency controller of the sub generator HFGfnCW obtains the fundamental frequency of the RF signal 208A from the frequency controller of the sub generator HFGf0CW to generate an nth harmonic frequency of the RF signal 208C to be generated by the sub generator HFGfnCW. For example, the frequency controller of the sub generator HFGfnCW obtains the fundamental frequency of the RF signal 208C and multiplies the fundamental frequency by a multiplier, such as n, to generate the nth harmonic frequency of the RF signal 208C. The frequency controller of the sub generator HFGfnCW generates the nth harmonic frequency of the RF signal 208C to achieve a pre-determined frequency difference between the nth harmonic frequency of the RF signal 208c and the fundamental frequency of the RF signal 208A to lock the nth harmonic frequency with the fundamental frequency. The frequency controller of the sub generator HFGfnCW provides the nth harmonic frequency of the RF signal 208C to the driver system of the sub generator HFGfnCW.

It should be noted that the pre-determined frequency difference corresponds to the pre-determined uniformity in the etch rate of etching the substrate S. For example, the frequency controller of the sub generator HFGfnCW stores within a memory device of the frequency controller a relationship, such as a one-to-one correspondence or a link, between the pre-determined frequency difference and the pre-determined uniformity in the etch rate. The frequency controller of the sub generator HFGfnCW accesses the pre-determined frequency difference from the memory device of the sub generator HFGfnCW to achieve the pre-determined uniformity in the etch rate.

Moreover, the parameter controller of the sub generator HFGfnCW obtains the parameter level at the fundamental frequency of the RF signal 208C from the parameter controller of the sub generator HFGf0CW to generate a parameter level at the nth harmonic frequency of the RF signal 208C to be generated by the sub generator HFGfnCW. For example, the parameter controller of the sub generator HFGfnCW obtains the parameter level of the RF signal 208C and adds to or subtracts from the parameter level to generate the parameter level at the nth harmonic frequency of the RF signal 208C. The parameter controller of the sub generator HFGfnCW generates the parameter level at the nth harmonic frequency of the RF signal 208C to achieve a pre-determined parameter level difference between the parameter level at the nth harmonic frequency of the RF signal 208C and the parameter level at the fundamental frequency of the RF signal 208A to lock the parameter level at the nth harmonic frequency with the parameter level at the fundamental frequency. The parameter controller of the sub generator HFGfnCW provides the parameter level at the nth harmonic frequency of the RF signal 208C to the driver system of the sub generator HFGfnCW.

It should be noted that the pre-determined parameter level difference corresponds to the pre-determined uniformity in the etch rate of etching the substrate S. For example, the parameter controller of the sub generator HFGfnCW stores within a memory device of the parameter controller a relationship, such as a one-to-one correspondence or a link, between the pre-determined parameter level difference and the pre-determined uniformity in the etch rate. The parameter controller of the sub generator HFGfnCW accesses the pre-determined parameter level difference from the memory device of the sub generator HFGfnCW to achieve the pre-determined uniformity in the etch rate.

Also, the phase controller of the sub generator HFGfnCW obtains the phase at the fundamental frequency of the RF signal 208A from the phase controller of the sub generator HFGf0CW to generate a phase at the nth harmonic frequency of the RF signal 208C to be generated by the sub generator HFGfnCW. For example, the phase controller of the sub generator HFGfnCW obtains the phase of the RF signal 208A and shifts along the time t the phase to generate the phase at the nth harmonic frequency of the RF signal 208C. The phase controller of the sub generator HFGfnCW generates the phase at the nth harmonic frequency of the RF signal 208c to achieve a pre-determined phase difference between the phase at the nth harmonic frequency of the RF signal 208C and the phase at the fundamental frequency of the RF signal 208A to lock the phase at the nth harmonic frequency with the phase at the fundamental frequency. The phase controller of the sub generator HFGfnCW provides the phase at the nth harmonic frequency of the RF signal 208C to the driver system of the sub generator HFGfnCW.

It should be noted that the pre-determined phase difference corresponds to the pre-determined uniformity in the etch rate of etching the substrate S. For example, the phase controller of the sub generator HFGfnCW stores within a memory device of the phase controller a relationship, such as a one-to-one correspondence or a link, between the pre-determined phase difference and the pre-determined uniformity in the etch rate. The phase controller of the sub generator HFGfnCW accesses the pre-determined phase difference from the memory device of the sub generator HFGfnCW to achieve the pre-determined uniformity in the etch rate.

Upon receiving the frequency at the nth harmonic frequency, the phase at the nth harmonic frequency, and the parameter level at the nth harmonic frequency, the driver system of the sub generator HFGfnCW generates a current signal from the frequency, the phase, and the parameter level. Upon receiving the current signal from the driver system of the sub generator HFGfnCW, the power supply of the sub generator HFGfnCW generates the RF signal 208C having the frequency at the nth harmonic frequency, the phase at the nth harmonic frequency, and the parameter level at the nth harmonic frequency, and supplies the RF signal 208C via the RF cable 114C to the input I3 of the RF match.

Upon receiving the RF signals 218, 208A, 208B, and 208C, the RF match matches an impedance of a load coupled to the output O1 with that of a source coupled to the inputs I1 through I4 to generate modified RF signals and combines, such as sums, the modified RF signals to generate a modified RF signal 210 at the output O1. An example of the source coupled to the inputs I1 through I4 includes the RF generator LGFCW and the RF generator HFGCW, and the RF cables 112 and 114A through 114C. The modified RF signal 210 is supplied via the RF transmission line 116 to the chuck 212 of the plasma chamber. When the one or more process gases and the modified RF signal 210 are supplied to the plasma chamber, the plasma is stricken or generated within the plasma chamber for processing the substrate S. By controlling the parameter level, the phase, and the frequency of the RF signal 208A, the parameter level, the phase, and the frequency of the RF signal 208B, and the parameter level, the phase, and the frequency of the RF signal 208C, a relationship between RF harmonics of a plasma sheath of the plasma within the plasma chamber and a fundamental frequency, such as f0, of the plasma sheath within the plasma chamber is controlled to achieve radial etch uniformity across the top surface of the substrate S.

In some embodiments, the digital signal processor DSP, the parameter controller PR, and the frequency controller FC of the low frequency RF generator LFGCW are replaced by a controller. For example, functions described herein as performed by the digital signal processor DSP, the parameter controller PR, and the frequency controller FC of the low frequency RF generator LFGCW are instead performed by the controller.

In various embodiments, the digital signal processor of the sub generator HFGf0CW, the parameter controller of the sub generator HFGf0CW, the phase controller of the sub generator HFGf0CW and the frequency controller of the sub generator HFGf0CW are replaced by a controller of the sub generator HFGf0CW. For example, functions described herein as performed by the digital signal processor of the sub generator HFGf0CW, the parameter controller of the sub generator HFGf0CW, the phase controller of the sub generator HFGf0CW and the frequency controller of the sub generator HFGf0CW are instead performed by the controller of the sub generator HFGf0CW. Also, in some embodiments, the parameter controller of the sub generator HFGf(n−1)CW, the phase controller of the sub generator HFGf(n−1)CW and the frequency controller of the sub generator HFGf(n−1)CW are replaced by a controller of the sub generator HFGf(n−1)CW, and the parameter controller of the sub generator HFGfnCW, the phase controller of the sub generator HFGfnCW and the frequency controller of the sub generator HFGfnCW are replaced by a controller of the sub generator HFGfnCW. For example, functions described herein as performed by the parameter controller of the sub generator HFGf(n−1)CW, the phase controller of the sub generator HFGf(n−1)CW and the frequency controller of the sub generator HFGf(n−1)CW are instead performed by the controller of the sub generator HFGf(n−1)CW and functions described herein as performed by the parameter controller of the sub generator HFGfnCW, the phase controller of the sub generator HFGfnCW and the frequency controller of the sub generator HFGfnCW are instead performed by the controller of the sub generator HFGfnCW.

In some embodiments, the high frequency RF generator HFGCW includes any number of sub generators. For example, the high frequency RF generator HFGCW excludes the sub generator HFGf(n−1)CW or HFGfnCW. As another example, the high frequency RF generator HFGCW includes one or more additional sub generators than that illustrated in FIG. 2, such as, a sub generator HFGf(n+1)CW and a sub generator HFGf(n+2)CW.

In various embodiments, the chuck 212 is coupled to the ground potential and the upper electrode is coupled to the RF transmission line 116 for receiving the modified RF signal 210.

In some embodiments, the controllers PRf0, φf0, FCf0, PRf(n−1), φf(n−1), FCf(n−1), PRfn, φfn, and FCfn, and the digital signal processor DSP of the sub generator HFGf0CW are integrated into a single controller. For example, functions described herein as being performed by the controllers PRf0, φf0, FCf0, PRf(n−1), φf(n−1), FCf(n−1), PRFn, φfn, and FCfn, and the digital signal processor DSP of the sub generator HFGf0CW are instead performed by a processor of the single controller. The single controller is coupled to the driver system of the sub generator HFGf0CW, the driver system of the sub generator HFGf(n−1)CW, and the driver system of the sub generator HFGfnCW. The single controller includes the processor and a memory device, and the processor is coupled to the memory device. The functions described herein as being performed by the controllers PRf0, φf0, FCf0, PRf(n−1), φf(n−1), FCf(n−1), PRfn, φfn, and FCfn, and the digital signal processor DSP of the sub generator HFGf0CW are computer modules or computer programs that are executed by the processor of the single controller.

In various embodiments, the single controller, which performs the functions described herein as being performed by the controllers PRf0, φf0, FCf0, PRf(n−1), φf(n−1), FCf(n−1), PRfn, φfn, and FCfn, and the digital signal processor DSP of the sub generator HFGf0CW, is a part of the host computer. For example, the processor of the single controller is the same as the processor of the host computer system and the memory device of the single controller is the same as the memory device of the host computer. In some embodiments, the single controller, which performs the functions described herein as being performed by the controllers PRf0, φf0, FCf0, PRf(n−1), φf(n−1), FCf(n−1), PRfn, φfn, and FCfn, and the digital signal processor DSP of the sub generator HFGf0CW, is located within the RF generator HFGCW and is coupled to the processor of the host computer.

In some embodiments, the functions described herein as being performed by the parameter controller PR and the frequency controller FC of the low frequency RF generator LFGCW are performed by the digital signal processor DSP of the low frequency RF generator LFGCW. In these embodiments, the digital signal processor of the low frequency RF generator LFGCW is coupled to the driver system of the low frequency RF generator LFGCW.

Moreover, in various embodiments, the functions described herein as being performed by the controllers PR and FC of the low frequency RF generator LFGCW and the digital signal processor DSP of the low frequency RF generator LFGCW are performed by the processor of the host computer system. In these embodiments, the processor of the host computer system is coupled to the driver system of the low frequency RF generator LFGCW.

Figure 3A:
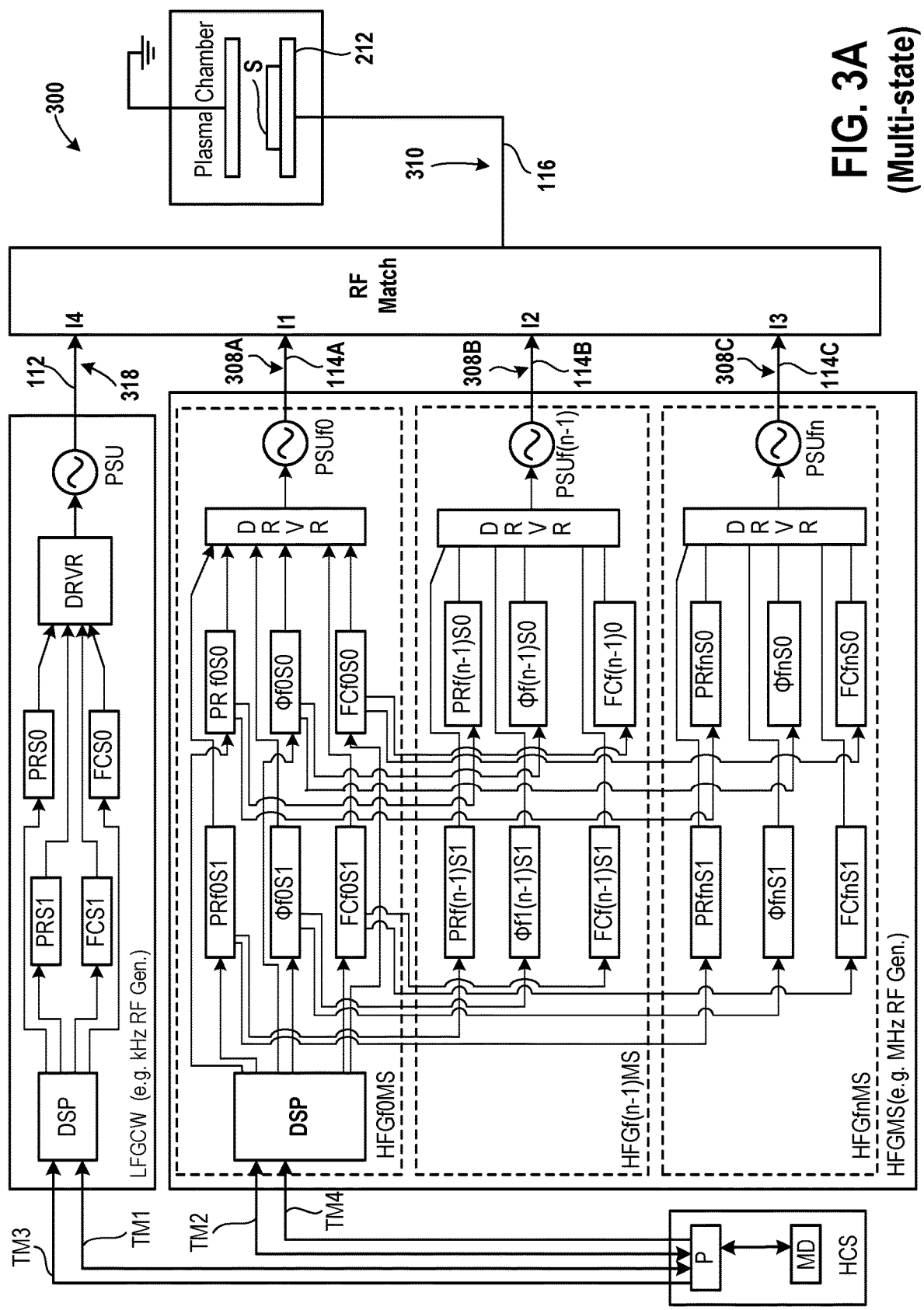
FIG. 3A is a diagram of an embodiment of a system to illustrate multi-state control of harmonics of plasma within a plasma chamber.

FIG. 3A is a diagram of an embodiment of a system 300 to illustrate multi-state control of harmonics of the plasma within the plasma chamber. The system 300 includes a low frequency RF generator LFGMS which is an example of the low frequency RF generator LFG of FIG. 1A. The system 300 further includes a high frequency RF generator HFGMS, which is an example of the high frequency RF generator HFG of FIG. 1A. The system 300 further includes the RF match and the plasma chamber.

The low frequency RF generator LFGMS includes a digital signal processor DSP, a parameter controller PRS1 for the state S1, a frequency controller FCS1 for the state S1, another parameter controller PRS0 for the state S0, a frequency controller FCS0 for the state S0, a driver system DRVR, and a power supply unit PSU. The digital signal processor of the low frequency RF generator LFGMS is coupled to the parameter controller for the state S1, the parameter controller for the state S0, the frequency controller for the state S1, and the frequency controller for the state S0. The controllers PRS1, PRS0, FCS0, and FCS1 are coupled to the driver system DRVR of the low frequency RF generator LFGMS, and the driver system DRVR is coupled to the power supply unit PSU of the low frequency RF generator LFGMS. The power supply unit of the low frequency RF generator LFGMS is coupled via the RF cable 112 to the input I4 for of the RF match.

The high frequency RF generator HFGMS includes a sub generator HFGf0MS, another sub generator HFGf(n−1)MS, and yet another sub generator HFGfnMS. The sub generator HFGf0MS operates at the fundamental frequency, such as the frequency f0, the sub generator HFGf(n−1)MS operates at the (n−1)th harmonic frequency, and the sub generator HFGfnMS operates at the nth harmonic frequency.

The sub generator HFGf0MS includes a digital signal processor DSP, a parameter controller PRf0S1 for the state S1, another parameter controller PRf0S0 for the state S0, a phase controller φf0S1 for the state S1, another phase controller φf0S0 for the state S0, a frequency controller FCf0S1 for the state S1, and another frequency controller FCf0S0 for the state S0. The sub generator HFGf0MS further includes a driver system DRVR and a power supply PSUf0.

The digital signal processor of the sub generator HFGf0MS is coupled to the parameter controllers PRf0S1 and PRf0S0, the frequency controllers FCf0S1 and FCf0S0, and the phase controllers φf0S1 and φf0S0. The parameter controllers PRf0S1 and PRf0S0, the frequency controllers FCf0S1 and FCf0S0, and the phase controllers φf0S1 and φf0S0 are coupled to the driver system of the sub generator HFGf0MS, and the driver system is coupled to the power supply PSUf0. The power supply PSUf0 is coupled to the RF cable 114A.

Similarly, the sub generator HFGf(n−1)MS includes a parameter controller PRf(n−1)S1 for the state S1, another parameter controller PRf(n−1)S0 for the state S0, a phase controller φf(n−1)S1 for the state S1, another phase controller φf(n−1)S0 for the state S0, a frequency controller FCf(n−1)S1 for the state S1, and another frequency controller FCf(n−1)S0 for the state S0. The sub generator HFGf(n−1)MS further includes a driver system DRVR and a power supply PSUf(n−1).

The digital signal processor of the sub generator HFGf(n−1)MS is coupled to the parameter controllers PRf(n−1)S1 and PRf(n−1)S0, the frequency controllers FCf(n−1)S1 and FCf(n−1)S0, and the phase controllers φf(n−1)S1 and φf(n−1)S0. The parameter controllers PRf(n−1)S1 and PRf(n−1)S0, the frequency controllers FCf(n−1)S1 and FCf(n−1)S0, and the phase controllers φf(n−1)S1 and φf(n−1)S0 are coupled to the driver system of the sub generator HFGf(n−1)MS, and the driver system is coupled to the power supply PSUf(n−1). The power supply PSUf(n−1) is coupled to the RF cable 114B.

Also, the sub generator HFGfnMS includes a digital signal processor DSP, a parameter controller PRfnS1 for the state S1, another parameter controller PRfnS0 for the state S0, a phase controller φfnS1 for the state S1, another phase controller φfnS0 for the state S0, a frequency controller FCfnS1 for the state S1, and another frequency controller FCfnS0 for the state S0. The sub generator HFGfnMS further includes a driver system DRVR and a power supply PSUf0.

The digital signal processor of the sub generator HFGfnMS is coupled to the parameter controllers PRfnS1 and PRfnS0, the frequency controllers FCfnS1 and FCfnS0, and the phase controllers φfnS1 and φfnS0. The parameter controllers PRfnS1 and PRfnS0, the frequency controllers FCfnS1 and FCfnS0, and the phase controllers φfnS1 and φfnS0 are coupled to the driver system of the sub generator HFGfnMS, and the driver system is coupled to the power supply PSUfn. The power supply PSUfn is coupled to the RF cable 114C.

Moreover, the parameter controller PRf(n−1)S1 for the state S1 is coupled to the parameter controller PRf0S1 for the state S1, and the parameter controller PRfnS1 for the state S1 is coupled to the parameter controller PRf0S1.

Similarly, the parameter controller PRf(n−1)S0 for the state S0 is coupled to the parameter controller PRf0S0 for the state S0, and the parameter controller PRfnS0 for the state S0 is coupled to the parameter controller PRf0S0.

Also, the phase controller φf(n−1)S1 for the state S1 is coupled to the phase controller φf0S1 for the state S1, and the phase controller φfnS1 for the state S1 is coupled to the phase controller φf0S1. Similarly, the phase controller φf(n−1)S0 for the state S0 is coupled to the phase controller φf0S0 for the state S0, and the phase controller φfnS0 for the state S0 is coupled to the phase controller φf0S0 for the state S0.

Furthermore, the frequency controller FCf(n−1)S1 for the state S1 is coupled to the frequency controller FCf0S1 for the state S1, and the frequency controller FCfnS1 for the state S1 is coupled to the frequency controller FCf0S1. Similarly, the frequency controller FCf(n−1)S0 for the state S0 is coupled to the frequency controller FCf0S0 for the state S0 and the frequency controller FCfnS0 for the state S0 is coupled to the frequency controller FCf0S0.

The system 300 includes the host computer system. The processor of the host computer system is coupled to the digital signal processor of the low frequency RF generator LGFMS via the transfer medium TM1 and is coupled to the digital signal processor of the high frequency RF generator HFGMS via the transfer medium TM2. In addition, the processor of the computer system is coupled to the digital signal processor of the low frequency RF generator LGFMS via a transfer medium TM3 and is coupled to the digital signal processor of the high frequency RF generator HFGMS via a transfer medium TM4.

The processor of the host computer system sends a clock signal, such as a transistor-transistor logic (TTL) signal, via the transfer medium TM3 to the digital signal processor of the low frequency RF generator LFGMS and also sends a data signal via the transfer medium TM1 to the digital signal processor of the low frequency RF generator LFGMS. The data signal sent to the low frequency RF generator LFGMS includes a parameter level for the state S1 of an RF signal 318 to be generated by the low frequency RF generator LFGMS, a parameter level for the state S0 of the RF signal 318, a frequency for the state S1 of the RF signal 318, and a frequency for the state S0 of the RF signal 318.

The digital signal processor of the low frequency RF generator LFGMS receives the clock signal and determines whether a state of the clock signal is S1 or S0. For example, in response to determining that the clock signal has a logic level 1, the digital signal processor of the low frequency RF generator LFGMS determines that the state of the clock signal is S1. Moreover, in response to determining that the clock signal has a logic level 0, the digital signal processor of the low frequency RF generator LFGMS determines that the state of the clock signal is S0. As another example, in response to determining that the clock signal has a logic level greater than a pre-determined logic level, the digital signal processor of the low frequency RF generator LFGMS determines that the state of the clock signal is S1. On the other hand, in response to determining the clock signal has a logic level less than the pre-determined logic level, the digital signal processor of the low frequency RF generator LFGMS determines that the state of the clock signal is S0.

During the state S1 of the clock signal, the digital signal processor of the low frequency RF generator LFGMS sends the parameter level for the state S1 to the parameter controller PRS1 and sends the frequency for the state S1 to the frequency controller FCS1. Similarly, during the state S0 of the clock signal, the digital signal processor of the low frequency RF generator LFGMS sends the parameter level for the state S0 to the parameter controller PRS0 and sends the frequency for the state S0 to the frequency controller FCS0.

During the state S1 of the clock signal, the parameter controller PRS1 of the low frequency RF generator LFGMS provides the parameter level for the state S1 to the driver system of the low frequency RF generator LFGMS. Also, during the state S1 of the clock signal, the frequency controller FCS1 of the low frequency RF generator LFGMS provides the frequency for the state S1 to the driver system of the low frequency RF generator LFGMS. The driver system of the low frequency RF generator LFGMS generates a current signal based on the parameter level for the state S1 received from the parameter controller PRS1 and the frequency for the state S1 received from the frequency controller FCS1 of the low frequency RF generator LFGMS, and provides the current signal to the power supply of the low frequency RF generator LFGMS. Upon receiving the current signal, the power supply of the low frequency RF generator LFGMS generates a portion of the RF signal 318 having the parameter level for the state S1 and the frequency for the state S1 that are received from the processor of the host computer system by the digital signal processor of the low frequency RF generator LFGMS.

Similarly, during the state S0 of the clock signal, the parameter controller PRS0 of the low frequency RF generator LFGMS provides the parameter level for the state S0 to the driver system of the low frequency RF generator LFGMS. Also, during the state S0 of the clock signal, the frequency controller FCS0 of the low frequency RF generator LFGMS provides the frequency for the state S0 to the driver system of the low frequency RF generator LFGMS. The driver system of the low frequency RF generator LFGMS generates a current signal based on the parameter level for the state S0 received from the parameter controller PRS0 and the frequency for the state S0 received from the frequency controller FCS0 of the low frequency RF generator LFGMS, and provides the current signal to the power supply of the low frequency RF generator LFGMS. Upon receiving the current signal, the power supply of the low frequency RF generator LFGMS generates a portion of the RF signal 318 having the parameter level for the state S0 and the frequency for the state S0 that are received from the processor of the host computer system by the digital signal processor of the low frequency RF generator LFGMS. The RF signal 318 having the portion for the state S1 and the portion for the state S0 is supplied through the RF cable 112 to the input I4 of the RF match.

In a similar manner, the processor of the host computer system sends the clock signal via the transfer medium TM4 to the digital signal processor of the sub generator HFGf0MS of the high frequency RF generator HFGMS and also sends a data signal via the transfer medium TM2 to the digital signal processor of the sub generator HFGf0MS. The data signal sent to the sub generator HFGf0MS of the high frequency RF generator HFGMS includes a parameter level at a fundamental frequency, such as the frequency f0, for the state S1 of an RF signal 308A to be generated by the sub generator HFGf0MS, a parameter level at the fundamental frequency for the state S0 of the RF signal 308A, the fundamental frequency for the state S1 of the RF signal 308A, the fundamental frequency for the state S0 of the RF signal 308A, a phase at the fundamental frequency for the state S1 of the RF signal 308A, and a phase at the fundamental frequency for the state S0 of the RF signal 308A.

It should be noted that, in some embodiments, a value of the fundamental frequency of a sub generator for the state S0 is different from a value of the fundamental frequency of the sub generator for the state S1. For example, the fundamental frequency for the state S1 is at least b % greater than or less than the fundamental frequency for the state S0, where b ranges from and including 5% to 20%. Similarly, a value of the phase at the fundamental frequency of the sub generator for the state S0 is different from a value of the phase at the fundamental frequency of the sub generator for the state S1 and the parameter level at the fundamental frequency of the sub generator for the state S0 is different from the parameter level at the fundamental frequency of the sub generator for the state S1. For example, the phase at the fundamental frequency for the state S1 is at least b % greater than or less than the phase at the fundamental frequency for the state S0 and the parameter level at the fundamental frequency for the state S1 is at least b % greater than or less than the parameter level at the fundamental frequency for the state S0.

The digital signal processor of the sub generator HFGf0MS of the high frequency RF generator HFGMS receives the clock signal and determines whether a state of the clock signal is S1 or S0. The determination of the state S1 or S0 of the clock signal by the digital signal processor of the sub generator HFGf0MS is made in the same manner, described above, of determination of the state 1 or S0 of the clock signal by the digital signal processor of the low frequency RF generator LFGMS.

During the state S1 of the clock signal, the digital signal processor of the sub generator HFGf0MS of the high frequency RF generator HFGMS sends the parameter level at the fundamental frequency for the state S1 to the parameter controller PRf0S1, sends the phase at the fundamental frequency for the state S1 to the phase controller φf0S1, and sends the fundamental frequency for the state S1 to the frequency controller FCf0S1. Similarly, during the state S0 of the clock signal, the digital signal processor of the sub generator HFGf0MS of the high frequency RF generator HFGMS sends the parameter level at the fundamental frequency for the state S0 to the parameter controller PRS0, sends the phase at the fundamental frequency for the state S0 to the phase controller φf0S0, and sends the fundamental frequency for the state S0 to the frequency controller FCS0.

Moreover, during the state S1 of the clock signal, the parameter controller PRf0S1 of the sub generator HFGf0MS of the high frequency RF generator HFGMS provides the parameter level at the fundamental frequency for the state S1 to the driver system of the sub generator HFGf0MS. Also, during the state S1 of the clock signal, the frequency controller FCf0S1 of the of the sub generator HFGf0MS of the high frequency RF generator HFGMS provides the fundamental frequency for the state S1 to the driver system of the sub generator HFGf0MS. During the state S1 of the clock signal, the phase controller φf0S1 of the sub generator HFGf0MS of the high frequency RF generator HFGMS provides the phase at the fundamental frequency for the state S1 to the driver system of the sub generator HFGf0MS.

The driver system of the sub generator HFGf0MS of the high frequency RF generator HFGMS generates a current signal based on the parameter level at the fundamental frequency for the state S1 received from the parameter controller PRf0S1, the fundamental frequency for the state S1 received from the frequency controller FCf0S1, and the phase for the state S1 received from the phase controller φf0S1, and provides the current signal to the power supply of the sub generator HFGf0MS. Upon receiving the current signal, the power supply of the sub generator HFGf0MS generates a portion of the RF signal 308A having the parameter level at the fundamental frequency for the state S1, the phase at the fundamental frequency for the state S1, and the fundamental frequency for the state S1.

Similarly, during the state S0 of the clock signal, the parameter controller PRf0S0 of the sub generator HFGf0MS of the high frequency RF generator HFGMS provides the parameter level at the fundamental frequency for the state S0 to the driver system of the sub generator HFGf0MS. Also, during the state S0 of the clock signal, the frequency controller FCf0S0 of the of the sub generator HFGf0MS of the high frequency RF generator HFGMS provides the fundamental frequency for the state S0 to the driver system of the sub generator HFGf0MS. During the state S0 of the clock signal, the phase controller φf0S1 of the sub generator HFGf0MS of the high frequency RF generator HFGMS provides the phase at the fundamental frequency for the state S0 to the driver system of the sub generator HFGf0MS.

The driver system of the sub generator HFGf0MS of the high frequency RF generator HFGMS generates a current signal based on the parameter level at the fundamental frequency for the state S0 received from the parameter controller PRf0S0, the fundamental frequency for the state S0 received from the frequency controller FCf0S0, and the phase for the state S0 received from the phase controller φf0S0, and provides the current signal to the power supply of the sub generator HFGf0MS. Upon receiving the current signal, the power supply of the sub generator HFGf0MS generates a portion of the RF signal 308A having the parameter level at the fundamental frequency for the state S0, the phase at the phenomenal frequency for the state S0, and the fundamental frequency for the state S0. The RF signal 308A having the portion for the state S1 and the portion for the state S0 is supplied through the RF cable 114A to the input I1 of the RF match.

The frequency controller FCf(n−1)S1 of the sub generator HFGf(n−1)MS obtains the fundamental frequency for the state S1 of the RF signal 308A from the frequency controller FCf0S1 of the sub generator HFGf0MS to generate an (n−1)th harmonic frequency for the state S1 of an RF signal 308B to be generated by the sub generator HFGf(n−1)MS. For example, the frequency controller FCf(n−1)S1 obtains the fundamental frequency for the state S1 of the RF signal 308A and multiplies the fundamental frequency for the state S1 by a multiplier, such as (n−1), to generate the (n−1)th harmonic frequency for the state S1 of the RF signal 308B. The frequency controller FCf(n−1)S1 generates the (n−1)th harmonic frequency for the state S1 of the RF signal 308B to achieve a pre-determined frequency difference between the (n−1)th harmonic frequency and the fundamental frequency for the state S1 of the RF signal 308A to lock the (n−1)th harmonic frequency for the state S1 of the RF signal 308B with the fundamental frequency for the state S1 of the RF signal 308A. The frequency controller of the sub generator HFGf(n−1)MS provides the (n−1)th harmonic frequency for the state S1 of the RF signal 308B to the driver system of the sub generator HFGf(n−1)MS.

It should be noted that the pre-determined frequency difference for the state S1 of the RF signals 308A and 308B corresponds to a pre-determined uniformity in an etch rate of etching the substrate S for the state S1. For example, the frequency controller FCf(n−1)S1 of the sub generator HFGf(n−1)MS stores within a memory device of the frequency controller FCf(n−1)S1 a relationship, such as a one-to-one correspondence or a link, between the pre-determined frequency difference and the pre-determined uniformity in the etch rate for the state S1 of the RF signals 308A and 308B. The frequency controller FCf(n−1)S1 of the sub generator HFGf(n−1)MS accesses the pre-determined frequency difference for the state S1 of the RF signals 308A and 308B from the memory device of the frequency controller FCf(n−1)S1 to achieve the pre-determined uniformity in the etch rate for the state S1 of the RF signals 308A and 308B.

Similarly, the frequency controller FCf(n−1)S0 of the sub generator HFGf(n−1)MS obtains the fundamental frequency for the state S0 of the RF signal 308A from the frequency controller FCf0S0 of the sub generator HFGf0MS to generate an (n−1)th harmonic frequency for the state S0 of the RF signal 308B. As an example, the frequency controller FCf(n−1)S0 obtains the fundamental frequency for the state S0 of the RF signal 308A and multiplies the fundamental frequency for the state S0 by a multiplier, such as (n−1), to generate the (n−1)th harmonic frequency for the state S0 of the RF signal 308B. The frequency controller FCf(n−1)S0 generates the (n−1)th harmonic frequency for the state S0 of the RF signal 308B to achieve a pre-determined frequency difference between the (n−1)th harmonic frequency and the fundamental frequency for the state S0 of the RF signal 308A to lock the (n−1)th harmonic frequency for the state S0 of the RF signal 308B with the fundamental frequency for the state S0 of the RF signal 308A. The frequency controller FCf(n−1)S0 of the sub generator HFGf(n−1)MS provides the (n−1)th harmonic frequency for the state S0 of the RF signal 308B to the driver system of the sub generator HFGf(n−1)MS.

It should be noted that the pre-determined frequency difference for the state S0 of the RF signals 308A and 308B corresponds to a pre-determined uniformity in an etch rate of etching the substrate S for the state S0. For example, the frequency controller FCf(n−1)S0 of the sub generator HFGf(n−1)MS stores within a memory device of the frequency controller FCf(n−1)S0 a relationship, such as a one-to-one correspondence or a link, between the pre-determined frequency difference and the pre-determined uniformity in the etch rate for the state S0 of the RF signals 308A and 308B. The frequency controller FCf(n−1)S0 of the sub generator HFGf(n−1)MS accesses the pre-determined frequency difference for the state S0 of the RF signals 308A and 308B from the memory device of the frequency controller FCf(n−1)S0 to achieve the pre-determined uniformity in the etch rate for the state S0 of the RF signals 308A and 308B.

Moreover, the parameter controller PRf(n−1)S1 of the sub generator HFGf(n−1)MS obtains the parameter level at the fundamental frequency for the state S1 of the RF signal 308A from the parameter controller PRf0S1 of the sub generator HFGf0MS to generate a parameter level for the state S1 at the (n−1)th harmonic frequency of the RF signal 308B. For example, the parameter controller PRf(n−1)S1 of the sub generator HFGf(n−1)MS obtains the parameter level at the fundamental frequency for the state S1 of the RF signal 308A and adds to or subtracts from the parameter level to generate the parameter level at the (n−1)th harmonic frequency for the state S1 of the RF signal 308B. The parameter controller PRf(n−1)S1 generates the parameter level at the (n−1)th harmonic frequency for the state S1 of the RF signal 308B to achieve a pre-determined parameter level difference between the parameter level at the (n−1)th harmonic frequency for the state S1 of the RF signal 308B and the parameter level at the fundamental frequency for the state S1 of the RF signal 308A to lock the parameter level at the (n−1)th harmonic frequency for the state S1 of the RF signal 308B with the parameter level at the fundamental frequency for the state S1 of the RF signal 308A. The parameter controller PRf(n−1)S1 of the sub generator HFGf(n−1)MS provides the parameter level at the (n−1)th harmonic frequency for the state S1 of the RF signal 308B to the driver system of the sub generator HFGf(n−1)MS.

It should be noted that the pre-determined parameter level difference for the state S1 of the RF signals 308A and 308B corresponds to the pre-determined uniformity in the etch rate of etching the substrate S for the state S1. For example, the parameter controller PRf(n−1)S1 of the sub generator HFGf(n−1)MS stores within a memory device of the parameter controller PRf(n−1)S1 a relationship, such as a one-to-one correspondence or a link, between the pre-determined parameter level difference and the pre-determined uniformity in the etch rate for the state S1 of the RF signals 308A and 308B. The parameter controller PRf(n−1)S1 of the sub generator HFGf(n−1)MS accesses the pre-determined parameter level difference for the state S1 of the RF signals 308A and 308B from the memory device of the parameter controller PRf(n−1)S1 to achieve the pre-determined uniformity in the etch rate for the state S1 of the RF signals 308A and 308B.

Similarly, the parameter controller PRf(n−1)S0 of the sub generator HFGf(n−1)MS obtains the parameter level at the fundamental frequency for the state S0 of the RF signal 308A from the parameter controller PRf0S0 of the sub generator HFGf0MS to generate a parameter level for the state S0 at the (n−1)th harmonic frequency of the RF signal 308B. For example, the parameter controller PRf(n−1)S0 generates the parameter level at the (n−1)th harmonic frequency for the state S0 of the RF signal 308B to achieve a pre-determined parameter level difference between the parameter level at the (n−1)th harmonic frequency for the state S0 of the RF signal 308B and the parameter level at the fundamental frequency for the state S0 of the RF signal 308A to lock the parameter level at the (n−1)th harmonic frequency for the state S0 of the RF signal 308B with the parameter level at the fundamental frequency for the state S0 of the RF signal 308A. The parameter controller PRf(n−1)S0 of the sub generator HFGf(n−1)MS provides the parameter level at the (n−1)th harmonic frequency for the state S0 of the RF signal 308B to the driver system of the sub generator HFGf(n−1)MS.

It should be noted that the pre-determined parameter level difference for the state S0 of the RF signals 308A and 308B corresponds to the pre-determined uniformity in the etch rate of etching the substrate S for the state S0. For example, the parameter controller PRf(n−1)S0 of the sub generator HFGf(n−1)MS stores within a memory device of the parameter controller PRf(n−1)S0 a relationship, such as a one-to-one correspondence or a link, between the pre-determined parameter level difference and the pre-determined uniformity in the etch rate for the state S0 of the RF signals 308A and 308B. The parameter controller PRf(n−1)S0 of the sub generator HFGf(n−1)MS accesses the pre-determined parameter level difference for the state S0 of the RF signals 308A and 308B from the memory device of the parameter controller PRf(n−1)S0 to achieve the pre-determined uniformity in the etch rate for the state S0 of the RF signals 308A and 308B.

Also, the phase controller ϕf(n−1)S1 of the sub generator HFGf(n−1)MS obtains the phase at the fundamental frequency for the state S1 of the RF signal 308A from the phase controller ϕf0S1 of the sub generator HFGf0MS to generate a phase at the (n−1)th harmonic frequency for the state S1 of the RF signal 308B. For example, the phase controller ϕf(n−1)S1 of the sub generator HFGf(n−1)MS obtains the phase of the RF signal 308A and shifts along the time t the phase to generate the phase at the (n−1)th harmonic frequency for the state S1 of the RF signal 308B. To illustrate, the phase controller ϕf(n−1)S1 generates the phase at the (n−1)th harmonic frequency for the state S1 of the RF signal 308B to achieve a pre-determined phase difference between the phase at the (n−1)th harmonic frequency for the state S1 of the RF signal 308B and the phase at the fundamental frequency for the state S1 of the RF signal 308A to lock the phase at the (n−1)th harmonic frequency for the state S1 of the RF signal 308B with the phase at the fundamental frequency for the state S1 of the RF signal 308A. The phase controller ϕf(n−1)S1 of the sub generator HFGf(n−1)MS provides the phase at the (n−1)th harmonic frequency for the state S1 of the RF signal 308B to the driver system of the sub generator HFGf(n−1)MS.

It should be noted that the pre-determined phase difference for the state S1 of the RF signals 308A and 308B corresponds to the pre-determined uniformity in the etch rate of etching the substrate S for the state S1. For example, the phase controller ϕf(n−1)S1 of the sub generator HFGf(n−1) MS stores within a memory device of the phase controller ϕf(n−1)S1 a relationship, such as a one-to-one correspondence or a link, between the pre-determined phase difference and the pre-determined uniformity in the etch rate for the state S1 of the RF signals 308A and 308B. The phase controller ϕf(n−1)S1 of the sub generator HFGf(n−1)MS accesses the pre-determined phase difference for the state S1 of the RF signals 308A and 308B from the memory device of the phase controller ϕf(n−1)S1 to achieve the pre-determined uniformity in the etch rate for the state S1 of the RF signals 308A and 308B.

Similarly, the phase controller ϕf(n−1)S0 of the sub generator HFGf(n−1)MS obtains the phase at the fundamental frequency for the state S0 of the RF signal 308A from the phase controller ϕf0S0 of the sub generator HFGf0MS to generate a phase at the (n−1)th harmonic frequency for the state S0 of the RF signal 308B. For example, the phase controller ϕf(n−1)S0 of the sub generator HFGf(n−1)MS obtains the phase of the RF signal 308A and shifts along the time t the phase to generate the phase at the (n−1)th harmonic frequency for the state S0 of the RF signal 308B. To illustrate, the phase controller ϕf(n−1)S0 generates the phase at the (n−1)th harmonic frequency for the state S0 of the RF signal 308B to achieve a pre-determined phase difference between the phase at the (n−1)th harmonic frequency for the state S0 of the RF signal 308B and the phase at the fundamental frequency for the state S0 of the RF signal 308A to lock the phase at the (n−1)th harmonic frequency for the state S0 of the RF signal 308B with the phase at the fundamental frequency for the state S0 of the RF signal 308A. The phase controller ϕf(n−1)S0 of the sub generator HFGf(n−1)MS provides the phase at the (n−1)th harmonic frequency for the state S0 of the RF signal 308B to the driver system of the sub generator HFGf(n−1)MS.

It should be noted that the pre-determined phase difference for the state S0 of the RF signals 308A and 308B corresponds to the pre-determined uniformity in the etch rate of etching the substrate S for the state S0. For example, the phase controller ϕf(n−1)S0 of the sub generator HFGf(n−1) MS stores within a memory device of the phase controller ϕf(n−1)S0 a relationship, such as a one-to-one correspondence or a link, between the pre-determined phase difference and the pre-determined uniformity in the etch rate for the state S0 of the RF signals 308A and 308B. The phase controller ϕf(n−1)S0 of the sub generator HFGf(n−1)MS accesses the pre-determined phase difference for the state S0 of the RF signals 308A and 308B from the memory device of the phase controller ϕf(n−1)S0 to achieve the pre-determined uniformity in the etch rate for the state S0 of the RF signals 308A and 308B.

Upon receiving the frequency at the (n−1)th harmonic frequency for the state S1 of the RF signal 308B, the phase at the (n−1)th harmonic frequency for the state S1 of the RF signal 308B, and the parameter level at the (n−1)th harmonic frequency for the state S1 of the RF signal 308B, the driver system of the sub generator HFGf(n−1)MS generates a current signal from the frequency, the phase, and the parameter. Upon receiving the current signal from the driver system of the sub generator HFGf(n−1)MS, the power supply of the sub generator HFGf(n−1)MS generates a portion of the RF signal 308B having the frequency at the (n−1)th harmonic frequency for the state S1, the phase at the (n−1)th harmonic frequency for the state S1, and the parameter level at the (n−1)th harmonic frequency for the state S1.

Similarly, upon receiving the frequency at the (n−1)th harmonic frequency for the state S0 of the RF signal 308B, the phase at the (n−1)th harmonic frequency for the state S0 of the RF signal 308B, and the parameter level at the (n−1)th harmonic frequency for the state S0 of the RF signal 308B, the driver system of the sub generator HFGf(n−1)MS generates a current signal from the frequency, the phase, and the parameter. Upon receiving the current signal from the driver system of the sub generator HFGf(n−1)MS, the power supply of the sub generator HFGf(n−1)MS generates a portion of the RF signal 308B having the frequency at the (n−1)th harmonic frequency for the state S0, the phase at the (n−1)th harmonic frequency for the state S0, and the parameter level at the (n−1)th harmonic frequency for the state S0. The driver system supplies the RF signal 308B having the portion for the state S1 and the portion for the state S0 via the RF cable 114B to the input I2 of the RF match.

Moreover, the frequency controller FCfnS1 of the sub generator HFGfnMS obtains the fundamental frequency for the state S1 of the RF signal 308A from the frequency controller FCf0S1 of the sub generator HFGf0MS to generate an nth harmonic frequency for the state S1 of an RF signal 308C to be generated by the sub generator HFGfnMS. For example, the frequency controller FCfnS1 obtains the fundamental frequency for the state S1 of the RF signal 308A and multiplies the fundamental frequency for the state S1 by a multiplier, such as n, to generate the nth harmonic frequency for the state S1 of the RF signal 308C. The frequency controller FCfnS1 generates the nth harmonic frequency for the state S1 of the RF signal 308C to achieve a pre-determined frequency difference between the nth harmonic frequency and the fundamental frequency for the state S1 of the RF signal 308A to lock the nth harmonic frequency for the state S1 of the RF signal 308C with the fundamental frequency for the state S1 of the RF signal 308A. The frequency controller of the sub generator HFGfnMS provides the nth harmonic frequency for the state S1 of the RF signal 308C to the driver system of the sub generator HFGfnMS.

It should be noted that the pre-determined frequency difference for the state S1 of the RF signals 308A and 308C corresponds to the pre-determined uniformity in the etch rate of etching the substrate S for the state S1. For example, the frequency controller FCfnS1 of the sub generator HFGfnMS stores within a memory device of the frequency controller FCfnS1 a relationship, such as a one-to-one correspondence or a link, between the pre-determined frequency difference and the pre-determined uniformity in the etch rate for the state S1 of the RF signals 308A and 308C. The frequency controller FCfnS1 of the sub generator HFGfnMS accesses the pre-determined frequency difference for the state S1 of the RF signals 308A and 308C from the memory device of the frequency controller FCfnS1 to achieve the pre-determined uniformity in the etch rate for the state S1 of the RF signals 308A and 308C.

Similarly, the frequency controller FCfnS0 of the sub generator HFGfnMS obtains the fundamental frequency for the state S0 of the RF signal 308A from the frequency controller FCf0S0 of the sub generator HFGf0MS to generate an nth harmonic frequency for the state S0 of the RF signal 308C. As an example, the frequency controller FCfnS0 obtains the fundamental frequency for the state S0 of the RF signal 308A and multiplies the fundamental frequency for the state S0 by a multiplier, such as n, to generate the nth harmonic frequency for the state S0 of the RF signal 308C. The frequency controller FCfnS0 generates the nth harmonic frequency for the state S0 of the RF signal 308C to achieve a pre-determined frequency difference between the nth harmonic frequency and the fundamental frequency for the state S0 of the RF signal 308A to lock the nth harmonic frequency for the state S0 of the RF signal 308C with the fundamental frequency for the state S0 of the RF signal 308A. The frequency controller FCfnS0 of the sub generator HFGfnMS provides the nth harmonic frequency for the state S0 of the RF signal 308C to the driver system of the sub generator HFGfnMS.

It should be noted that the pre-determined frequency difference for the state S0 of the RF signals 308A and 308C corresponds to the pre-determined uniformity in the etch rate of etching the substrate S for the state S0. For example, the frequency controller FCfnS0 of the sub generator HFGfnMS stores within a memory device of the frequency controller FCfnS0 a relationship, such as a one-to-one correspondence or a link, between the pre-determined frequency difference and the pre-determined uniformity in the etch rate for the state S0 of the RF signals 308A and 308C. The frequency controller FCfnS0 of the sub generator HFGfnMS accesses the pre-determined frequency difference for the state S0 of the RF signals 308A and 308C from the memory device of the frequency controller FCfnS0 to achieve the pre-determined uniformity in the etch rate for the state S0 of the RF signals 308A and 308C.

Moreover, the parameter controller PRfnS1 of the sub generator HFGfnMS obtains the parameter level at the fundamental frequency for the state S1 of the RF signal 308A from the parameter controller PRf0S1 of the sub generator HFGf0MS to generate a parameter level for the state S1 at the nth harmonic frequency of the RF signal 308C. For example, the parameter controller PRfnS1 of the sub generator HFGfnMS obtains the parameter level at the fundamental frequency for the state S1 of the RF signal 308A and adds to or subtracts from the parameter level to generate the parameter level at the nth harmonic frequency for the state S1 of the RF signal 308C. For example, the parameter controller PRfnS1 generates the parameter level at the nth harmonic frequency for the state S1 of the RF signal 308C to achieve a pre-determined parameter level difference between the parameter level at the nth harmonic frequency for the state S1 of the RF signal 308C and the parameter level at the fundamental frequency for the state S1 of the RF signal 308A to lock the parameter level at the nth harmonic frequency for the state S1 of the RF signal 308C with the parameter level at the fundamental frequency for the state S1 of the RF signal 308A. The parameter controller PRfnS1 of the sub generator HFGfnMS provides the parameter level at the nth harmonic frequency for the state S1 of the RF signal 308C to the driver system of the sub generator HFGfnMS.

It should be noted that the pre-determined parameter level difference for the state S1 of the RF signals 308A and 308C corresponds to the pre-determined uniformity in the etch rate of etching the substrate S for the state S1. For example, the parameter controller PRfnS1 of the sub generator HFGfnMS stores within a memory device of the parameter controller PRfnS1 a relationship, such as a one-to-one correspondence or a link, between the pre-determined parameter level difference and the pre-determined uniformity in the etch rate for the state S1 of the RF signals 308A and 308C. The parameter controller PRfnS1 of the sub generator HFGfnMS accesses the pre-determined parameter level difference for the state S1 of the RF signals 308A and 308C from the memory device of the parameter controller PRfnS1 to achieve the pre-determined uniformity in the etch rate for the state S1 of the RF signals 308A and 308C.

Similarly, the parameter controller PRfnS0 of the sub generator HFGfnMS obtains the parameter level at the fundamental frequency for the state S0 of the RF signal 308A from the parameter controller PRf0S0 of the sub generator HFGf0MS to generate a parameter level for the state S0 at the nth harmonic frequency of the RF signal 308B. For example, the parameter controller PRfnS0 of the sub generator HFGfnMS obtains the parameter level at the fundamental frequency for the state S0 of the RF signal 308A and adds to or subtracts from the parameter level to generate the parameter level at the nth harmonic frequency for the state S0 of the RF signal 308C. To illustrate, the parameter controller PRfnS0 generates the parameter level at the nth harmonic frequency for the state S0 of the RF signal 308C to achieve a pre-determined parameter level difference between the parameter level at the nth harmonic frequency for the state S0 of the RF signal 308C and the parameter level at the fundamental frequency for the state S0 of the RF signal 308A to lock the parameter level at the nth harmonic frequency for the state S0 of the RF signal 308C with the parameter level at the fundamental frequency for the state S0 of the RF signal 308A. The parameter controller PRfnS0 of the sub generator HFGfnMS provides the parameter level at the nth harmonic frequency for the state S0 of the RF signal 308C to the driver system of the sub generator HFGfnMS.

It should be noted that the pre-determined parameter level difference for the state S0 of the RF signals 308A and 308C corresponds to the pre-determined uniformity in the etch rate of etching the substrate S for the state S0. For example, the parameter controller PRfnS0 of the sub generator HFGfnMS stores within a memory device of the parameter controller PRfnS0 a relationship, such as a one-to-one correspondence or a link, between the pre-determined parameter level difference and the pre-determined uniformity in the etch rate for the state S0 of the RF signals 308A and 308C. The parameter controller PRfnS0 of the sub generator HFGfnMS accesses the pre-determined parameter level difference for the state S0 of the RF signals 308A and 308C from the memory device of the parameter controller PRfnS0 to achieve the pre-determined uniformity in the etch rate for the state S0 of the RF signals 308A and 308C.

Also, the phase controller ϕfnS1 of the sub generator HFGfnMS obtains the phase at the fundamental frequency for the state S1 of the RF signal 308A from the phase controller ϕf0S1 of the sub generator HFGf0MS to generate a phase at the nth harmonic frequency for the state S1 of the RF signal 308C. For example, the phase controller ϕfnS1 of the sub generator HFGfnMS obtains the phase of the RF signal 308A and shifts along the time t the phase to generate the phase at the nth harmonic frequency for the state S1 of the RF signal 308C. To illustrate, the phase controller φfnS1 generates the phase at the nth harmonic frequency for the state S1 of the RF signal 308C to achieve a pre-determined phase difference between the phase at the nth harmonic frequency for the state S1 of the RF signal 308C and the phase at the fundamental frequency for the state S1 of the RF signal 308A to lock the phase at the nth harmonic frequency for the state S1 of the RF signal 308C with the phase at the fundamental frequency for the state S1 of the RF signal 308A. The phase controller φfnS1 of the sub generator HFGfnMS provides the phase at the nth harmonic frequency for the state S1 of the RF signal 308C to the driver system of the sub generator HFGfnMS.

It should be noted that the pre-determined phase difference for the state S1 of the RF signals 308A and 308C corresponds to the pre-determined uniformity in the etch rate of etching the substrate S for the state S1. For example, the phase controller φfnS1 of the sub generator HFGfnMS stores within a memory device of the phase controller φfnS1 a relationship, such as a one-to-one correspondence or a link, between the pre-determined phase difference and the pre-determined uniformity in the etch rate for the state S1 of the RF signals 308A and 308C. The phase controller φfnS1 of the sub generator HFGfnMS accesses the pre-determined phase difference for the state S1 of the RF signals 308A and 308C from the memory device of the phase controller φfnS1 to achieve the pre-determined uniformity in the etch rate for the state S1 of the RF signals 308A and 308C.

Similarly, the phase controller φfnS0 of the sub generator HFGfnMS obtains the phase at the fundamental frequency for the state S0 of the RF signal 308A from the phase controller φf0S0 of the sub generator HFGf0MS to generate a phase at the nth harmonic frequency for the state S0 of the RF signal 308C. For example, the phase controller φfnS0 of the sub generator HFGfnMS obtains the phase of the RF signal 308A and shifts along the time t the phase to generate the phase at the nth harmonic frequency for the state S0 of the RF signal 308C. To illustrate, the phase controller φfnS0 generates the phase at the nth harmonic frequency for the state S0 of the RF signal 308C to achieve a pre-determined phase difference between the phase at the nth harmonic frequency for the state S0 of the RF signal 308C and the phase at the fundamental frequency for the state S0 of the RF signal 308A to lock the phase at the nth harmonic frequency for the state S0 of the RF signal 308C with the phase at the fundamental frequency for the state S0 of the RF signal 308A. The phase controller φfnS0 of the sub generator HFGfnMS provides the phase at the nth harmonic frequency for the state S0 of the RF signal 308C to the driver system of the sub generator HFGfnMS.

It should be noted that the pre-determined phase difference for the state S0 of the RF signals 308A and 308C corresponds to the pre-determined uniformity in the etch rate of etching the substrate S for the state S0. For example, the phase controller φfnS0 of the sub generator HFGfnMS stores within a memory device of the phase controller φfnS0 a relationship, such as a one-to-one correspondence or a link, between the pre-determined phase difference and the pre-determined uniformity in the etch rate for the state S0 of the RF signals 308A and 308C. The phase controller φfnS0 of the sub generator HFGfnMS accesses the pre-determined phase difference for the state S0 of the RF signals 308A and 308C from the memory device of the phase controller φfnS0 to achieve the pre-determined uniformity in the etch rate for the state S0 of the RF signals 308A and 308C.

Upon receiving the frequency at the nth harmonic frequency for the state S1 of the RF signal 308C, the phase at the nth harmonic frequency for the state S1 of the RF signal 308C, and the parameter level at the nth harmonic frequency for the state S1 of the RF signal 308C, the driver system of the sub generator HFGfnMS generates a current signal from the frequency, the phase, and the parameter. Upon receiving the current signal from the driver system of the sub generator HFGfnMS, the power supply of the sub generator HFGfnMS generates a portion of the RF signal 308C having the frequency at the nth harmonic frequency for the state S1, the phase at the nth harmonic frequency for the state S1, and the parameter level at the nth harmonic frequency for the state S1.

Similarly, upon receiving the frequency at the nth harmonic frequency for the state S0 of the RF signal 308C, the phase at the nth harmonic frequency for the state S0 of the RF signal 308C, and the parameter level at the nth harmonic frequency for the state S0 of the RF signal 308C, the driver system of the sub generator HFGfnMS generates a current signal from the frequency, the phase, and the parameter. Upon receiving the current signal from the driver system of the sub generator HFGfnMS, the power supply of the sub generator HFGfnMS generates a portion of the RF signal 308C having the frequency at the nth harmonic frequency for the state S0, the phase at the nth harmonic frequency for the state S0, and the parameter level at the nth harmonic frequency for the state S0. The driver system supplies the RF signal 308C having the portion for the state S1 and the portion for the state S0 via the RF cable 114C to the input I3 of the RF match.

It should be noted that the RF signal 318 is an example of the RF signal 118 of FIG. 1A, the RF signal 308A is an example of the RF signal 108A of FIG. 1A, the RF signal 308B is an example of the RF signal 108B of FIG. 1A, and the RF signal 308C is an example of the RF signal 108C of FIG. 1A. Each of the RF signal 318 and 308-308C is a multi-state signal having the states S1 and S0.

In response to receiving the RF signals 318, 308A, 308B, and 308C, the RF match matches an impedance of a load coupled to the output O1 with that of a source coupled to the inputs I1 through I4 to modify the RF signals 318, 308A, 308B, and 308C, and combines, such as sums, the modified RF signals to generate a modified RF signal 310 at the output O1. An example of the source coupled to the inputs I1 through I4 includes the RF generator LGFMS and the RF generator HFGMS, and the RF cables 112 and 114A through 114C. The modified RF signal 310 is supplied via the RF transmission line 116 to the chuck 212 of the plasma chamber. When the one or more process gases and the modified RF signal 310 are supplied to the plasma chamber, the plasma is stricken or generated within the plasma chamber for processing the substrate S. By controlling the parameter level, the phase, and/or the frequency of the RF signal 308A during the state S1 of the clock signal, the parameter level, the phase, and/or the frequency of the RF signal 308A during the state S0 of the clock signal, the parameter level, the phase, and/or the frequency of the RF signal 308B during the state S1 of the clock signal, the parameter level, the phase, and/or the frequency of the RF signal 308B during the state S0 of the clock signal, the parameter level, the phase, and/or the frequency of the RF signal 308C during the state S1 of the clock signal, and/or the parameter level, the phase, and/or the frequency of the RF signal 308A during the state S0 of the clock signal, a relationship between RF harmonics of the plasma sheath within the plasma chamber and a fundamental frequency, such as f0, of the plasma sheath within the plasma chamber is controlled to achieve radial etch uniformity across the top surface of the substrate S.

In some embodiments, the digital signal processor DSP of the low frequency RF generator LFGMS, the parameter controller PRS1 of the low frequency RF generator LFGMS, and the frequency controller FCS1 of the low frequency RF generator LFGMS are replaced by a controller. For example, functions described herein as performed by the digital signal processor DSP, the parameter controller PRS1, and the frequency controller FCS1 of the low frequency RF generator LFGMS are instead performed by the controller. Similarly, in various embodiments, the digital signal processor DSP of the low frequency RF generator LFGMS, the parameter controller PRS0 of the low frequency RF generator LFGMS, and the frequency controller FCS0 of the low frequency RF generator LFGMS are replaced by a controller.

In various embodiments, the digital signal processor of the sub generator HFGf0MS, the parameter controller PRf0S1 of the sub generator HFGf0MS, the phase controller φf0S1 of the sub generator HFGf0MS, and the frequency controller FCf0S1 of the sub generator HFGf0MS are replaced by a controller of the sub generator HFGf0MS. For example, the functions described herein as being performed by the digital signal processor of the sub generator HFGf0MS, the parameter controller PRf0S1 of the sub generator HFGf0MS, the phase controller φf0S1 of the sub generator HFGf0MS, and the frequency controller FCf0S1 of the sub generator HFGf0MS are performed by the controller. Similarly, in several embodiments, the digital signal processor of the sub generator HFGf0MS, the parameter controller PRf0S0 of the sub generator HFGf0MS, the phase controller φf0S0 of the sub generator HFGf0MS, and the frequency controller FCf0S0 of the sub generator HFGf0MS are replaced by a controller of the sub generator HFGf0MS. For example, the functions described herein as being performed by the digital signal processor of the sub generator HFGf0MS, the parameter controller PRf0S0 of the sub generator HFGf0MS, the phase controller φf0S0 of the sub generator HFGf0MS, and the frequency controller FCf0S0 of the sub generator HFGf0MS are performed by the controller.

Also, in some embodiments, the parameter controller PRf(n−1)S1 of the sub generator HFGf(n−1)MS, the phase controller φf(n−1)S1 of the sub generator HFGf(n−1)MS, and the frequency controller FCf(n−1)S1 of the sub generator HFGf(n−1)MS are replaced by a controller of the sub generator HFGf(n−1)MS. For example, the functions described herein as being performed by the parameter controller PRf(n−1)S1 of the sub generator HFGf(n−1)MS, the phase controller φf(n−1)S1 of the sub generator HFGf(n−1)MS, and the frequency controller FCf(n−1)S1 of the sub generator HFGf(n−1)MS are performed by the controller. Similarly, in several embodiments, the parameter controller PRf(n−1)S0 of the sub generator HFGf(n−1)MS, the phase controller φf(n−1)S0 of the sub generator HFGf(n−1)MS, and the frequency controller FCf(n−1)S0 of the sub generator HFGf(n−1)MS are replaced by a controller of the sub generator HFGf(n−1)MS. For example, the functions described herein as being performed by the parameter controller PRf(n−1)S1 of the sub generator HFGf(n−1)MS, the phase controller φf(n−1)S1 of the sub generator HFGf(n−1)MS, and the frequency controller FCf(n−1)S1 of the sub generator HFGf(n−1)MS are performed by the controller.

In various embodiments, the parameter controller PRfnS1 of the sub generator HFGfnMS, the phase controller φfnS1 of the sub generator HFGfnMS, and the frequency controller FCfnS1 of the sub generator HFGfnMS are replaced by a controller of the sub generator HFGfnMS. For example, the functions described herein as being performed by the parameter controller PRfnS1 of the sub generator HFGfnMS, the phase controller φfnS1 of the sub generator HFGfnMS, and the frequency controller FCfnS1 of the sub generator HFGfnMS are performed by the controller. Similarly, in several embodiments, the parameter controller PRfnS0 of the sub generator HFGfnMS, the phase controller φfnS0 of the sub generator HFGfnMS, and the frequency controller FCfnS0 of the sub generator HFGfnMS are replaced by a controller of the sub generator HFGfnMS. For example, the functions described herein as being performed by the parameter controller PRfnS0 of the sub generator HFGfnMS, the phase controller φfnS0 of the sub generator HFGfnMS, and the frequency controller FCfnS0 of the sub generator HFGfnMS are performed by the controller.

In some embodiments, the high frequency RF generator HFGMS includes any number of sub generators. For example, the high frequency RF generator HFGMS excludes the sub generator HFGf(n−1)MS or HFGfnMS. As another example, the high frequency RF generator HFGMS includes one or more additional sub generators than that illustrated in FIG. 3A, such as, a sub generator HFGf(n+1)MS and a sub generator HFGf(n+2)MS.

In various embodiments, instead of the two states, an RF signal having more than two states, such as three states, four states, five states, etc., having the fundamental frequency f0 is generated by the sub generator HFGf0MS of the high frequency RF generator HFGMS. For example, a sub generator, such as the sub generator HFGf0MS, HFGf(n−1)MS, or HFGfnMS of the high frequency RF generator HFGMS is modified to include a state S2. To illustrate, the sub generator HFGf0MS includes a parameter controller PRf0S2, a phase controller φf0S2, a frequency controller FCf0S2, all of which are coupled to the digital signal processor of the sub generator HFGf0MS and to a driver system of the sub generator HFGf0MS. As another illustration, the sub generator HFGf(n−1)MS includes a parameter controller PRf(n−1)S2, a phase controller φf(n−1)S2, a frequency controller FCf(n−1)S2, all of which are coupled to a driver system of the sub generator HFGf(n−1)MS. Also, the parameter controller PRf(n−1)S2 is coupled to the parameter controller PRf0S2, the frequency controller FCf(n−1)S2 is coupled to the frequency controller FCf0S2, and the phase controller φf(n−1)S2 is coupled to the phase controller φf0S2. As yet another illustration, the sub generator HFGfnMS includes a parameter controller PRfnS2, a phase controller φfnS2, a frequency controller FCfnS2, all of which are coupled to a driver system of the sub generator HFGfnMS. Also, the parameter controller PRfnS2 is coupled to the parameter controller PRf0S2, the frequency controller FCfnS2 is coupled to the frequency controller FCf0S2, and the phase controller φfnS2 is coupled to the phase controller φf0S2.

In these embodiments, the digital signal processor of the sub generator HFGf0MS controls the parameter controller PRf0S2, the phase controller φf0S2, the frequency controller FCf0S2 in a similar manner, described above, in which the digital signal processor of the sub generator HFGf0MS controls the parameter controllers PRf0S1 and PRf0S0, the phase controllers φf0S1 and φf0S0, and the frequency controllers FCf0S1 and FCf0S0. Instead of the clock signal, the digital signal processor of the sub generator HFf0Ms receives a digital pulse signal having the three states, such as three different logic levels, via the transfer medium TM4 from the processor of the host computer system and identifies each of the three states S0, S1, and S2. The processor of the host computer system generates the digital pulse signal having the three states.

Moreover, in the embodiments, the processor of the host computer system sends a data signal via the transfer medium TM2 to the digital signal processor of the sub generator HFGf0MS. In addition to parameter levels at the fundamental frequency f0 for the states S0 and S1, the fundamental frequencies for the states S0 and S1, phases at the fundamental frequency for the states S1 and S0, the data signal sent to the sub generator HFGf0MS of the high frequency RF generator HFGMS includes a parameter level at the fundamental frequency for the state S2 of the RF signal to be generated by the sub generator HFGf0MS, a phase at the fundamental frequency for the state S2 of the same RF signal, and the fundamental frequency for the state S2 of the RF signal.

In these embodiments in which the more than three states are used, the digital signal processor of the sub generator HFGf0MS controls the parameter controllers PRf0S1 and PRf0S0, the phase controllers φf0S1 and φf0S0, and the frequency controllers FCf0S1 and FCf0S0 to generate the states S0 and S1 of the RF signal to be generated by the sub generator HFGf0MS in the same manner as that described above except that a period of time for which at least one of the states S0 and S1 occur is shorter than a period of time for which the states S0 and S1 of the RF signal 308A occur. Moreover, during the state S2 of the digital pulse signal, the digital signal processor of the sub generator HFGf0MS of the high frequency RF generator HFGMS sends the parameter level at the fundamental frequency for the state S2 to the parameter controller PRf0S2, sends the phase at the fundamental frequency for the state S2 to the phase controller φf0S2, and sends the fundamental frequency for the state S2 to the frequency controller FCf0S2.

Moreover, in these embodiments, during the state S2 of the digital pulse signal, the parameter controller PRf0S2 of the sub generator HFGf0MS of the high frequency RF generator HFGMS provides the parameter level at the fundamental frequency for the state S2 to the driver system of the sub generator HFGf0MS. Also, during the state S2 of the digital pulse signal, the frequency controller FCf0S2 of the sub generator HFGf0MS of the high frequency RF generator HFGMS provides the fundamental frequency for the state S2 to the driver system of the sub generator HFGf0MS. During the state S2 of the clock signal, the phase controller φf0S2 of the sub generator HFGf0MS of the high frequency RF generator HFGMS provides the phase at the fundamental frequency for the state S2 to the driver system of the sub generator HFGf0MS.

In these embodiments, the driver system of the sub generator HFGf0MS of the high frequency RF generator HFGMS generates a current signal based on the parameter level at the fundamental frequency for the state S2 received from the parameter controller PRf0S2, the fundamental frequency for the state S2 received from the frequency controller FCf0S2, and the phase for the state S2 received from the phase controller φf0S2, and provides the current signal to the power supply of the sub generator HFGf0MS. Upon receiving the current signal, the power supply of the sub generator HFGf0MS generates a portion of the RF signal having the parameter level at the fundamental frequency for the state S2, the phase at the fundamental frequency for the state S2, and the fundamental frequency for the state S2.

Continuing with the embodiments, states S1 and S0 of an RF signal to be generated by the sub generator HFGf(n−1)MS are generated in a manner similar to that of generating the states S1 and S0 of the RF signal 308B. Moreover, the frequency controller FCf(n−1)S2 of the sub generator HFGf(n−1)MS obtains the fundamental frequency for the state S2 of the RF signal to be generated by the sub generator HFGf0MS from the frequency controller FCf0S2 of the sub generator HFGf0MS to generate an (n−1)th harmonic frequency for the state S2 of the RF signal to be generated by the sub generator HFGf(n−1)MS. For example, the frequency controller FCf(n−1)S2 obtains the fundamental frequency for the state S2 of the RF signal to be generated by the sub generator HFGf0MS and multiplies the fundamental frequency for the state S2 by a multiplier, such as (n−1), to generate an (n−1)th harmonic frequency for the state S2 of the RF signal to be generated by the sub generator HFGf(n−1)MS. The frequency controller FCf(n−1)S2 generates the (n−1)th harmonic frequency for the state S2 of the RF signal to be generated by the sub generator HFGf(n−1)MS to achieve a pre-determined frequency difference between the (n−1)th harmonic frequency for the state S2 and the fundamental frequency for the state S2 of the RF signal to be generated by the sub generator HFGf0MS to lock the (n−1)th harmonic frequency for the state S2 of the RF signal to be generated by the sub generator HFGf(n−1)MS with the fundamental frequency for the state S2 of the RF signal to be generated by the sub generator HFGf0MS. The frequency controller of the sub generator HFGf(n−1)MS provides the (n−1)th harmonic frequency for the state S2 of the RF signal to be generated by the sub generator HFGf(n−1)MS to the driver system of the sub generator HFGf(n−1)MS.

It should be noted that the pre-determined frequency difference for the state S2 of the RF signals to be generated by the sub generators HFGf(n−1)MS and HFGf0MS corresponds to a pre-determined uniformity in an etch rate of etching the substrate S for the state S2. For example, the frequency controller FCf(n−1)S2 of the sub generator HFGf(n−1)MS stores within a memory device of the frequency controller FCf(n−1)S2 a relationship, such as a one-to-one correspondence or a link, between the pre-determined frequency difference and the pre-determined uniformity in the etch rate for the state S2 of the RF signal to be generated by the sub generator HFGf(n−1)MS. The frequency controller FCf(n−1)S2 of the sub generator HFGf(n−1)MS accesses the pre-determined frequency difference for the state S2 of the RF signal to be generated by the sub generator HFGf(n−1)MS from the memory device of the frequency controller FCf(n−1)S2 to achieve the pre-determined uniformity in the etch rate for the state S2 of the RF signal.

Moreover, the parameter controller PRf(n−1)S2 of the sub generator HFGf(n−1)MS obtains the parameter level at the fundamental frequency for the state S2 of the RF signal to be generated by the sub generator HFGf0MS from the parameter controller PRf0S2 of the sub generator HFGf0MS to generate a parameter level for the state S2 at the (n−1)th harmonic frequency of the RF signal to be generated by the sub generator HFGf(n−1)MS. For example, the parameter controller PRf(n−1)S2 of the sub generator HFGf(n−1)MS obtains the parameter level at the fundamental frequency for the state S2 of the RF signal to be generated by the sub generator HFGf0MS and adds to or subtracts from the parameter level to generate the parameter level at the (n−1)th harmonic frequency for the state S2 of the RF signal to be generated by the sub generator HFGf(n−1)MS. The parameter controller PRf(n−1)S2 generates the parameter level at the (n−1)th harmonic frequency for the state S2 of the RF signal to be generated by the sub generator HFGf(n−1)MS to achieve a pre-determined parameter level difference between the parameter level at the (n−1)th harmonic frequency for the state S2 of the RF signal to be generated by the sub generator HFGf(n−1)MS and the parameter level at the fundamental frequency for the state S2 of the RF signal to be generated by the sub generator HFGf0MS to lock the parameter level at the (n−1)th harmonic frequency for the state S2 of the RF signal to be generated by the sub generator HFGf(n−1)MS with the parameter level at the fundamental frequency for the state S2 of the RF signal to be generated by the sub generator HFGf0MS. The parameter controller PRf(n−1)S2 of the sub generator HFGf(n−1)MS provides the parameter level at the (n−1)th harmonic frequency for the state S2 of the RF signal to be generated by the sub generator HFGf(n−1)MS to the driver system of the sub generator HFGf(n−1)MS.

It should be noted that the pre-determined parameter level difference for the state S2 of the RF signals to be generated by the sub generators HFGf0MS and HFGf(n−1)MS corresponds to the pre-determined uniformity in the etch rate of etching the substrate S for the state S2. For example, the parameter controller PRf(n−1)S2 of the sub generator HFGf(n−1)MS stores within a memory device of the parameter controller PRf(n−1)S2 a relationship, such as a one-to-one correspondence or a link, between the pre-determined parameter level difference and the pre-determined uniformity in the etch rate for the state S2 of the RF signals to be generated by the sub generators HFGf(n−1)MS and HFGf0MS. The parameter controller PRf(n−1)S2 of the sub generator HFGf(n−1)MS accesses the pre-determined parameter level difference for the state S2 of the RF signals to be generated by the sub generators HFGf(n−1)MS and HFGf0MS from the memory device of the parameter controller PRf(n−1)S2 to achieve the pre-determined uniformity in the etch rate for the state S2 of the RF signals to be generated by the sub generators HFGf(n−1)MS and HFGf0MS.

Also, the phase controller ɸf(n−1)S2 of the sub generator HFGf(n−1)MS obtains the phase at the fundamental frequency for the state S2 of the RF signal to be generated by the sub generator HFGf0MS from the phase controller ɸf0S2 of the sub generator HFGf0MS to generate the phase at the (n−1)th harmonic frequency for the state S2 of the RF signal to be generated by the sub generator HFGf(n−1)MS. For example, the phase controller ɸf(n−1)S2 of the sub generator HFGf(n−1)MS obtains the phase of the RF signal to be generated by the sub generator HFGf0MS and shifts along the time t the phase to generate the phase at the (n−1)th harmonic frequency for the state S2 of the RF signal to be generated by the sub generator HFGf(n−1)MS. To illustrate, the phase controller ɸf(n−1)S2 generates the phase at the (n−1)th harmonic frequency for the state S2 of the RF signal to be generated by the sub generator HFGf(n−1)MS to achieve a pre-determined phase difference between the phase at the (n−1)th harmonic frequency for the state S2 of the RF signal to be generated by the sub generator HFGf(n−1)MS and the phase at the fundamental frequency for the state S2 of the RF signal to be generated by the sub generator HFGf0MS to lock the phase at the (n−1)th harmonic frequency for the state S2 of the RF signal to be generated by the sub generator HFGf(n−1)MS with the phase at the fundamental frequency for the state S2 of the RF signal to be generated by the sub generator HFGf0MS. The phase controller ɸf(n−1)S2 of the sub generator HFGf(n−1)MS provides the phase at the (n−1)th harmonic frequency for the state S2 of the RF signal to be generated by the sub generator HFGf(n−1)MS to the driver system of the sub generator HFGf(n−1)MS.

It should be noted that the pre-determined phase difference for the state S2 of the RF signals to be generated by the sub generators HFGf(n−1)MS and HFGf0MS corresponds to the pre-determined uniformity in the etch rate of etching the substrate S for the state S2. For example, the phase controller ɸf(n−1)S2 of the sub generator HFGf(n−1)MS stores within a memory device of the phase controller ɸf(n−1)S2 a relationship, such as a one-to-one correspondence or a link, between the pre-determined phase difference and the pre-determined uniformity in the etch rate for the state S2 of the RF signals to be generated by the sub generators HFGf(n−1)MS and HFGf0MS. The phase controller ɸf(n−1)S2 of the sub generator HFGf(n−1)MS accesses the pre-determined phase difference for the state S2 of the RF signals to be generated by the sub generators HFGf(n−1)MS and HFGf0MS from the memory device of the phase controller ɸf(n−1)S2 to achieve the pre-determined uniformity in the etch rate for the state S2 of the RF signals to be generated by the sub generators HFGf(n−1)MS and HFGf0MS.

Upon receiving the frequency at the (n−1)th harmonic frequency for the state S2 of the RF signal to be generated by the sub generator HFGf(n−1)MS, the phase at the (n−1)th harmonic frequency for the state S2 of the RF signal to be generated by the sub generator HFGf(n−1)MS, and the parameter level at the (n−1)th harmonic frequency for the state S2 of the RF signal to be generated by the sub generator HFGf(n−1)MS, the driver system of the sub generator HFGf(n−1)MS generates a current signal from the frequency, the phase, and the parameter. Upon receiving the current signal from the driver system of the sub generator HFGf(n−1)MS, the power supply of the sub generator HFGf(n−1)MS generates a portion of the RF signal having the frequency at the (n−1)th harmonic frequency for the state S2, the phase at the (n−1)th harmonic frequency for the state S2, and the parameter level at the (n−1)th harmonic frequency for the state S2.

It should be noted that during the state S2, a parameter level of the RF signal to be generated by the sub generator HFGf(n−1)MS is different from, such as greater than or lower than, a parameter level of the same RF signal during the state S0 and a parameter level of the same RF signal during the state S1. For example, the parameter level of the RF signal to be generated by the sub generator HFGf(n−1)MS during the state S2 is greater than or lower than the parameter level of the same RF signal during the state S1 by c % and the parameter level of the same RF signal during the state S1 is greater than or lower than the parameter level of the same RF signal during the state S0 by d %, where c ranges from and including 5% to 20% and d ranges from and including 5% to 20%. Similarly, during the state S2, a phase of the to be generated by the sub generator HFGf(n−1)MS is different from, such as greater than or lower than, a phase of the same RF signal during the state S1 by c % and during the state S1, the phase of the same RF signal is different from, such as greater than or lower than, a phase of the same RF signal during the state S0 by d %. Also, during the state S2, a frequency of the RF signal to be generated by the sub generator HFGf(n−1)MS is different from, such as greater than or lower than, a frequency of the same RF signal during the state S1 by c % and during the state S1, the frequency of the same RF signal is different from, such as greater than or lower than, a frequency of the same RF signal during the state S0 by d %.

In these embodiments, S1 and S0 of an RF signal to be generated by the sub generator HFGfnMS are generated in a manner similar to that of generating the states S1 and S0 of the RF signal 308C. Moreover, the frequency controller FCfnS2 of the sub generator HFGfnMS obtains the fundamental frequency for the state S2 of the RF signal to be generated by the sub generator HFGf0MS from the frequency controller FCf0S2 of the sub generator HFGf0MS to generate an nth harmonic frequency for the state S2 of the RF signal to be generated by the sub generator HFGfnMS. For example, the frequency controller FCfnS2 obtains the fundamental frequency for the state S2 of the RF signal to be generated by the sub generator HFGf0MS and multiplies the fundamental frequency for the state S2 by a multiplier, such as n, to generate the nth harmonic frequency for the state S2 of the RF signal to be generated by the sub generator HFGfnMS. The frequency controller FCfnS2 generates the nth harmonic frequency for the state S2 of the RF signal to be generated by the sub generator HFGfnMS to achieve a pre-determined frequency difference between the nth harmonic frequency and the fundamental frequency for the state S2 of the RF signal to be generated by the sub generator HFGf0MS to lock the nth harmonic frequency for the state S2 of the RF signal to be generated by the sub generator HFGfnMS with the fundamental frequency for the state S2 of the RF signal to be generated by the sub generator HFGf0MS. The frequency controller of the sub generator HFGfnMS provides the nth harmonic frequency for the state S2 of the RF signal to be generated by the sub generator HFGfnMS to the driver system of the sub generator HFGfnMS.

It should be noted that the pre-determined frequency difference for the state S2 of the RF signals to be generated by the sub generators HFGf0MS and HFGfnMS corresponds to a pre-determined uniformity in an etch rate of etching the substrate S for the state S2. For example, the frequency controller FCfnS2 of the sub generator HFGfnMS stores within a memory device of the frequency controller FCfnS2 a relationship, such as a one-to-one correspondence or a link, between the pre-determined frequency difference and the pre-determined uniformity in the etch rate for the state S2 of the RF signal to be generated by the sub generator HFGfnMS. The frequency controller FCfnS2 of the sub generator HFGfnMS accesses the pre-determined frequency difference for the state S2 of the RF signal to be generated by the sub generator HFGfnMS from the memory device of the frequency controller FCfnS2 to achieve the pre-determined uniformity in the etch rate for the state S2 of the RF signal to be generated by the sub generator HFGfnMS.

Moreover, the parameter controller PRfnS2 of the sub generator HFGfnMS obtains the parameter level at the fundamental frequency for the state S2 of the RF signal to be generated by the sub generator HFGf0MS from the parameter controller PRf0S2 of the sub generator HFGf0MS to generate a parameter level for the state S2 at the nth harmonic frequency of the RF signal to be generated by the sub generator HFGfnMS. For example, the parameter controller PRfnS2 of the sub generator HFGfnMS obtains the parameter level at the fundamental frequency for the state S2 of the RF signal to be generated by the sub generator HFGf0MS and adds to or subtracts from the parameter level to generate the parameter level at the nth harmonic frequency for the state S2 of the RF signal to be generated by the sub generator HFGfnMS. The parameter controller PRfnS2 generates the parameter level at the nth harmonic frequency for the state S2 of the RF signal to be generated by the sub generator HFGfnMS to achieve a pre-determined parameter level difference between the parameter level at the nth harmonic frequency for the state S2 of the RF signal to be generated by the sub generator HFGfnMS and the parameter level at the fundamental frequency for the state S2 of the RF signal to be generated by the sub generator HFGf0MS to lock the parameter level at the nth harmonic frequency for the state S2 of the RF signal to be generated by the sub generator HFGfnMS with the parameter level at the fundamental frequency for the state S2 of the RF signal to be generated by the sub generator HFGf0MS. The parameter controller PRfnS2 of the sub generator HFGfnMS provides the parameter level at the nth harmonic frequency for the state S2 of the RF signal to be generated by the sub generator HFGfnMS to the driver system of the sub generator HFGfnMS.

It should be noted that the pre-determined parameter level difference for the state S2 of the RF signals to be generated by the sub generators HFGf0MS and HFGfnMS corresponds to the pre-determined uniformity in the etch rate of etching the substrate S for the state S2. For example, the parameter controller PRfnS2 of the sub generator HFGfnMS stores within a memory device of the parameter controller PRfnS2 a relationship, such as a one-to-one correspondence or a link, between the pre-determined parameter level difference and the pre-determined uniformity in the etch rate for the state S2 of the RF signals to be generated by the sub generators HFGfnMS and HFGf0MS. The parameter controller PRfnS2 of the sub generator HFGfnMS accesses the pre-determined parameter level difference for the state S2 of the RF signals to be generated by the sub generators HFGfnMS and HFGf0MS from the memory device of the parameter controller PRfnS2 to achieve the pre-determined uniformity in the etch rate for the state S1 of the RF signals to be generated by the sub generators HFGfnMS and HFGf0MS.

Also, the phase controller ϕfnS2 of the sub generator HFGfnMS obtains the phase at the fundamental frequency for the state S2 of the RF signal to be generated by the sub generator HFGf0MS from the phase controller ϕf0S2 of the sub generator HFGf0MS to generate a phase at the nth harmonic frequency for the state S2 of the RF signal to be generated by the sub generator HFGfnMS. For example, the phase controller ϕfnS2 of the sub generator HFGfnMS obtains the phase of the RF signal to be generated by the sub generator HFGf0MS and shifts along the time t the phase to generate the phase at the nth harmonic frequency for the state S2 of the RF signal to be generated by the sub generator HFGfnMS. To illustrate, the phase controller ϕfnS2 generates the phase at the nth harmonic frequency for the state S2 of the RF signal to be generated by the sub generator HFGfnMS to achieve a pre-determined phase difference between the phase at the nth harmonic frequency for the state S2 of the RF signal to be generated by the sub generator HFGfnMS and the phase at the fundamental frequency for the state S2 of the RF signal to be generated by the sub generator HFGf0MS to lock the phase at the nth harmonic frequency for the state S2 of the RF signal to be generated by the sub generator HFGfnMS with the phase at the fundamental frequency for the state S2 of the RF signal to be generated by the sub generator HFGf0MS. The phase controller ϕfnS2 of the sub generator HFGfnMS provides the phase at the nth harmonic frequency for the state S2 of the RF signal to be generated by the sub generator HFGfnMS to the driver system of the sub generator HFGfnMS.

It should be noted that the pre-determined phase difference for the state S2 of the RF signals to be generated by the sub generators HFGfnMS and HFGf0MS corresponds to the pre-determined uniformity in the etch rate of etching the substrate S for the state S2. For example, the phase controller ϕfnS2 of the sub generator HFGfnMS stores within a memory device of the phase controller ϕfnS2 a relationship, such as a one-to-one correspondence or a link, between the pre-determined phase difference and the pre-determined uniformity in the etch rate for the state S2 of the RF signals to be generated by the sub generators HFGfnMS and HFGf0MS. The phase controller ϕfnS2 of the sub generator HFGfnMS accesses the pre-determined phase difference for the state S2 of the RF signals to be generated by the sub generators HFGfnMS and HFGf0MS from the memory device of the phase controller ϕfnS2 to achieve the pre-determined uniformity in the etch rate for the state S2 of the RF signals to be generated by the sub generators HFGfnMS and HFGf0MS.

Upon receiving the frequency at the nth harmonic frequency for the state S2 of the RF signal to be generated by the sub generator HFGfnMS, the phase at the nth harmonic frequency for the state S2 of the RF signal to be generated by the sub generator HFGfnMS, and the parameter level at the nth harmonic frequency for the state S2 of the RF signal to be generated by the sub generator HFGfnMS, the driver system of the sub generator HFGfnMS generates a current signal from the frequency, the phase, and the parameter. Upon receiving the current signal from the driver system of the sub generator HFGfnMS, the power supply of the sub generator HFGfnMS generates a portion of the RF signal having the frequency at the nth harmonic frequency for the state S2, the phase at the nth harmonic frequency for the state S2, and the parameter level at the nth harmonic frequency for the state S2.

It should be noted that during the state S2, a parameter level of the RF signal to be generated by the sub generator HFGfnMS is different from, such as greater than or lower than, a parameter level of the same RF signal during the state S0 and a parameter level of the same RF signal during the state S1. For example, the parameter level of the RF signal to be generated by the sub generator HFGfnMS during the state S2 is greater than or lower than the parameter level of the same RF signal during the state S1 by c % and the parameter level of the same RF signal during the state S1 is greater than or lower than the parameter level of the same RF signal during the state S0 by d %, where c ranges from and including 5% to 20% and d ranges from and including 5% to 20%. Similarly, during the state S2, a phase of the RF signal to be generated by the sub generator HFGfnMS is different from, such as greater than or lower than, a phase of the same RF signal during the state S1 by c % and during the state S1, the phase of the same RF signal is different from, such as greater than or lower than, a phase of the same RF signal during the state S0 by d %. Also, during the state S2, a frequency of the RF signal to be generated by the sub generator HFGfnMS is different from, such as greater than or lower than, a frequency of the same RF signal during the state S1 by c % and during the state S1, the frequency of the same RF signal is different from, such as greater than or lower than, a frequency of the same RF signal during the state S0 by d %.

It should further be noted that the more than two states occur during a clock cycle. For example, the three states S0, S1, and S2 occur within a time period between a time t2 and a time 0, illustrated below with reference to FIG. 3B. For example, each cycle of the digital pulse signal occurs during a corresponding cycle of a clock signal 350, described below with reference to FIG. 3B.

In some embodiments, the controllers PRf0S1, ϕf0S1, FCf0S1, PRf0S0, ϕf0S0, FCf0S0, PRf(n−1)S1, ϕf(n−1)S1, FCf(n−1)S1, PRf(n−1)S0, ϕf(n−1)S0, FCf(n−1)S0, PRfnS1, ϕfnS1, FCfnS1, PRfnS0, ϕfnS0, and FCfnS0, and the digital signal processor DSP of the sub generator HFGf0MS are integrated into a single controller. For example, functions described herein as being performed by the controllers PRf0S1, ϕf0S1, FCf0S1, PRf0S0, ϕf0S0, FCf0S0, PRf(n−1)S1, ϕf(n−1)S1, FCf(n−1)S1, PRf(n−1)S0, ϕf(n−1)S0, FCf(n−1)S0, PRfnS1, ϕfnS1, FCfnS1, PRfnS0, ϕfnS0, and FCfnS0, and the digital signal processor DSP of the sub generator HFGf0MS are instead performed by a processor of the single controller. The single controller is coupled to the driver system of the sub generator HFGf0MS, the driver system of the sub generator HFGf(n−1)MS, and the driver system of the sub generator HFGfnMS. The single controller includes the processor and a memory device, and the processor is coupled to the memory device. The functions described herein as being performed by the controllers PRf0S1, ϕf0S1, FCf0S1, PRf0S0, ϕf0S0, FCf0S0, PRf(n−1)S1, ϕf(n−1)S1, FCf(n−1)S1, PRf(n−1)S0, ϕf(n−1)S0, FCf(n−1)S0, PRfnS1, ϕfnS1, and FCfnS1, PRfnS0, ϕfnS0, and FCfnS0, and the digital signal processor DSP of the sub generator HFGf0MS are computer modules or computer programs that are executed by the processor of the single controller.

In various embodiments, the single controller, which performs the functions described herein as being performed by the controllers PRf0S1, ϕf0S1, FCf0S1, PRf0S0, ϕf0S0, FCf0S0, PRf(n−1)S1, ϕf(n−1)S1, FCf(n−1)S1, PRf(n−1)S0, ϕf(n−1)S0, FCf(n−1)S0, PRfnS1, ϕfnS1, and FCfnS1, PRfnS0, ϕfnS0, and FCfnS0, and the digital signal processor DSP of the sub generator HFGf0MS, is a part of the host computer. For example, the processor of the single controller is the same as the processor of the host computer system and the memory device of the single controller is the same as the memory device of the host computer. In some embodiments, the single controller, which performs the functions described herein as being performed by the controllers PRf0S1, ϕf0S1, FCf0S1, PRf0S0, ϕf0S0, FCf0S0, PRf(n−1)S1, ϕf(n−1)S1, FCf(n−1)S1, PRf(n−1)S0, ϕf(n−1)S0, FCf(n−1)S0, PRfnS1, ϕfnS1, and FCfnS1, PRfnS0, ϕfnS0, and FCfnS0, and the digital signal processor DSP of the sub generator HFGf0MS, is located within the RF generator HFGMS and is coupled to the processor of the host computer.

In some embodiments, the functions described herein as being performed by the parameter controllers PRS1 and PRS0 and the frequency controllers FCS1 and FCS0 of the low frequency RF generator LFGMS are performed by the digital signal processor DSP of the low frequency RF generator LFGMS. In these embodiments, the digital signal processor of the low frequency RF generator LFGMS is coupled to the driver system of the low frequency RF generator LFGMS.

Moreover, in various embodiments, the functions described herein as being performed by the controllers PRS1, PRS0, FCS1, and FCS0 of the low frequency RF generator LFGCW and the digital signal processor DSP of the low frequency RF generator LFGMS are performed by the processor of the host computer system. In these embodiments, the processor of the host computer system is coupled to the driver system of the low frequency RF generator LFGMS.

Figure 3B:
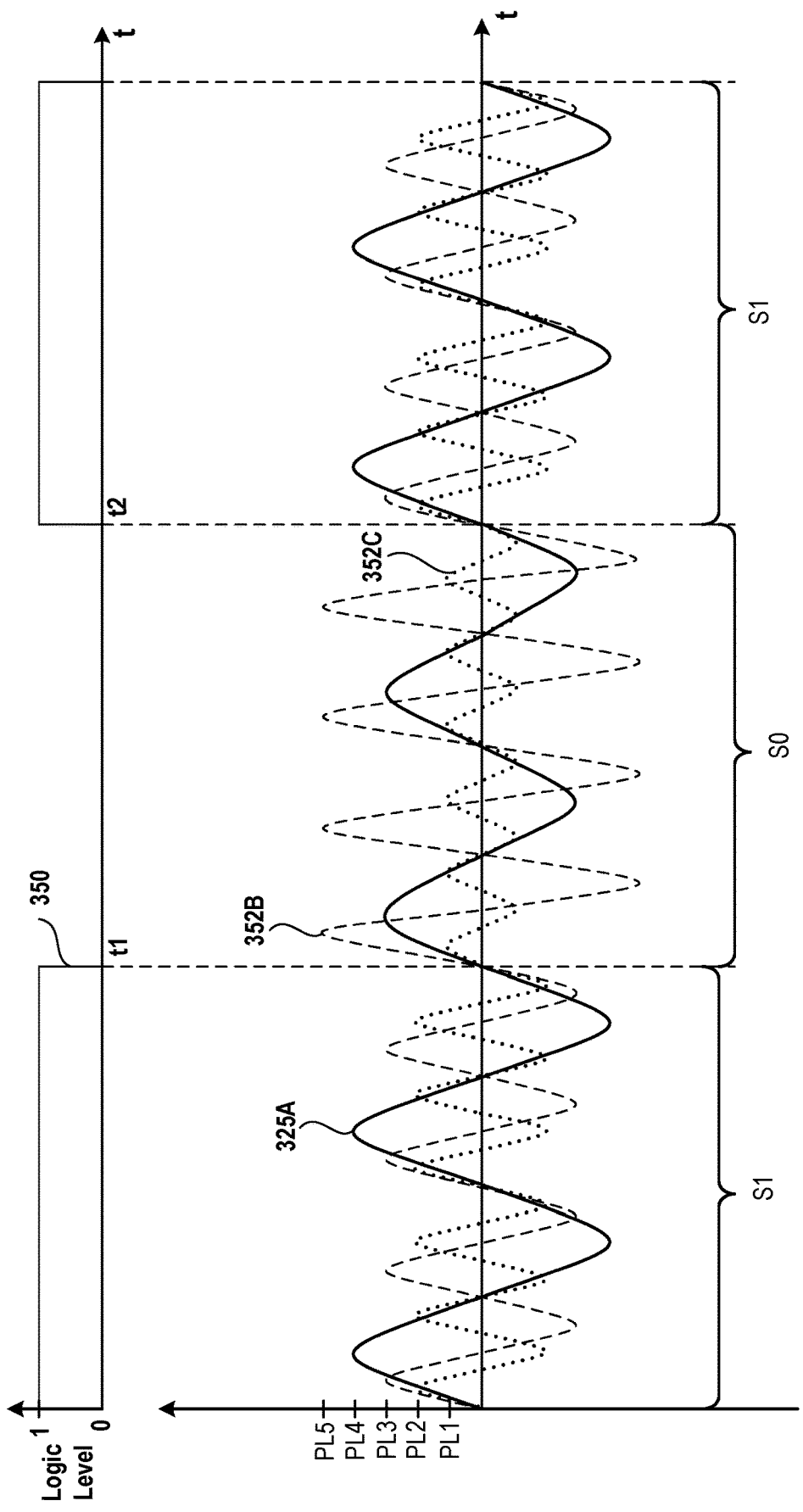
FIG. 3B shows embodiments of multiple multi-state RF signals that alternate between parameter levels in synchronization with multiple states of a clock signal.

FIG. 3B shows embodiments of multiple RF signals 352A, 352B, and 352C, which are multi-state signals that alternate between parameter levels in synchronization with the states S1 and S0 of the clock signal 350, which is an example of the clock signal described above. The RF signal 352A is an example of the RF signal 308A of FIG. 3A, the RF signal 352B is an example of the RF signal 308B of FIG. 3A, and the RF signal 352C is an example of the RF signal through 8C of FIG. 3A.

The RF signal 352A has a parameter level PL4 during the state S1 of the clock signal 350, the RF signal 352B has the parameter level PL3 during the state S1, and the RF signal 352C has the parameter level PL2 during the state S1. Moreover, the RF signal 352A has the parameter level PL3 during the state S0 of the clock signal 350, the RF signal 352B has a parameter level PL5 during the state S0, and the RF signal 352C has the parameter level PL1 during the state S0.

The RF signal 352A transitions between the parameter levels PL4 and PL3 in synchronization with the clock signal 350. For example, the RF signal 352A transitions from the parameter level PL4 to the parameter level PL3 at substantially the same time, for example, at a time t1 or within a predetermined time period from the time t1, at which the clock signal 350 transitions from the logic level 1 to the logic level 0. The RF signal 352A transitions from the parameter level PL3 to the parameter level PL4 at substantially the same time, for example, at the time t2 or within a predetermined time period from the time t2, at which the clock signal 350 transitions from the logic level 0 to the logic level 1.

Similarly, the RF signal 352B transitions between the parameter levels PL3 and PL5 in synchronization with the clock signal 350. For example, the RF signal 352B transitions from the parameter level PL3 to the parameter level PL5 at substantially the same time t1 at which the clock signal 350 transitions from the logic level 1 to the logic level 0. The RF signal 352B transitions from the parameter level PL5 to the parameter level PL3 at substantially the same time t2 at which the clock signal 350 transitions from the logic level 0 to the logic level 1.

Moreover, the RF signal 352C transitions between the parameter levels PL2 and PL1 in synchronization with the clock signal 350. For example, the RF signal 352C transitions from the parameter level PL2 to the parameter level PL1 at substantially the same time t1 at which the clock signal 350 transitions from the logic level 1 to the logic level 0. The RF signal 352C transitions from the parameter level PL1 to the parameter level PL2 at substantially the same time t2 at which the clock signal 350 transitions from the logic level 0 to the logic level 1.

It should be noted that in some embodiments, a parameter level of the RF signal 352A is greater during the state S0 of the clock signal 350 then a parameter level of the RF signal 352A during the state S1 of the clock signal 350. Moreover, in various embodiments, a parameter level of the RF signal 352B during the state S0 of the clock signal 350 is less than a parameter level of the RF signal 352B during the state S1 of the clock signal 350. Also, in some embodiments, a parameter level of the RF signal 352C during the state S0 the clock signal 350 is greater than the parameter level of the RF signal 352C during the state S1 of the clock signal 350.

In various embodiments, an RF signal has a different frequency during the state S0 than a frequency of the RF signal during the state S1. For example, the RF signal 352A has a first frequency during the state S0 and a second frequency during the state S1. The RF signal 352A periodically transitions between an occurrence of the first frequency and an occurrence of the second frequency. The first frequency is different than the second frequency. For example, the first frequency is greater than or lower than the second frequency by a pre-determined amount. To illustrate, the first frequency is greater than or lower than the second frequency by a %, where a ranges from and including 5% to 20%. Similarly, the RF signal 352B has a third frequency during the state S0 and a fourth frequency during the state S1 and the third frequency is greater than or lower than the fourth frequency by a %. The RF signal 352B periodically transitions between an occurrence of the third frequency and an occurrence of the fourth frequency. Also, the RF signal 352C has a fifth frequency during the state S0 and a sixth frequency during the state S1 and the fifth frequency is greater than or lower than the sixth frequency by a %. The RF signal 352C periodically transitions between an occurrence of the fifth frequency and an occurrence of the sixth frequency.

Figure 4:
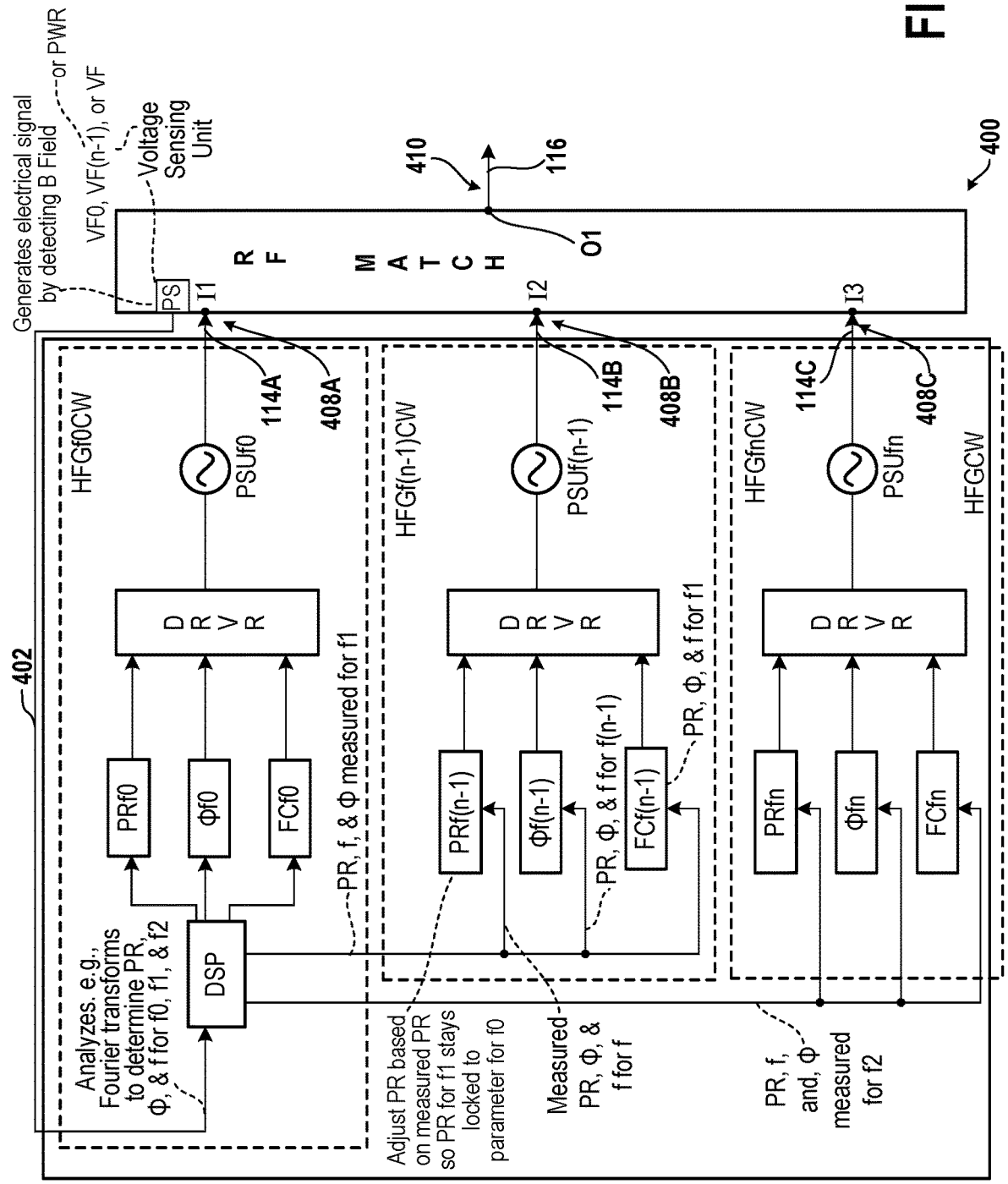
FIG. 4 is a diagram of an embodiment of a system to illustrate control of a parameter level, a phase, and a fundamental frequency of a continuous wave RF signal, a parameter level, a phase, and a fundamental frequency of another continuous wave RF signal, and a parameter level, a phase, and a fundamental frequency of yet another continuous wave RF signal.

FIG. 4 is a diagram of an embodiment of a system 400 to illustrate control of the parameter level, the phase, and the fundamental frequency of the RF signal 208A, the parameter level, the phase, and the fundamental frequency of the RF signal 208B, and the parameter level, the phase, and the fundamental frequency of the RF signal 208C. The system 400 includes the high frequency RF generator HFGCW and the RF match. The RF match further includes a parameter sensing unit PS, such as a power sensing unit or a voltage sensing unit. An example of the parameter sensing unit includes a complex current and voltage sensor or a complex voltage sensor. The complex current and voltage sensor measures a current magnitude, a voltage magnitude, and a phase between the current and voltage magnitudes. The voltage sensor measures a complex voltage, which includes the voltage magnitude and a phase. The parameter sensing unit is located within the RF match.

Moreover, the parameter controller PRf(n−1), the phase controller φf(n−1), and the frequency controller FCf(n−1) of the sub generator HFGf(n−1)CW are coupled to the digital signal processor of the sub generator HFGf0CW. Also, the parameter controller PRfn, the phase controller φfn, and the frequency controller FCfn of the sub generator HFGfnCW are coupled to the digital signal processor of the sub generator HFGf0CW.

The parameter sensing unit is coupled to the digital signal processor of the sub generator HFGf0CW via a cable 402, such as a conductor. The parameter sensing unit senses a magnetic field B that is generated by the RF signals 208A, 208B, and 208C of FIG. 2 to generate an electrical signal. The electrical signal generated by the parameter sensing unit is transferred via the cable 402 to the digital signal processor of the sub generator HFGf0CW. The digital signal processor of the sub generator HFGf0CW analyzes the electrical signal by applying Fourier transform to data within the electrical signal to identify a fundamental frequency of the RF signal 208A measured by the parameter sensing unit, a phase at the fundamental frequency of the RF signal 208A measured by the parameter sensing unit, a parameter level at the fundamental frequency of the RF signal 208A measured by the parameter sensing unit, an (n−1)th harmonic frequency of the RF signal 208B measured by the parameter sensing unit, a phase at the (n−1)th harmonic frequency of the RF signal 208B measured by the parameter sensing unit, a parameter level (n−1)th harmonic frequency of the RF signal 208B measured by the parameter sensing unit, an nth harmonic frequency of the RF signal 208C measured by the parameter sensing unit, a phase at the nth harmonic frequency of the RF signal 208C measured by the parameter sensing unit, and a parameter level nth harmonic frequency of the RF signal 208C measured by the parameter sensing unit.

The digital signal processor of the sub generator HFGf0CW determines whether the measured (n−1)th harmonic frequency of the RF signal 208B is locked with the measured fundamental frequency of the RF signal 208A. For example, the digital signal processor of the sub generator HFGf0CW determines whether a measured frequency difference between the measured (n−1)th harmonic frequency of the RF signal 208B and the measured fundamental frequency of the RF signal 208A is substantially the same as, such as equal to or within a pre-determined range from, the pre-determined frequency difference between the (n−1)th harmonic frequency of the RF signal 208B and the fundamental frequency of the RF signal 208A. The measured frequency difference between the measured (n−1)th harmonic frequency of the RF signal 208B and the measured fundamental frequency of the RF signal 208A is calculated by the digital signal processor of the sub generator HFGf0CW and sent to the frequency controllers FCf0 and FCf(n−1).

Upon determining that the measured frequency difference is not substantially the same as the pre-determined frequency difference between the (n−1)th harmonic frequency of the RF signal 208B and the fundamental frequency of the RF signal 208A, the digital signal processor controls the frequency controller FCf0 or FCf(n−1) or both the frequency controllers FCf0 and FCf(n−1) until the measured frequency difference is substantially the same as the pre-determined frequency difference. For example, the digital signal processor sends a signal to the frequency controller FCf0 or sends a signal to the frequency controller FCf(n−1) or sends the signals to both the frequency controllers FCf0 and FCf(n−1). Upon receiving the signal from the digital signal processor, the frequency controller FCf0 modifies the fundamental frequency f0 to change the fundamental frequency of the RF signal 208A until the measured frequency difference is substantially the same as the pre-determined frequency difference. Similarly, upon receiving the signal from the digital signal processor, the frequency controller FCf(n−1) modifies the (n−1)th harmonic frequency of the RF signal 208B until the measured frequency difference is substantially the same as the pre-determined frequency difference.

In a similar manner, the digital signal processor of the sub generator HFGf0CW determines whether the measured nth harmonic frequency of the RF signal 208C is locked with the measured fundamental frequency of the RF signal 208A. For example, the digital signal processor of the sub generator HFGf0CW determines whether a measured frequency difference between the measured nth harmonic frequency of the RF signal 208C and the measured fundamental frequency of the RF signal 208A is substantially the same as, such as equal to or within a pre-determined range from, the pre-determined frequency difference between the nth harmonic frequency of the RF signal 208C and the fundamental frequency of the RF signal 208A. The measured frequency difference between the measured nth harmonic frequency of the RF signal 208C and the measured fundamental frequency of the RF signal 208A is calculated by the digital signal processor of the sub generator HFGf0CW and sent to the frequency controllers FCf0 and FCfn.

Upon determining that the measured frequency difference is not substantially the same as the pre-determined frequency difference between the nth harmonic frequency of the RF signal 208C and the fundamental frequency of the RF signal 208A, the digital signal processor controls the frequency controller FCf0 or FCfn or both the frequency controllers FCf0 and FCfn until the measured frequency difference is substantially the same as the pre-determined frequency difference. For example, the digital signal processor sends a signal to the frequency controller FCf0 or sends a signal to the frequency controller FCfn or sends the signals to both the frequency controllers FCf0 and FCfn Upon receiving the signal from the digital signal processor, the frequency controller FCf0 modifies the fundamental frequency f0 to change the fundamental frequency of the RF signal 208A until the measured frequency difference is substantially the same as the pre-determined frequency difference. Similarly, upon receiving the signal from the digital signal processor, the frequency controller FCfn modifies the nth harmonic frequency of the RF signal 208C until the measured frequency difference is substantially the same as the pre-determined frequency difference.

Moreover, the digital signal processor of the sub generator HFGf0CW determines whether the measured phase at the (n−1)th harmonic frequency of the RF signal 208B is locked with the measured phase at the fundamental frequency of the RF signal 208A. For example, the digital signal processor of the sub generator HFGf0CW determines whether a measured phase difference between the measured phase at the (n−1)th harmonic frequency of the RF signal 208B and the measured phase at the fundamental frequency of the RF signal 208A is substantially the same as, such as equal to or within a pre-determined range from, the pre-determined phase difference between the phase at the (n−1)th harmonic frequency of the RF signal 208B and the phase at the fundamental frequency of the RF signal 208A. The measured phase difference between the measured phase at the (n−1)th harmonic frequency of the RF signal 208B and the measured phase at the fundamental frequency of the RF signal 208A is calculated by the digital signal processor of the sub generator HFGf0CW and sent to the phase controllers $\phi f0$ and $\phi f(n-1)$.

Upon determining that the measured phase difference is not substantially the same as the pre-determined phase difference between the phase at the (n−1)th harmonic frequency of the RF signal 208B and the phase at the fundamental frequency of the RF signal 208A, the digital signal processor controls the phase controller $\phi f0$ or $\phi f(n-1)$ or both the phase controllers $\phi f0$ and $\phi f(n-1)$ until the measured phase difference is substantially the same as the pre-determined phase difference. For example, the digital signal processor sends a signal to the phase controller $\phi f0$ or sends a signal to the phase controller $\phi f(n-1)$ or sends the signals to both the phase controllers $\phi f0$ and $\phi f(n-1)$. Upon receiving the signal from the digital signal processor, the phase controller $\phi f0$ modifies the phase at the fundamental frequency f0 to change the phase at the fundamental frequency f0 of the RF signal 208A until the measured phase difference is substantially the same as the pre-determined phase difference. Similarly, upon receiving the signal from the digital signal processor, the phase controller $\phi f(n-1)$ modifies the phase at the (n−1)th harmonic frequency of the RF signal 208B until the measured phase difference is substantially the same as the pre-determined phase difference.

In a similar manner, the digital signal processor of the sub generator HFGf0CW determines whether the measured phase at the nth harmonic frequency of the RF signal 208C is locked with the measured phase at the fundamental frequency of the RF signal 208A. For example, the digital signal processor of the sub generator HFGf0CW determines whether a measured phase difference between the measured phase at the nth harmonic frequency of the RF signal 208C and the measured phase at the fundamental frequency of the RF signal 208A is substantially the same as, such as equal to or within a pre-determined range from, the pre-determined phase difference between the phase at the nth harmonic frequency of the RF signal 208C and the phase at the fundamental frequency of the RF signal 208A. The measured phase difference between the measured phase at the nth harmonic frequency of the RF signal 208C and the measured phase at the fundamental frequency of the RF signal 208A is calculated by the digital signal processor of the sub generator HFGf0CW and sent to the phase controllers φf0 and φfn.

Upon determining that the measured phase difference is not substantially the same as the pre-determined phase difference between the phase at the nth harmonic frequency of the RF signal 208C and the phase at the fundamental frequency of the RF signal 208A, the digital signal processor controls the phase controller φf0 or φfn or both the phase controllers φf0 and φfn until the measured phase difference is substantially the same as the pre-determined phase difference. For example, the digital signal processor sends a signal to the phase controller φf0 or sends a signal to the phase controller φfn or sends the signals to both the phase controllers φf0 and φfn. Upon receiving the signal from the digital signal processor, the phase controller φf0 modifies the phase at the fundamental frequency f0 to change the phase at the fundamental frequency f0 of the RF signal 208A until the measured phase difference is substantially the same as the pre-determined phase difference. Similarly, upon receiving the signal from the digital signal processor, the phase controller φfn modifies the phase at the nth harmonic frequency of the RF signal 208C until the measured phase difference is substantially the same as the pre-determined phase difference.

Furthermore, the digital signal processor of the sub generator HFGf0CW determines whether the measured parameter level at the (n−1)th harmonic frequency of the RF signal 208B is locked with the measured parameter level at the fundamental frequency of the RF signal 208A. For example, the digital signal processor of the sub generator HFGf0CW determines whether a measured parameter level difference between the measured parameter level at the (n−1)th harmonic frequency of the RF signal 208B and the measured parameter level at the fundamental frequency of the RF signal 208A is substantially the same as, such as equal to or within a pre-determined range from, the pre-determined parameter level difference between the parameter level at the (n−1)th harmonic frequency of the RF signal 208B and the parameter level at the fundamental frequency of the RF signal 208A. The measured parameter level difference between the measured parameter level at the (n−1)th harmonic frequency of the RF signal 208B and the measured parameter level at the fundamental frequency of the RF signal 208A is calculated by the digital signal processor of the sub generator HFGf0CW and sent to the parameter level controllers PRf0 and PRf(n−1).

Upon determining that the measured parameter level difference is not substantially the same as the pre-determined parameter level difference between the parameter level at the (n−1)th harmonic frequency of the RF signal 208B and the parameter level at the fundamental frequency of the RF signal 208A, the digital signal processor controls the parameter level controller PRf0 or PRf(n−1) or both the parameter level controllers PRf0 and PRf(n−1) until the measured parameter level difference is substantially the same as the pre-determined parameter level difference. For example, the digital signal processor sends a signal to the parameter level controller PRf0 or sends a signal to the parameter level controller PRf(n−1) or sends the signals to both the parameter level controllers PRf0 and PRf(n−1). Upon receiving the signal from the digital signal processor, the parameter level controller PRf0 modifies the parameter level at the fundamental frequency f0 to change the parameter level at the fundamental frequency f0 of the RF signal 208A until the measured parameter level difference is substantially the same as the pre-determined parameter level difference. Similarly, upon receiving the signal from the digital signal processor, the parameter level controller PRf(n−1) modifies the parameter level at the (n−1)th harmonic frequency of the RF signal 208B until the measured parameter level difference is substantially the same as the pre-determined parameter level difference.

Similarly, the digital signal processor of the sub generator HFGf0CW determines whether the measured parameter level at the nth harmonic frequency of the RF signal 208C is locked with the measured parameter level at the fundamental frequency of the RF signal 208A. For example, the digital signal processor of the sub generator HFGf0CW determines whether a measured parameter level difference between the measured parameter level at the nth harmonic frequency of the RF signal 208C and the measured parameter level at the fundamental frequency of the RF signal 208A is substantially the same as, such as equal to or within a pre-determined range from, the pre-determined parameter level difference between the parameter level at the (n−1)th harmonic frequency of the RF signal 208C and the parameter level at the fundamental frequency of the RF signal 208A. The measured parameter level difference between the measured parameter level at the nth harmonic frequency of the RF signal 208C and the measured parameter level at the fundamental frequency of the RF signal 208A is calculated by the digital signal processor of the sub generator HFGf0CW and sent to the parameter level controllers PRf0 and PRfn.

Upon determining that the measured parameter level difference is not substantially the same as the pre-determined parameter level difference between the parameter level at the nth harmonic frequency of the RF signal 208C and the parameter level at the fundamental frequency of the RF signal 208A, the digital signal processor controls the parameter level controller PRf0 or PRfn or both the parameter level controllers PRf0 and PRfn until the measured parameter level difference is substantially the same as the pre-determined parameter level difference. For example, the digital signal processor sends a signal to the parameter level controller PRf0 or sends a signal to the parameter level controller PRfn or sends the signals to both the parameter level controllers PRf0 and PRfn. Upon receiving the signal from the digital signal processor, the parameter level controller PRf0 modifies the parameter level at the fundamental frequency f0 to change the parameter level at the fundamental frequency f0 of the RF signal 208A until the measured parameter level difference is substantially the same as the pre-determined parameter level difference. Similarly, upon receiving the signal from the digital signal processor, the parameter level controller PRfn modifies the parameter level at the nth harmonic frequency of the RF signal 208C until the measured parameter level difference is substantially the same as the pre-determined parameter level difference.

The power supply PSUf0 generates an RF signal 408A with the modified fundamental frequency, or the modified phase at the fundamental frequency, or the modified parameter level at the fundamental frequency, or a combination thereof, and supplies the RF signal 408A via the RF cable 114A to the input I1 of the RF match. Moreover, the power supply PSUf(n−1) generates an RF signal 408B with the modified (n−1)th harmonic frequency, or the modified phase at the (n−1)th harmonic frequency, or the modified parameter level at the (n−1)th harmonic frequency, or a combination thereof, and supplies the RF signal 408B via the RF cable 114B to the input I2 of the RF match. Also, the power supply PSUfn generates an RF signal 408C with the modified nth harmonic frequency, or the modified phase at the nth harmonic frequency, or the modified parameter level at the nth harmonic frequency, or a combination thereof, and supplies the RF signal 408C via the RF cable 114C to the input I3 of the RF match.

The RF match upon receiving the RF signals 408A through 408C and the RF signal 218 from the low frequency RF generator LFGCW of FIG. 2A matches an impedance of the load coupled to the output O1 with that of the source coupled to the inputs I1 through I4 to generate modified RF signals and combines, such as adds, the modified RF signals to generate a modified RF signal 410. The RF match supplies the modified RF signal 410 via the RF transmission line 116 to the chuck 212 (FIG. 2A) of the plasma chamber. When the modified RF signal 410 is supplied to the plasma chamber, RF harmonics of the plasma sheath within the plasma chamber are controlled to achieve radial etch uniformity.

Figure 5:
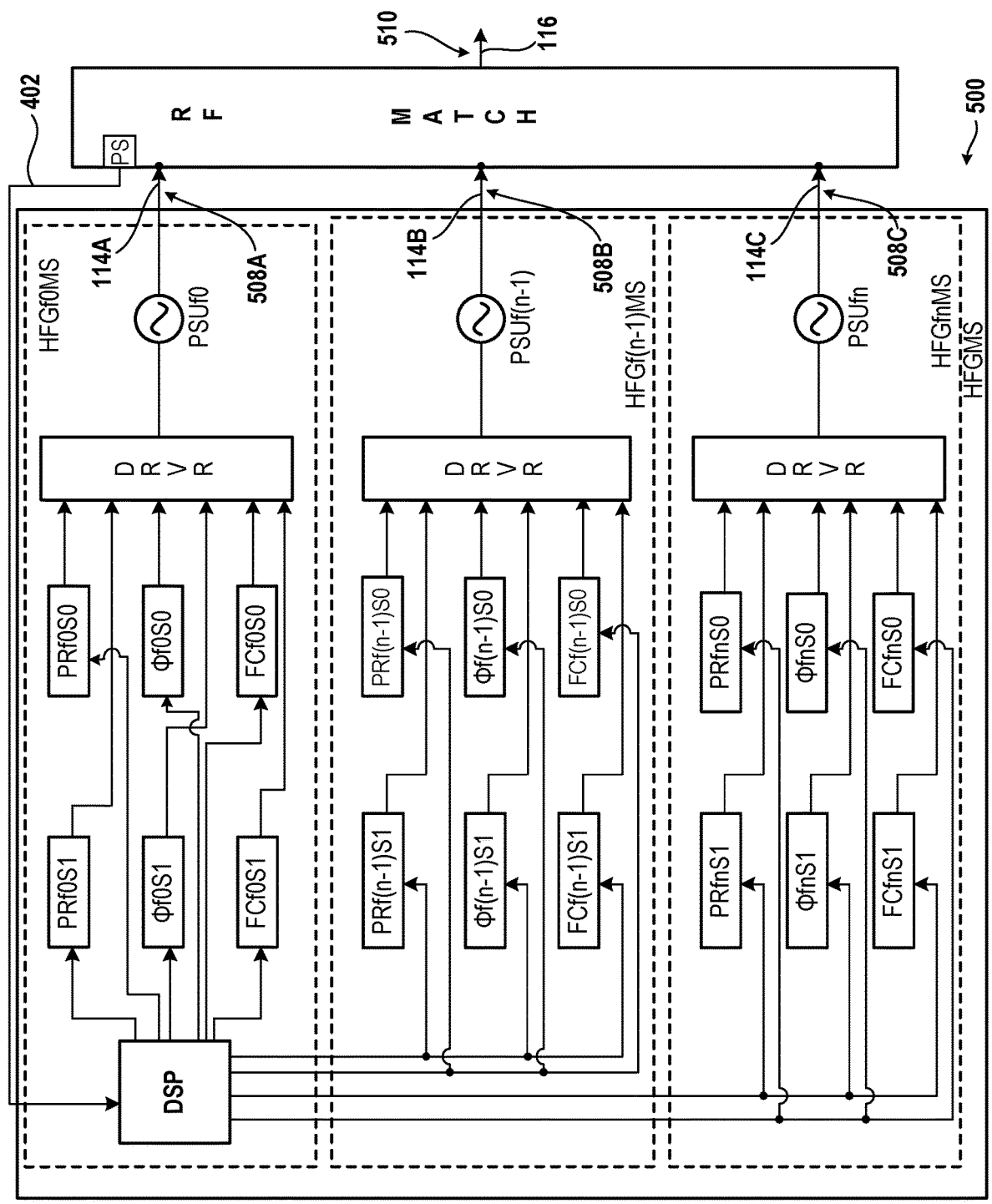
FIG. 5 is a diagram of an embodiment of a system to illustrate to illustrate control of a parameter level, a phase, and a fundamental frequency of a multi-state RF signal, a parameter level, a phase, and a fundamental frequency of another multi-state RF signal, and a parameter level, a phase, and a fundamental frequency of yet another multi-state RF signal.

FIG. 5 is a diagram of an embodiment of a system 500 to illustrate to illustrate control of the parameter level, the phase, and the fundamental frequency of the RF signal 308A of FIG. 3A, the parameter level, the phase, and the fundamental frequency of the RF signal 308B of FIG. 3A, and the parameter level, the phase, and the fundamental frequency of the RF signal 308C of FIG. 3A. The system 500 includes the high frequency RF generator HFGMS and the RF match. The parameter controller PRf(n−1)S1, the phase controller ϕf(n−1)S1, and the frequency controller FCf(n−1)S1 of the sub generator HFGf(n−1)MS are coupled to the digital signal processor of the sub generator HFGf0MS. Also, the parameter controller PRfnS1, the phase controller ϕfnS1, and the frequency controller FCfnS1 of the sub generator HFGfnMS are coupled to the digital signal processor of the sub generator HFGf0MS.

Similarly, the parameter controller PRf(n−1)S0, the phase controller ϕf(n−1)S0, and the frequency controller FCf(n−1)S0 of the sub generator HFGf(n−1)MS are coupled to the digital signal processor of the sub generator HFGf0MS. Also, the parameter controller PRfnS0, the phase controller ϕfnS0, and the frequency controller FCfnS0 of the sub generator HFGfnMS are coupled to the digital signal processor of the sub generator HFGf0MS.

The parameter sensing unit is coupled to the digital signal processor of the sub generator HFGf0MS via the cable 402. The parameter sensing unit senses a magnetic field B that is generated by the RF signals 308A, 308B, and 308C of FIG. 3A to generate an electrical signal. The electrical signal generated by the parameter sensing unit is transferred via the cable 402 to the digital signal processor of the sub generator HFGf0MS. The digital signal processor of the sub generator HFGf0MS analyzes the electrical signal by applying the Fourier transform to data within the electrical signal to identify a fundamental frequency for the state S1 of the RF signal 308A measured by the parameter sensing unit, a phase at the fundamental frequency for the state S1 of the RF signal 308A measured by the parameter sensing unit, a parameter level at the fundamental frequency for the state S1 of the RF signal 308A measured by the parameter sensing unit, a fundamental frequency for the state S0 of the RF signal 308A measured by the parameter sensing unit, a phase at the fundamental frequency for the state S0 of the RF signal 308A measured by the parameter sensing unit, a parameter level at the fundamental frequency for the state S0 of the RF signal 308A measured by the parameter sensing unit.

The digital signal processor of the sub generator HFGf0MS further analyzes the electrical signal by applying the Fourier transform to the data within the electrical signal to identify an (n−1)th harmonic frequency for the state S1 of the RF signal 308B measured by the parameter sensing unit, a phase at the (n−1)th harmonic frequency for the state S1 of the RF signal 308B measured by the parameter sensing unit, a parameter level at the (n−1)th harmonic frequency for the state S1 of the RF signal 308B measured by the parameter sensing unit, an (n−1)th harmonic frequency for the state S0 of the RF signal 308B measured by the parameter sensing unit, a phase at the (n−1)th harmonic frequency for the state S0 of the RF signal 308B measured by the parameter sensing unit, and a parameter level at the (n−1)th harmonic frequency for the state S0 of the RF signal 308B measured by the parameter sensing unit.

The digital signal processor of the sub generator HFGf0MS also analyzes the electrical signal by applying the Fourier transform to the data within the electrical signal to identify an nth harmonic frequency for the state S1 of the RF signal 308C measured by the parameter sensing unit, a phase at the nth harmonic frequency for the state S1 of the RF signal 308C measured by the parameter sensing unit, a parameter level at the nth harmonic frequency for the state S1 of the RF signal 308C measured by the parameter sensing unit, an nth harmonic frequency for the state S0 of the RF signal 308C measured by the parameter sensing unit, a phase at the nth harmonic frequency for the state S0 of the RF signal 308C measured by the parameter sensing unit, and a parameter level at the nth harmonic frequency for the state S0 of the RF signal 308C measured by the parameter sensing unit.

The digital signal processor of the sub generator HFGf0MS determines whether the measured (n−1)th harmonic frequency for the state S1 of the RF signal 308B is locked with the measured fundamental frequency for the state S1 of the RF signal 308A. For example, the digital signal processor of the sub generator HFGf0MS determines whether a measured frequency difference between the measured (n−1)th harmonic frequency for the state S1 of the RF signal 308B and the measured fundamental frequency for the state S1 of the RF signal 308A is substantially the same as, such as equal to or within a pre-determined range from, the pre-determined frequency difference between the (n−1)th harmonic frequency for the state S1 of the RF signal 308B and the fundamental frequency for the state S1 of the RF signal 308A. The measured frequency difference between the measured (n−1)th harmonic frequency for the state S1 of the RF signal 308B and the measured fundamental frequency for the state S1 of the RF signal 308A is calculated by the digital signal processor of the sub generator HFGf0MS and sent to the frequency controllers FCf0S1 and FCf(n−1)S1.

Upon determining that the measured frequency difference for the state S1 of the RF signal 308B is not substantially the same as the pre-determined frequency difference between the (n−1)th harmonic frequency for the state S1 of the RF signal 308B and the fundamental frequency for the state S1 of the RF signal 308A, the digital signal processor controls the frequency controller FCf0S1 or FCf(n−1)S1 or both the frequency controllers FCf0S1 and FCf(n−1)S1 until the measured frequency difference for the state S1 of the RF signal 308B is substantially the same as the pre-determined frequency difference for the state S1 of the RF signal 308B. For example, the digital signal processor sends a signal to the frequency controller FCf0S1 or sends a signal to the frequency controller FCf(n−1)S1 or sends the signals to both the frequency controllers FCf0S1 and FCf(n−1)S1. Upon receiving the signal from the digital signal processor, the frequency controller FCf0S1 modifies the fundamental frequency for the state S1 of the RF signal 308A until the measured frequency difference for the state S1 of the RF signal 308B is substantially the same as the pre-determined frequency difference for the state S1 of the RF signal 308B. Similarly, upon receiving the signal from the digital signal processor, the frequency controller FCf(n−1)S1 modifies the (n−1)th harmonic frequency for the state S1 of the RF signal 308B until the measured frequency difference for the state S1 of the RF signal 308B is substantially the same as the pre-determined frequency difference for the state S1 of the RF signal 308B.

The digital signal processor of the sub generator HFGf0MS also determines whether the measured (n−1)th harmonic frequency for the state S0 of the RF signal 308B is locked with the measured fundamental frequency for the state S0 of the RF signal 308A. For example, the digital signal processor of the sub generator HFGf0MS determines whether a measured frequency difference between the measured (n−1)th harmonic frequency for the state S0 of the RF signal 308B and the measured fundamental frequency for the state S0 of the RF signal 308A is substantially the same as, such as equal to or within a pre-determined range from, the pre-determined frequency difference between the (n−1)th harmonic frequency for the state S0 of the RF signal 308B and the fundamental frequency for the state S0 of the RF signal 308A. The measured frequency difference between the measured (n−1)th harmonic frequency for the state S0 of the RF signal 308B and the measured fundamental frequency for the state S0 of the RF signal 308A is calculated by the digital signal processor of the sub generator HFGf0MS and sent to the frequency controllers FCf0S0 and FCf(n−1)S0.

Upon determining that the measured frequency difference for the state S0 of the RF signal 308B is not substantially the same as the pre-determined frequency difference between the (n−1)th harmonic frequency for the state S0 of the RF signal 308B and the fundamental frequency for the state S0 of the RF signal 308A, the digital signal processor controls the frequency controller FCf0S0 or FCf(n−1)S0 or both the frequency controllers FCf0S0 and FCf(n−1)S0 until the measured frequency difference for the state S0 of the RF signal 308B is substantially the same as the pre-determined frequency difference for the state S0 of the RF signal 308B. For example, the digital signal processor sends a signal to the frequency controller FCf0S0 or sends a signal to the frequency controller FCf(n−1)S0 or sends the signals to both the frequency controllers FCf0S0 and FCf(n−1)S0. Upon receiving the signal from the digital signal processor, the frequency controller FCf0S0 modifies the fundamental frequency f0 for the state S0 of the RF signal 308A until the measured frequency difference for the state S0 of the RF signal 308B is substantially the same as the pre-determined frequency difference for the state S0 of the RF signal 308B. Similarly, upon receiving the signal from the digital signal processor, the frequency controller FCf(n−1)S0 modifies the (n−1)th harmonic frequency for the state S0 of the RF signal 308B until the measured frequency difference for the state S0 of the RF signal 308B is substantially the same as the pre-determined frequency difference for the state S0 of the RF signal 308B.

In a similar manner, the digital signal processor of the sub generator HFGf0MS determines whether the measured nth harmonic frequency for the state S1 of the RF signal 308C is locked with the measured fundamental frequency for the state S1 of the RF signal 308A. For example, the digital signal processor of the sub generator HFGf0MS determines whether a measured frequency difference between the measured nth harmonic frequency for the state S1 of the RF signal 308C and the measured fundamental frequency for the state S1 of the RF signal 308A is substantially the same as, such as equal to or within a pre-determined range from, the pre-determined frequency difference between the nth harmonic frequency for the state S1 of the RF signal 308C and the fundamental frequency for the state S1 of the RF signal 308A. The measured frequency difference between the measured nth harmonic frequency for the state S1 of the RF signal 308C and the measured fundamental frequency for the state S1 of the RF signal 308A is calculated by the digital signal processor of the sub generator HFGf0MS and sent to the frequency controllers FCf0S1 and FCfnS1.

Upon determining that the measured frequency difference for the state S1 of the RF signal 308C is not substantially the same as the pre-determined frequency difference between the nth harmonic frequency for the state S1 of the RF signal 308C and the fundamental frequency for the state S1 of the RF signal 308A, the digital signal processor controls the frequency controller FCf0S1 or FCfnS1 or both the frequency controllers FCf0S1 and FCfnS1 until the measured frequency difference for the state S1 of the RF signal 308C is substantially the same as the pre-determined frequency difference for the state S1 of the RF signal 308C. For example, the digital signal processor sends a signal to the frequency controller FCf0S1 or sends a signal to the frequency controller FCfnS1 or sends the signals to both the frequency controllers FCf0S1 and FCfnS1. Upon receiving the signal from the digital signal processor, the frequency controller FCf0S1 modifies the fundamental frequency for the state S1 of the RF signal 308A until the measured frequency difference for the state S1 of the RF signal 308C is substantially the same as the pre-determined frequency difference for the state S1 of the RF signal 308C. Similarly, upon receiving the signal from the digital signal processor, the frequency controller FCfnS1 modifies the nth harmonic frequency for the state S1 of the RF signal 308C until the measured frequency difference for the state S1 of the RF signal 308C is substantially the same as the pre-determined frequency difference for the state S1 of the RF signal 308C.

The digital signal processor of the sub generator HFGf0MS also determines whether the measured nth harmonic frequency for the state S0 of the RF signal 308C is locked with the measured fundamental frequency for the state S0 of the RF signal 308A. For example, the digital signal processor of the sub generator HFGf0MS determines whether a measured frequency difference between the measured nth harmonic frequency for the state S0 of the RF signal 308C and the measured fundamental frequency for the state S0 of the RF signal 308A is substantially the same as, such as equal to or within a pre-determined range from, the pre-determined frequency difference between the nth harmonic frequency for the state S0 of the RF signal 308C and the fundamental frequency for the state S0 of the RF signal 308A. The measured frequency difference between the measured nth harmonic frequency for the state S0 of the RF signal 308C and the measured fundamental frequency for the state S0 of the RF signal 308A is calculated by the digital signal processor of the sub generator HFGf0MS and sent to the frequency controllers FCf0S0 and FCfnS0.

Upon determining that the measured frequency difference for the state S0 of the RF signal 308C is not substantially the same as the pre-determined frequency difference between the nth harmonic frequency for the state S0 of the RF signal 308C and the fundamental frequency for the state S0 of the RF signal 308A, the digital signal processor controls the frequency controller FCf0S0 or FCfnS0 or both the frequency controllers FCf0S0 and FCfnS0 until the measured frequency difference for the state S0 of the RF signal 308C is substantially the same as the pre-determined frequency difference for the state S0 of the RF signal 308C. For example, the digital signal processor sends a signal to the frequency controller FCf0S0 or sends a signal to the frequency controller FCfnS0 or sends the signals to both the frequency controllers FCf0S0 and FCfnS0. Upon receiving the signal from the digital signal processor, the frequency controller FCf0S0 modifies the fundamental frequency f0 for the state S0 of the RF signal 308A until the measured frequency difference for the state S0 of the RF signal 308C is substantially the same as the pre-determined frequency difference for the state S0 of the RF signal 308C. Similarly, upon receiving the signal from the digital signal processor, the frequency controller FCfnS0 modifies the nth harmonic frequency for the state S0 of the RF signal 308C until the measured frequency difference for the state S0 of the RF signal 308C is substantially the same as the pre-determined frequency difference for the state S0 of the RF signal 308C.

Moreover, the digital signal processor of the sub generator HFGf0MS determines whether the measured phase at the (n−1)th harmonic frequency for the state S1 of the RF signal 308B is locked with the measured phase at the fundamental frequency for the state S1 of the RF signal 308A. For example, the digital signal processor of the sub generator HFGf0MS determines whether a measured phase difference between the measured phase at the (n−1)th harmonic frequency for the state S1 of the RF signal 308B and the measured phase at the fundamental frequency for the state S1 of the RF signal 308A is substantially the same as, such as equal to or within a pre-determined range from, the pre-determined phase difference between the phase at the (n−1)th harmonic frequency for the state S1 of the RF signal 308B and the phase at the fundamental frequency for the state S1 of the RF signal 308A. The measured phase difference between the measured phase at the (n−1)th harmonic frequency for the state S1 of the RF signal 308B and the measured phase at the fundamental frequency for the state S1 of the RF signal 308A is calculated by the digital signal processor of the sub generator HFGf0MS and sent to the phase controllers ϕf0S1 and ϕf(n−1)S1.

Upon determining that the measured phase difference for the state S1 of the RF signal 308B is not substantially the same as the pre-determined phase difference between the phase at the (n−1)th harmonic frequency for the state S1 of the RF signal 308B and the phase at the fundamental frequency for the state S1 of the RF signal 308A, the digital signal processor controls the phase controller ϕf0S1 or ϕf(n−1)S1 or both the phase controllers ϕf0S1 and ϕf(n−1)S1 until the measured phase difference for the state S1 of the RF signal 308B is substantially the same as the pre-determined phase difference for the state S1 of the RF signal 308B. For example, the digital signal processor sends a signal to the phase controller ϕf0S1 or sends a signal to the phase controller ϕf(n−1)S1 or sends the signals to both the phase controllers ϕf0S1 and ϕf(n−1)S1. Upon receiving the signal from the digital signal processor, the phase controller ϕf0S1 modifies the phase at the fundamental frequency f0 for the state S1 of the RF signal 308A until the measured phase difference for the state S1 of the RF signal 308B is substantially the same as the pre-determined phase difference for the state S1 of the RF signal 308B. Similarly, upon receiving the signal from the digital signal processor, the phase controller ϕf(n−1)S1 modifies the phase at the (n−1)th harmonic frequency for the state S1 of the RF signal 308B until the measured phase difference for the state S1 of the RF signal 308B is substantially the same as the pre-determined phase difference for the state S1 of the RF signal 308B.

In a similar manner, the digital signal processor of the sub generator HFGf0MS determines whether the measured phase at the (n−1)th harmonic frequency for the state S0 of the RF signal 308B is locked with the measured phase at the fundamental frequency for the state S0 of the RF signal 308A. For example, the digital signal processor of the sub generator HFGf0MS determines whether a measured phase difference between the measured phase at the (n−1)th harmonic frequency for the state S0 of the RF signal 308B and the measured phase at the fundamental frequency for the state S0 of the RF signal 308A is substantially the same as, such as equal to or within a pre-determined range from, the pre-determined phase difference between the phase at the (n−1)th harmonic frequency for the state S0 of the RF signal 308B and the phase at the fundamental frequency for the state S0 of the RF signal 308A. The measured phase difference between the measured phase at the (n−1)th harmonic frequency for the state S0 of the RF signal 308B and the measured phase at the fundamental frequency for the state S0 of the RF signal 308A is calculated by the digital signal processor of the sub generator HFGf0MS and sent to the phase controllers ϕf0S0 and ϕf(n−1)S0.

Upon determining that the measured phase difference for the state S0 of the RF signal 308B is not substantially the same as the pre-determined phase difference between the phase at the (n−1)th harmonic frequency for the state S0 of the RF signal 308B and the phase at the fundamental frequency for the state S0 of the RF signal 308A, the digital signal processor controls the phase controller ϕf0S0 or ϕf(n−1)S0 or both the phase controllers ϕf0S0 and ϕf(n−1)S0 until the measured phase difference for the state S0 of the RF signal 308B is substantially the same as the pre-determined phase difference for the state S0 of the RF signal 308B. For example, the digital signal processor sends a signal to the phase controller ϕf0S0 or sends a signal to the phase controller ϕf(n−1)S0 or sends the signals to both the phase controllers ϕf0S0 and ϕf(n−1)S0. Upon receiving the signal from the digital signal processor, the phase controller ϕf0S0 modifies the phase at the fundamental frequency f0 for the state S0 of the RF signal 308A until the measured phase difference for the state S0 of the RF signal 308B is substantially the same as the pre-determined phase difference for the state S0 of the RF signal 308B. Similarly, upon receiving the signal from the digital signal processor, the phase controller ϕf(n−1)S0 modifies the phase at the (n−1)th harmonic frequency for the state S0 of the RF signal 308B until the measured phase difference for the state S0 of the RF signal 308B is substantially the same as the pre-determined phase difference for the state S0 of the RF signal 308B.

In a similar manner, the digital signal processor of the sub generator HFGf0MS determines whether the measured phase at the nth harmonic frequency for the state S1 of the RF signal 308C is locked with the measured phase at the fundamental frequency for the state S1 of the RF signal 308A. For example, the digital signal processor of the sub generator HFGf0MS determines whether a measured phase difference between the measured phase at the nth harmonic frequency for the state S1 of the RF signal 308C and the measured phase at the fundamental frequency for the state S1 of the RF signal 308A is substantially the same as, such as equal to or within a pre-determined range from, the pre-determined phase difference between the phase at the nth harmonic frequency for the state S1 of the RF signal 308C and the phase at the fundamental frequency for the state S1 of the RF signal 308A. The measured phase difference between the measured phase at the nth harmonic frequency for the state S1 of the RF signal 308C and the measured phase at the fundamental frequency for the state S1 of the RF signal 308A is calculated by the digital signal processor of the sub generator HFGf0MS and sent to the phase controllers ϕf0S1 and ϕfnS1.

Upon determining that the measured phase difference for the state S1 of the RF signal 308C is not substantially the same as the pre-determined phase difference between the phase at the nth harmonic frequency for the state S1 of the RF signal 308C and the phase at the fundamental frequency for the state S1 of the RF signal 308A, the digital signal processor controls the phase controller ϕf0S1 or ϕfnS1 or both the phase controllers ϕf0S1 and ϕfnS1 until the measured phase difference for the state S1 of the RF signal 308C is substantially the same as the pre-determined phase difference for the state S1 of the RF signal 308C. For example, the digital signal processor sends a signal to the phase controller ϕf0S1 or sends a signal to the phase controller ϕfnS1 or sends the signals to both the phase controllers ϕf0S1 and ϕfnS1. Upon receiving the signal from the digital signal processor, the phase controller ϕf0S1 modifies the phase at the fundamental frequency f0 for the state S1 of the RF signal 308A until the measured phase difference for the state S1 of the RF signal 308C is substantially the same as the pre-determined phase difference for the state S1 of the RF signal 308C. Similarly, upon receiving the signal from the digital signal processor, the phase controller ϕfnS1 modifies the phase at the nth harmonic frequency for the state S1 of the RF signal 308C until the measured phase difference for the state S1 of the RF signal 308C is substantially the same as the pre-determined phase difference for the state S1 of the RF signal 308C.

Moreover, the digital signal processor of the sub generator HFGf0MS determines whether the measured phase at the nth harmonic frequency for the state S0 of the RF signal 308C is locked with the measured phase at the fundamental frequency for the state S0 of the RF signal 308A. For example, the digital signal processor of the sub generator HFGf0MS determines whether a measured phase difference between the measured phase at the nth harmonic frequency for the state S0 of the RF signal 308C and the measured phase at the fundamental frequency for the state S0 of the RF signal 308A is substantially the same as, such as equal to or within a pre-determined range from, the pre-determined phase difference between the phase at the nth harmonic frequency for the state S0 of the RF signal 308C and the phase at the fundamental frequency for the state S0 of the RF signal 308A. The measured phase difference between the measured phase at the nth harmonic frequency for the state S0 of the RF signal 308C and the measured phase at the fundamental frequency for the state S0 of the RF signal 308A is calculated by the digital signal processor of the sub generator HFGf0MS and sent to the phase controllers ϕf0S0 and ϕfnS0.

Upon determining that the measured phase difference for the state S0 of the RF signal 308C is not substantially the same as the pre-determined phase difference between the phase at the nth harmonic frequency for the state S0 of the RF signal 308C and the phase at the fundamental frequency for the state S0 of the RF signal 308A, the digital signal processor controls the phase controller ϕf0S0 or ϕfnS0 or both the phase controllers ϕf0S0 and ϕfnS0 until the measured phase difference for the state S1 of the RF signal 308C is substantially the same as the pre-determined phase difference for the state S0 of the RF signal 308C. For example, the digital signal processor sends a signal to the phase controller ϕf0S0 or sends a signal to the phase controller ϕfnS0 or sends the signals to both the phase controllers ϕf0S0 and ϕfnS0. Upon receiving the signal from the digital signal processor, the phase controller ϕf0S0 modifies the phase at the fundamental frequency f0 for the state S0 of the RF signal 308A until the measured phase difference for the state S0 of the RF signal 308C is substantially the same as the pre-determined phase difference for the state S0 of the RF signal 308C. Similarly, upon receiving the signal from the digital signal processor, the phase controller ϕfnS0 modifies the phase at the nth harmonic frequency for the state S0 of the RF signal 308C until the measured phase difference for the state S0 of the RF signal 308C is substantially the same as the pre-determined phase difference for the state S0 of the RF signal 308C.

Furthermore, the digital signal processor of the sub generator HFGf0MS determines whether the measured parameter level at the (n−1)th harmonic frequency for the state S1 of the RF signal 308B is locked with the measured parameter level at the fundamental frequency for the state S1 of the RF signal 308A. For example, the digital signal processor of the sub generator HFGf0MS determines whether a measured parameter level difference between the measured parameter level at the (n−1)th harmonic frequency for the state S1 of the RF signal 308B and the measured parameter level at the fundamental frequency for the state S1 of the RF signal 308A is substantially the same as, such as equal to or within a pre-determined range from, the pre-determined parameter level difference between the parameter level at the (n−1)th harmonic frequency for the state S1 of the RF signal 308B and the parameter level at the fundamental frequency for the state S1 of the RF signal 308A. The measured parameter level difference between the measured parameter level at the (n−1)th harmonic frequency for the state S1 of the RF signal 308B and the measured parameter level at the fundamental frequency for the state S1 of the RF signal 308A is calculated by the digital signal processor of the sub generator HFGf0MS and sent to the parameter level controllers PRf0S1 and PRf(n−1)S1.

Upon determining that the measured parameter level difference for the state S1 of the RF signal 308B is not substantially the same as the pre-determined parameter level difference between the parameter level at the (n−1)th harmonic frequency for the state S1 of the RF signal 308B and the parameter level at the fundamental frequency for the state S1 of the RF signal 308A, the digital signal processor controls the parameter level controller PRf0S1 or PRf(n−1)S1 or both the parameter level controllers PRf0S1 and PRf(n−1)S1 until the measured parameter level difference for the state S1 of the RF signal 308B is substantially the same as the pre-determined parameter level difference for the state S1 of the RF signal 308B. For example, the digital signal processor sends a signal to the parameter level controller PRf0S1 or sends a signal to the parameter level controller PRf(n−1)S1 or sends the signals to both the parameter level controllers PRf0S1 and PRf(n−1)S1. Upon receiving the signal from the digital signal processor, the parameter level controller PRf0S1 modifies the parameter level at the fundamental frequency for the state S1 of the RF signal 308A until the measured parameter level difference for the state S1 of the RF signal 308B is substantially the same as the pre-determined parameter level difference for the state S1 of the RF signal 308B. Similarly, upon receiving the signal from the digital signal processor, the parameter level controller PRf(n−1)S1 modifies the parameter level at the (n−1)th harmonic frequency for the state S1 of the RF signal 308B until the measured parameter level difference for the state S1 of the RF signal 308B is substantially the same as the pre-determined parameter level difference for the state S1 of the RF signal 308B.

Also, the digital signal processor of the sub generator HFGf0MS determines whether the measured parameter level at the (n−1)th harmonic frequency for the state S0 of the RF signal 308B is locked with the measured parameter level at the fundamental frequency for the state S0 of the RF signal 308A. For example, the digital signal processor of the sub generator HFGf0MS determines whether a measured parameter level difference between the measured parameter level at the (n−1)th harmonic frequency for the state S0 of the RF signal 308B and the measured parameter level at the fundamental frequency for the state S0 of the RF signal 308A is substantially the same as, such as equal to or within a pre-determined range from, the pre-determined parameter level difference between the parameter level at the (n−1)th harmonic frequency for the state S0 of the RF signal 308B and the parameter level at the fundamental frequency for the state S0 of the RF signal 308A. The measured parameter level difference between the measured parameter level at the (n−1)th harmonic frequency for the state S0 of the RF signal 308B and the measured parameter level at the fundamental frequency for the state S0 of the RF signal 308A is calculated by the digital signal processor of the sub generator HFGf0MS and sent to the parameter level controllers PRf0S0 and PRf(n−1)S0.

Upon determining that the measured parameter level difference for the state S0 of the RF signal 308B is not substantially the same as the pre-determined parameter level difference between the parameter level at the (n−1)th harmonic frequency for the state S0 of the RF signal 308B and the parameter level at the fundamental frequency for the state S0 of the RF signal 308A, the digital signal processor controls the parameter level controller PRf0S0 or PRf(n−1)S0 or both the parameter level controllers PRf0S0 and PRf(n−1)S0 until the measured parameter level difference for the state S0 of the RF signal 308B is substantially the same as the pre-determined parameter level difference for the state S0 of the RF signal 308B. For example, the digital signal processor sends a signal to the parameter level controller PRf0S0 or sends a signal to the parameter level controller PRf(n−1)S0 or sends the signals to both the parameter level controllers PRf0S0 and PRf(n−1)S0. Upon receiving the signal from the digital signal processor, the parameter level controller PRf0S0 modifies the parameter level at the fundamental frequency f0 for the state S0 of the RF signal 308A until the measured parameter level difference for the state S0 of the RF signal 308B is substantially the same as the pre-determined parameter level difference for the state S0 of the RF signal 308B. Similarly, upon receiving the signal from the digital signal processor, the parameter level controller PRf(n−1)S0 modifies the parameter level at the (n−1)th harmonic frequency for the state S0 of the RF signal 308B until the measured parameter level difference for the state S0 of the RF signal 308B is substantially the same as the pre-determined parameter level difference for the state S0 of the RF signal 308B.

Similarly, the digital signal processor of the sub generator HFGf0MS determines whether the measured parameter level at the nth harmonic frequency for the state S1 of the RF signal 308C is locked with the measured parameter level at the fundamental frequency for the state S1 of the RF signal 308A. For example, the digital signal processor of the sub generator HFGf0MS determines whether a measured parameter level difference between the measured parameter level at the nth harmonic frequency for the state S1 of the RF signal 308C and the measured parameter level at the fundamental frequency for the state S1 of the RF signal 308A is substantially the same as, such as equal to or within a pre-determined range from, the pre-determined parameter level difference between the parameter level at the nth harmonic frequency for the state S1 of the RF signal 308C and the parameter level at the fundamental frequency for the state S1 of the RF signal 308A. The measured parameter level difference between the measured parameter level at the nth harmonic frequency for the state S1 of the RF signal 308C and the measured parameter level at the fundamental frequency for the state S1 of the RF signal 308A is calculated by the digital signal processor of the sub generator HFGf0MS and sent to the parameter level controllers PRf0S1 or PRfnS1.

Upon determining that the measured parameter level difference for the state S1 of the RF signal 308C is not substantially the same as the pre-determined parameter level difference between the parameter level at the nth harmonic frequency for the state S1 of the RF signal 308C and the parameter level at the fundamental frequency for the state S1 of the RF signal 308A, the digital signal processor controls the parameter level controller PRf0S1 or PRfnS1 or both the parameter level controllers PRf0S1 and PRfnS1 until the measured parameter level difference for the state S1 of the RF signal 308C is substantially the same as the pre-determined parameter level difference for the state S1 of the RF signal 308C. For example, the digital signal processor sends a signal to the parameter level controller PRf0S1 or sends a signal to the parameter level controller PRfnS1 or sends the signals to both the parameter level controllers PRf0S1 and PRfnS1. Upon receiving the signal from the digital signal processor, the parameter level controller PRf0S1 modifies the parameter level at the fundamental frequency f0 for the state S1 of the RF signal 308A until the measured parameter level difference for the state S1 of the RF signal 308C is substantially the same as the pre-determined parameter level difference for the state S1 of the RF signal 308C. Similarly, upon receiving the signal from the digital signal processor, the parameter level controller PRfnS1 modifies the parameter level at the nth harmonic frequency for the state S1 of the RF signal 308C until the measured parameter level difference for the state S1 of the RF signal 308C is substantially the same as the pre-determined parameter level difference for the state S1 of the RF signal 308C.

Also, the digital signal processor of the sub generator HFGf0MS determines whether the measured parameter level at the nth harmonic frequency for the state S0 of the RF signal 308C is locked with the measured parameter level at the fundamental frequency for the state S0 of the RF signal 308A. For example, the digital signal processor of the sub generator HFGf0MS determines whether a measured parameter level difference between the measured parameter level at the nth harmonic frequency for the state S0 of the RF signal 308C and the measured parameter level at the fundamental frequency for the state S0 of the RF signal 308A is substantially the same as, such as equal to or within a pre-determined range from, the pre-determined parameter level difference between the parameter level at the nth harmonic frequency for the state S0 of the RF signal 308C and the parameter level at the fundamental frequency for the state S0 of the RF signal 308A. The measured parameter level difference between the measured parameter level at the nth harmonic frequency for the state S0 of the RF signal 308C and the measured parameter level at the fundamental frequency for the state S0 of the RF signal 308A is calculated by the digital signal processor of the sub generator HFGf0MS and sent to the parameter level controllers PRf0S0 or PRfnS0.

Upon determining that the measured parameter level difference for the state S0 of the RF signal 308C is not substantially the same as the pre-determined parameter level difference between the parameter level at the nth harmonic frequency for the state S0 of the RF signal 308C and the parameter level at the fundamental frequency for the state S0 of the RF signal 308A, the digital signal processor controls the parameter level controller PRf0S0 or PRfnS0 or both the parameter level controllers PRf0S0 and PRfnS0 until the measured parameter level difference for the state S0 of the RF signal 308C is substantially the same as the pre-determined parameter level difference for the state S0 of the RF signal 308C. For example, the digital signal processor sends a signal to the parameter level controller PRf0S0 or sends a signal to the parameter level controller PRfnS0 or sends the signals to both the parameter level controllers PRf0S0 and PRfnS0. Upon receiving the signal from the digital signal processor, the parameter level controller PRf0S0 modifies the parameter level at the fundamental frequency f0 for the state S0 of the RF signal 308A until the measured parameter level difference for the state S0 of the RF signal 308C is substantially the same as the pre-determined parameter level difference for the state S0 of the RF signal 308C. Similarly, upon receiving the signal from the digital signal processor, the parameter level controller PRfnS0 modifies the parameter level at the nth harmonic frequency for the state S0 of the RF signal 308C until the measured parameter level difference for the state S0 of the RF signal 308C is substantially the same as the pre-determined parameter level difference for the state S0 of the RF signal 308C.

The power supply PSUf0 generates an RF signal 508A with the modified fundamental frequency for the state S1 of the clock signal and the modified fundamental frequency for the state S0 of the clock signal, or the modified phase at the fundamental frequency for the state S1 and the modified phase at the fundamental frequency for the state S0, or the modified parameter level at the fundamental frequency for the state S1 and the modified parameter level at the fundamental frequency for the state S0, or a combination thereof, and supplies the RF signal 508A via the RF cable 114A to the input I1 of the RF match. Moreover, the power supply PSUf(n−1) generates an RF signal 508B with the modified (n−1)th harmonic frequency for the state S1 of the clock signal and the modified (n−1)th harmonic frequency for the state S0 of the clock signal, or the modified phase at the (n−1)th harmonic frequency for the state S1 and the modified phase at the (n−1)th harmonic frequency for the state S0, or the modified parameter level at the (n−1)th harmonic frequency for the state S1 and the modified parameter level at the (n−1)th harmonic frequency for the state S0, or a combination thereof, and supplies the RF signal 508B via the RF cable 114B to the input I2 of the RF match. Also, the power supply PSUfn generates an RF signal 508C with the modified nth harmonic frequency for the state S1 of the clock signal and the modified nth harmonic frequency for the state S0 of the clock signal, or the modified phase at the nth harmonic frequency for the state S1 and the modified phase at the nth harmonic frequency for the state S0, or the modified parameter level at the nth harmonic frequency for the state S1 and the modified parameter level at the nth harmonic frequency for the state S0, or a combination thereof, and supplies the RF signal 508C via the RF cable 114C to the input I3 of the RF match.

The RF match upon receiving the RF signals 508A through 508C and the RF signal 318 of FIG. 3A from the low frequency RF generator LFGMS of FIG. 3A, matches an impedance of the load coupled to the output O1 with that of the source coupled to the inputs I1 through I4 to generate modified RF signals and combines, such as sums, the modified RF signals to generate a modified RF signal 510. The RF match supplies the modified RF signal 510 via the RF transmission line 116 to the chuck 212 (FIG. 3A) of the plasma chamber. When the modified RF signal 510 is applied to the plasma chamber, RF harmonics of the plasma sheath within the plasma chamber are controlled to achieve radial etch uniformity.

It should be noted that each of the RF signals 308A through 308C have the same state during the same time period. For example, each of the RF signal 308A, 308B, and 308C has the state S1 during a time period between the time t1 and 0 of FIG. 3B in which the clock signal 350 of FIG. 3B has the state S1. Also, each of the RF signal 308A, 308B, and 308C has the state S0 during a time period between the time t1 and t2 of FIG. 3B in which the clock signal 350 has the state S0. Similarly, the modified RF signals 508A through 508C have the same state during the same time period.

In some embodiments, each parameter level, described herein, of an RF signal, is an envelope of the RF signal. For example, a parameter level, described herein, of an RF signal is a zero-to-peak magnitude of the RF signal or a peak-to-peak magnitude of the RF signal.

Figure 6:
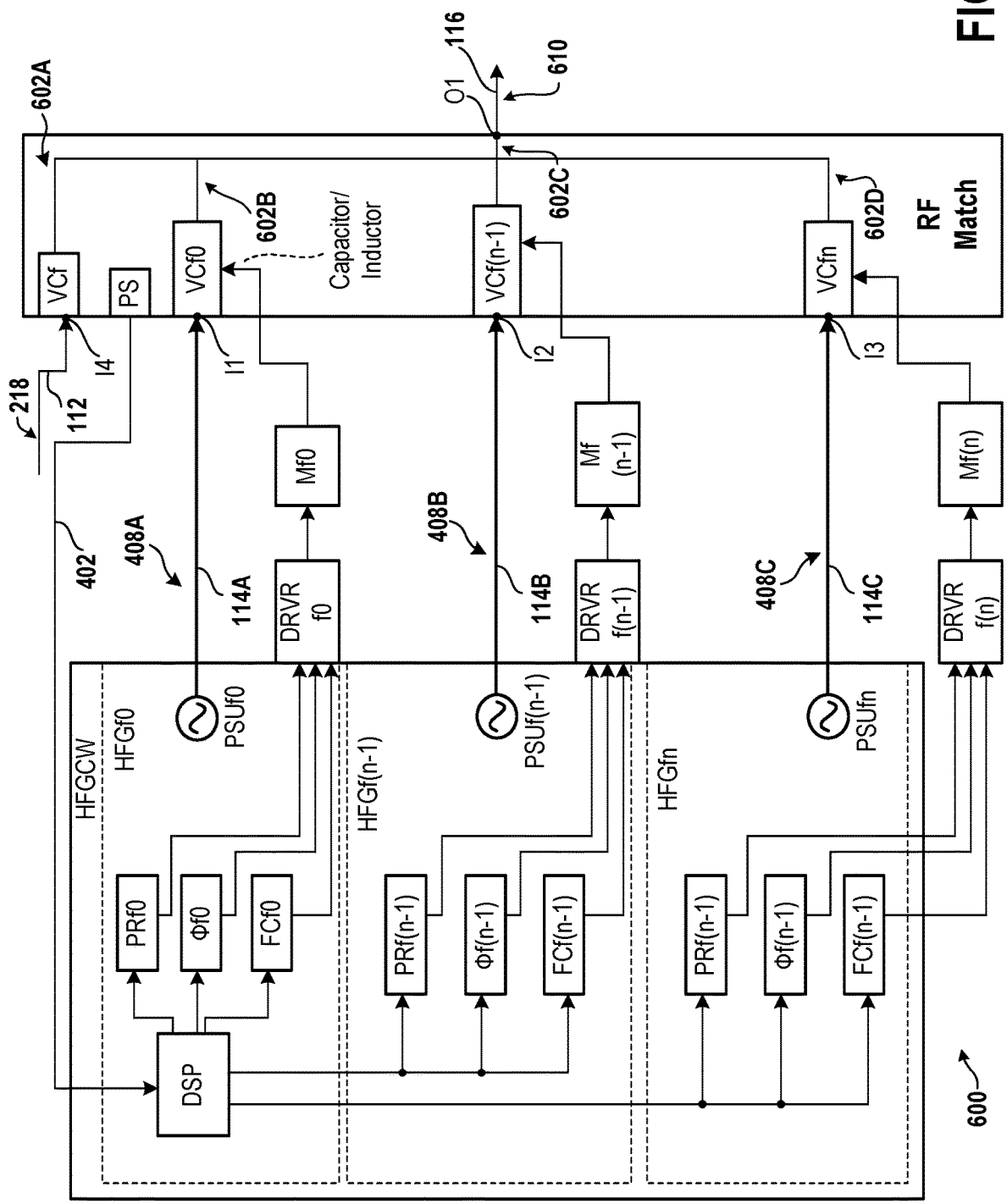
FIG. 6 is a diagram of an embodiment of a system to illustrate control of one or more variable components within an RF match to lock an (n−1)th harmonic frequency of an RF signal and an nth harmonic frequency of another RF signal to a fundamental frequency of yet another RF signal, to lock a phase at the (n−1)th harmonic frequency of the RF signal and a phase at the nth harmonic frequency of the other RF signal to a phase at the fundamental frequency of the yet other RF signal, and to lock a parameter level at the (n−1)th harmonic frequency of the RF signal and a parameter level at the nth harmonic frequency of the other RF signal to a parameter level at fundamental frequency of the yet another RF signal.

FIG. 6 is a diagram of an embodiment of a system 600 to illustrate control of one or more variable components within the RF match to lock the (n−1)th harmonic frequency of the RF signal 208B of FIG. 2A and the nth harmonic frequency of the RF signal 208C of FIG. 2A to the fundamental frequency of the RF signal 208A of FIG. 2A, to lock the phase at the (n−1)th harmonic frequency of the RF signal 208B and the phase at the nth harmonic frequency of the RF signal 208C to the phase at the fundamental frequency of the RF signal 208A, and to lock the parameter level at the (n−1)th harmonic frequency of the RF signal 208B and the parameter level at the nth harmonic frequency of the RF signal 208C to the parameter level at fundamental frequency of the RF signal 208A. The system 600 includes the high frequency RF generator HFGCW and the RF match. The RF match includes a variable component circuit VCf0, which includes one or more variable components coupled to each other in a manner, such as in series or in parallel or as a shunt. Examples of a variable component, as used herein, include an inductor and a capacitor. The variable component circuit VFf0 is coupled to the input I1 and to a motor system MCf0, which is further coupled to a driver system DRVRf0. An example of a motor system, as used herein, includes one or more electric motors, such as direct current (DC) motors or alternating current (AC) motors, which convert electrical energy into mechanical energy. The driver system DRVRf0 is coupled to the parameter controller PRf0, the phase controller $\phi$f0, and to the frequency controller FCf0.

The RF match further includes another variable component circuit VCf(n−1), which includes one or more variable components coupled with each other in a manner, examples of which are provided above. The variable component circuit VCf(n−1) is coupled to the input I2 and to a motor system MCf(n−1), which is further coupled to a driver system DRVRf(n−1). The driver system DRVRf(n−1) is coupled to the parameter controller PRf(n−1), the phase controller ϕf(n−1), and to the frequency controller FCf(n−1).

The RF match includes yet another variable component circuit VCfn, which includes one or more variable components coupled with each other in a manner, examples of which are provided above. The variable component circuit VCfn is coupled to the input I3 and to a motor system MCfn, which is further coupled to a driver system DRVRfn. The driver system DRVRfn is coupled to the parameter controller PRfn, the phase controller ϕfn, and to the frequency controller FCfn.

The RF match includes another variable component circuit VCf, which includes one or more variable components coupled with each other in a manner, examples of which are provided above. The variable component circuit VCf is coupled to the input I4.

The digital signal processor of the sub generator HFGf0CW determines whether the measured (n−1)th harmonic frequency of the RF signal 208B of FIG. 2A is locked with the measured fundamental frequency of the RF signal 208A FIG. 2A. Upon determining that the measured frequency difference is not substantially the same as the pre-determined frequency difference between the (n−1)th harmonic frequency of the RF signal 208B and the fundamental frequency of the RF signal 208A, the digital signal processor of the sub generator HFGf0CW sends a signal to the frequency controller FCf0 or the frequency controller fCf(n−1) or both the frequency controllers FCf0 and FCf(n−1). Upon receiving the signal, the frequency controller FCf0 controls the variable component circuit VCf0 via the driver system DRVRf0 and the motor system Mf0 until the measured frequency difference is substantially the same as the pre-determined frequency difference. For example, the frequency controller FCf0 sends a signal to the driver system DRVRf0 to generate a current signal. Upon receiving the current signal from the driver system DRVRf0, the motor system Mf0 controls the variable component circuit VCf0 until the measured frequency difference is substantially the same as the pre-determined frequency difference. For example, the motor system Mf0 changes a distance between plates of a capacitor of the variable component circuit VCf0 or an area between the plates to change a capacitance of the capacitor. As another example, the motor system Mf0 changes a length of an inductor of the variable component circuit VCf0 or an area of a cross-section of the inductor to change an inductance of the inductor. Similarly, upon receiving the signal, the frequency controller FCf(n−1) controls the variable component circuit VCf(n−1) via the driver system DRVRf(n−1) and the motor system Mf(n−1) until the measured frequency difference is substantially the same as the pre-determined frequency difference.

Also, the digital signal processor of the sub generator HFGf0CW determines whether the measured nth harmonic frequency of the RF signal 208C of FIG. 2A is locked with the measured fundamental frequency of the RF signal 208A FIG. 2A. Upon determining that the measured frequency difference is not substantially the same as the pre-determined frequency difference between the nth harmonic frequency of the RF signal 208C and the fundamental frequency of the RF signal 208A, the digital signal processor of the sub generator HFGf0CW sends a signal to the frequency controller FCf0 or the frequency controller fCfn or both the frequency controllers FCf0 and FCfn. Upon receiving the signal, the frequency controller FCf0 controls the variable component circuit VCf0 via the driver system DRVRf0 and the motor system Mf0 until the measured frequency difference is substantially the same as the pre-determined frequency difference. Similarly, upon receiving the signal, the frequency controller FCfn controls the variable component circuit VCfn via the driver system DRVRfn and the motor system Mfn until the measured frequency difference is substantially the same as the pre-determined frequency difference.

Moreover, the digital signal processor of the sub generator HFGf0CW determines whether the measured phase at the (n−1)th harmonic frequency of the RF signal 208B is locked with the measured phase at the fundamental frequency of the RF signal 208A. Upon determining that the measured phase difference is not substantially the same as the pre-determined phase difference between the phase at the (n−1)th harmonic frequency of the RF signal 208B and the phase at the fundamental frequency of the RF signal 208A, the digital signal processor of the sub generator HFGf0CW sends a signal to the phase controller ϕf0 or ϕf(n−1) or both the phase controllers ϕf0 and ϕf(n−1). Upon receiving the signal, the phase controller ϕf0 controls the variable component circuit VCf0 via the driver system DRVRf0 and the motor system Mf0 until the measured phase difference is substantially the same as the pre-determined phase difference in the same manner in which the frequency controller FCf0 controls the variable component circuit VCf0. Also, upon receiving the signal, the phase controller ϕf(n−1) controls the variable component circuit VCf(n−1) via the driver system DRVRf(n−1) and the motor system Mf(n−1) until the measured phase difference is substantially the same as the pre-determined phase difference in the same manner in which the frequency controller FCf(n−1) controls the variable component circuit VCf(n−1).

Also, the digital signal processor of the sub generator HFGf0CW determines whether the measured phase at the nth harmonic frequency of the RF signal 208C is locked with the measured phase at the fundamental frequency of the RF signal 208A. Upon determining that the measured phase difference is not substantially the same as the pre-determined phase difference between the phase at the nth harmonic frequency of the RF signal 208C and the phase at the fundamental frequency of the RF signal 208A, the digital signal processor sends a signal to the phase controller ϕf0 or ϕfn or both the phase controllers ϕf0 and ϕfn. Upon receiving the signal, the phase controller ϕf0 controls the variable component circuit VCf0 via the driver system DRVRf0 and the motor system Mf0 until the measured phase difference is substantially the same as the pre-determined phase difference. Also, upon receiving the signal, the phase controller ϕfn controls the variable component circuit VCfn via the driver system DRVRfn and the motor system Mfn until the measured phase difference is substantially the same as the pre-determined phase difference in the same manner in which the frequency controller FCfn controls the variable component circuit VCfn.

Furthermore, the digital signal processor of the sub generator HFGf0CW determines whether the measured parameter level at the (n−1)th harmonic frequency of the RF signal 208B is locked with the measured parameter level at the fundamental frequency of the RF signal 208A. Upon determining that the measured parameter level difference is not substantially the same as the pre-determined parameter level difference between the parameter level at the (n−1)th harmonic frequency of the RF signal 208B and the parameter level at the fundamental frequency of the RF signal 208A, the digital signal processor sends a signal to the parameter level controller PRf0 or PRf(n−1) or both the parameter level controllers PRf0 and PRf(n−1). Upon receiving the signal, the parameter level controller PRf0 controls the variable component circuit VCf0 via the driver system DRVRf0 and the motor system Mf0 until the measured parameter level difference is substantially the same as the pre-determined parameter level difference in the same manner in which the frequency controller FCf0 controls the variable component circuit VCf0. Also, upon receiving the signal, the parameter level controller PRf(n−1) controls the variable component circuit VCf(n−1) via the driver system DRVRf(n−1) and the motor system Mf(n−1) until the measured parameter level difference is substantially the same as the pre-determined parameter level difference in the same manner in which the frequency controller FCf(n−1) controls the variable component circuit VCf(n−1).

Similarly, the digital signal processor of the sub generator HFGf0CW determines whether the measured parameter level at the nth harmonic frequency of the RF signal 208C is locked with the measured parameter level at the fundamental frequency of the RF signal 208A. Upon determining that the measured parameter level difference is not substantially the same as the pre-determined parameter level difference between the parameter level at the nth harmonic frequency of the RF signal 208C and the parameter level at the fundamental frequency of the RF signal 208A, the digital signal processor sends a signal to the parameter level controller PRf0 or PRfn or both the parameter level controllers PRf0 and PRfn. Upon receiving the signal, the parameter level controller PRf0 controls the variable component circuit VCf0 via the driver system DRVRf0 and the motor system Mf0 until the measured parameter level difference is substantially the same as the pre-determined parameter level difference. Also, upon receiving the signal, the parameter level controller PRfn controls the variable component circuit VCfn via the driver system DRVRfn and the motor system Mfn until the measured parameter level difference is substantially the same as the pre-determined parameter level difference in the same manner in which the frequency controller FCfn controls the variable component circuit VCfn.

The RF match upon receiving the RF signals 408A through 408C and the RF signal 218 from the low frequency RF generator LFGCW of FIG. 2A matches an impedance of the load coupled to the output O1 with that of the source coupled to the inputs I1 through I4 to generate corresponding RF signals 602A, 602B, 602C, and 602D, which are summed to generate modified RF signals and combines, such as sums, the modified RF signals to generate a modified RF signal 610 at the output O1. The modified RF signal 610 is supplied via the RF transmission line 116 to the chuck 212 (FIG. 2A) of the plasma chamber. When the modified RF signal 610 is applied to the plasma chamber, RF harmonics of the plasma sheath within the plasma chamber are controlled to achieve radial etch uniformity.

Figure 7:
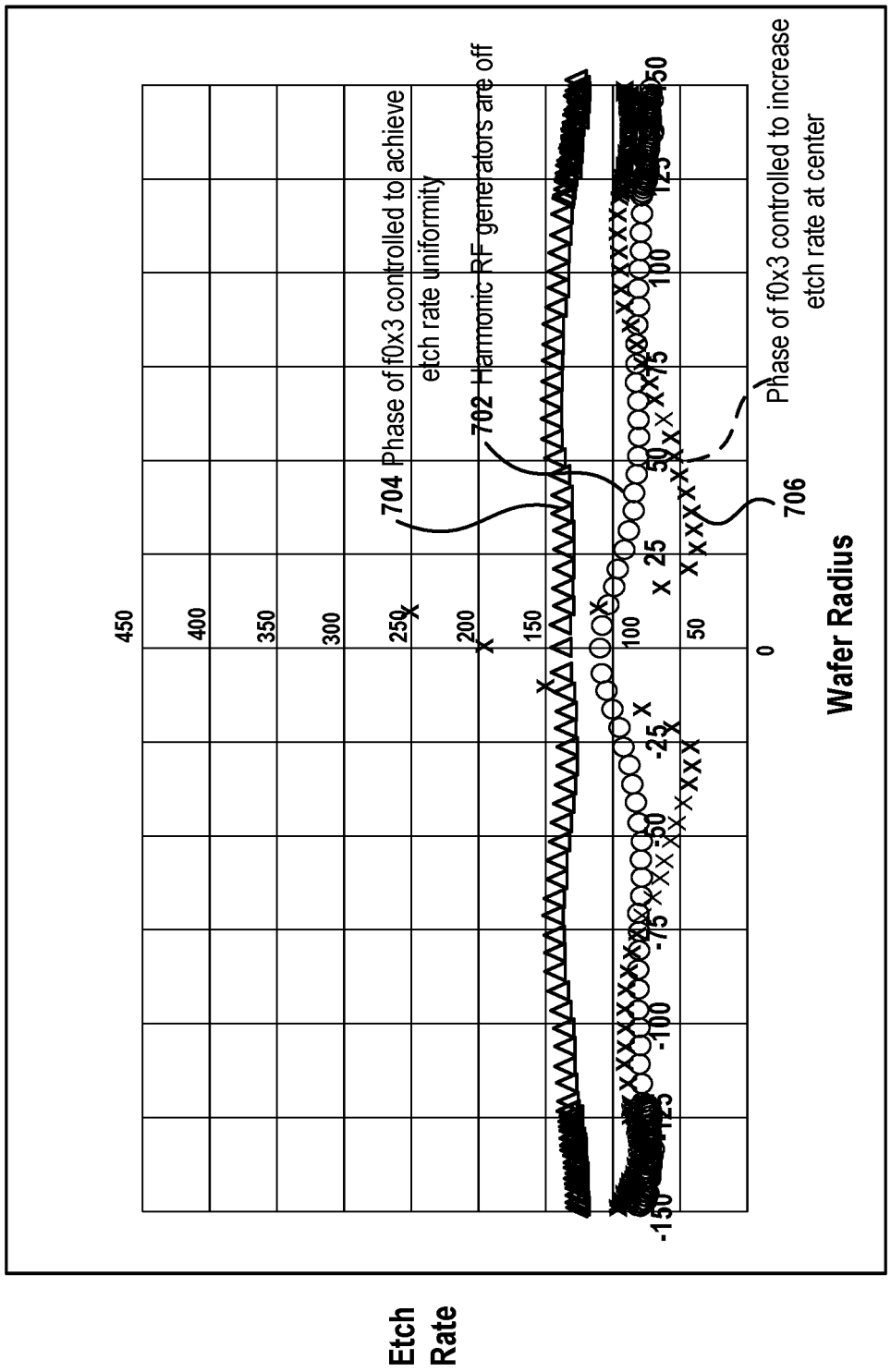
FIG. 7 is an embodiment of a graph to illustrate an etch rate of etching a substrate versus a radius of the substrate to provide an example of radial etch uniformity along the radius of the substrate.

FIG. 7 is an embodiment of a graph 700 to illustrate an etch rate of etching the substrate S versus a radius of the substrate S to provide an example of radial etch uniformity along the radius of the substrate S. The graph 700 includes a plot 702, another plot 704, and yet another plot 706. The plot 702 is generated when the sub generators HFGf(n−1)CW and HFGfnCW of FIG. 2 are turned off, e.g., are non-operational, not supplying power, etc., and the sub generator HFGf0CW is turned on, e.g., operational, supplying power, etc. Moreover, the plot 704 is generated when the sub generator HFGf0CW is turned on and when the phase controller ϕfn controls the phase of the RF signal 208C to achieve uniformity in the etch rate at or close to a center region of the substrate S. Also, the plot 706 is generated the sub generator HFGf0CW is turned on and when the phase controller ϕfn controls the phase of the RF signal 208C to achieve less uniformity of the etch rate at or close to the center region of the substrate S. By controlling the phase of the RF signal 208C, the etch rate of etching the substrate S is controlled to further control uniformity in the etch rate radially across the top surface of the substrate S.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for controlling radial etch uniformity, comprising:
  generating, by a first radio frequency (RF) oscillator of a single RF generator, a first RF signal having a fundamental frequency and a first phase;
  generating, by a second RF oscillator of the single RF generator, a second RF signal having an (n−1)th harmonic frequency and a second phase based on the fundamental frequency and the first phase respectively, wherein n is an integer greater than two;
  generating, by a third RF oscillator of the single RF generator, a third RF signal having an nth harmonic frequency and a third phase based on the fundamental frequency and the first phase respectively;

receiving, by a single RF match, the first, second, third RF signals, wherein the first RF signal is used to output a first modified signal within the single RF match, the second RF signal is used to output a second modified signal within the single RF match, and the third RF signal is used to output a third modified signal within the single RF match;

combining, within the single RF match, the first modified signal, the second modified signal, and the third modified signal to output a combined RF signal, wherein the combined RF signal is output based on the fundamental frequency and the first phase, the (n−1)th harmonic frequency and the second phase, and the nth harmonic frequency and the third phase;

providing, by the single RF match, the combined RF signal to an electrode of a plasma chamber to control the radial etch uniformity across a surface of a substrate during an etch operation;

receiving, from a sensor within the single RF match, a measured parameter signal;

determining a measured phase of the fundamental frequency, a measured phase of the (n−1)th harmonic frequency, and a measured phase of the nth harmonic frequency from the measured parameter signal;

adjusting, by the single RF generator, the second phase of the second RF signal based on the measured phase of the fundamental frequency and the measured phase of the (n−1)th harmonic frequency; and adjusting, by the single RF generator, the third phase of the third RF signal based on the measured phase of the fundamental frequency and the measured phase of the nth harmonic frequency.

2. The method of claim 1, wherein the first RF signal is a high RF signal, the method further comprising:
generating a low RF signal;
receiving, by the RF match, the low RF signal, wherein the combined RF signal is output based on the first, second, and third RF signals, and the low RF signal.

3. The method of claim 1, wherein the (n−1)th harmonic frequency is locked with the fundamental frequency and the nth harmonic frequency is locked with the fundamental frequency, wherein the second phase is locked with the first phase and the third phase is locked with the first phase, wherein the first RF signal has a first parameter level, the second RF signal has a second parameter level, and the third RF signal has a third parameter level, wherein the second parameter level is locked with the first parameter level and the third parameter level is locked with the first parameter level.

4. The method of claim 1, wherein the measured parameter is signal is an electrical signal, the method further comprising:
analyzing data within the electrical signal to identify a measured fundamental frequency, a measured (n−1)th harmonic frequency, and a measured nth harmonic frequency;
calculating a first difference between the measured (n−1)th harmonic frequency and the measured fundamental frequency;
calculating a second difference between the measured nth harmonic frequency and the measured fundamental frequency;
comparing at least one of the first difference with a first pre-determined threshold and the second difference with a second pre-determined threshold;

modifying at least one of the fundamental frequency of the first RF signal and the (n−1)th harmonic frequency of the second RF signal in response to determining that the first difference is greater than the first pre-determined threshold; and modifying at least one of the fundamental frequency of the first RF signal and the nth harmonic frequency of the third RF signal in response to determining that the second difference is greater than the second pre-determined threshold.

5. The method of claim 1, wherein the measured parameter signal is an electrical signal, the method further comprising:
calculating a first difference between the measured phase of the (n−1)th harmonic frequency and the measured phases at the fundamental frequency;
calculating a second difference between the third one of the measured phases at the nth harmonic frequency and the first one of the measured phase of the fundamental frequency;
comparing at least one of the first difference with a first pre-determined threshold and the second difference with a second pre-determined threshold,
wherein said adjusting the second phase includes modifying the second phase of the second RF signal in response to determining that the first difference is greater than the first pre-determined threshold, and
wherein said adjusting the third phase includes modifying the third phase of the third RF signal in response to determining that the second difference is greater than the second pre-determined threshold.

6. The method of claim 1, wherein the first RF signal has a first parameter level, the second RF signal has a second parameter level, and the third RF signal has a third parameter level, wherein the measured parameter signal is an electrical signal, the method further comprising:
analyzing data within the electrical signal to identify a measured parameter level at the fundamental frequency, a measured parameter level at the (n−1)th harmonic frequency, and a measured parameter level at the nth harmonic frequency;
calculating a first difference between the measured parameter level at the (n−1)th harmonic frequency and the measured parameter level at the fundamental frequency;
calculating a second difference between the measured parameter level at the nth harmonic frequency and the measured parameter level at the fundamental frequency;
comparing at least one of the first difference with a first pre-determined threshold and the second difference with a second pre-determined threshold;
modifying at least one of the first parameter level of the first RF signal and the second parameter level of the second RF signal in response to determining that the first difference is greater than the first pre-determined threshold; and
modifying at least one of the first parameter level of the first RF signal and the third parameter level of the third RF signal in response to determining that the second difference is greater than the second pre-determined threshold.

7. The method of claim 1, wherein the (n−1)th harmonic frequency is a second harmonic frequency and the nth harmonic frequency is a third harmonic frequency.

8. The method of claim 1, wherein at least one of the first RF signal, the second RF signal and the third RF signal is a continuous wave signal.

9. The method of claim 1, wherein said receiving the first, second and third RF signals comprises receiving the first RF signal at a first input of the single RF match, the second RF signal at a second input of the single RF match, and the third RF signal at a third input of the RF single match.

10. A system for controlling radial etch uniformity, comprising:
a single radio frequency (RF) generator including:
a first RF oscillator configured to generate a first RF signal having a fundamental frequency and a first phase;
a second RF oscillator configured to generate a second RF signal having an (n−1)th harmonic frequency and a second phase based on the fundamental frequency and the first phase respectively, wherein n is an integer greater than two;
a third RF oscillator configured to generate a third RF signal having an nth harmonic frequency and a third phase based on the fundamental frequency and the first phase respectively;
a single RF match coupled to the first, second, and third RF oscillators for receiving the first, second, third RF signals, wherein the single RF match is configured to output a first modified signal from the first RF signal, output a second modified signal from the second RF signal, and output a third modified signal from the third RF signal, wherein the single RF match is configured to combine the first, second, and third modified signals to output a combined RF signal, wherein the combined RF signal is output based on the fundamental frequency and the first phase, the (n−1)th harmonic frequency and the second phase, and the nth harmonic frequency and the third phase, wherein the combined RF signal is used to control the radial etch uniformity across a surface of a substrate during an etch operation in a plasma chamber,
wherein the single RF generator is configured to:
receive, from a sensor within the single RF match, a measured parameter signal;
determine a measured phase of the fundamental frequency, a measured phase of the (n−1)th harmonic frequency, and a measured phase of the nth harmonic frequency from the measured parameter signal;
adjust the second phase of the second RF signal based on the measured phase of the fundamental frequency and the measured phase of the (n−1)th harmonic frequency; and
adjust the third phase of the third RF signal based on the measured phase of the fundamental frequency and the measured phase of the nth harmonic frequency.

11. The system of claim 10, wherein the single RF generator is a high frequency RF generator, the system further comprising:
a low frequency RF generator configured to generate a low RF signal, wherein the single RF match is configured to receive the low RF signal, wherein the combined RF signal is output based on the first, second, and third RF signals, and the low RF signal.

12. The system of claim 10, wherein the (n−1)th harmonic frequency is locked with the fundamental frequency and the nth harmonic frequency is locked with the fundamental frequency, wherein the second phase is locked with the first phase and the third phase is locked with the first phase, wherein the first RF signal has a first parameter level, the second RF signal has a second parameter level, and the third RF signal has a third parameter level, wherein the second parameter level is locked with the first parameter level and the third parameter level is locked with the first parameter level.

13. The system of claim 10, wherein the measured parameter signal is an electrical signal, the system further comprising:
a processor coupled to the parameter sensor for analyzing data within the electrical signal to identify a measured fundamental frequency, a measured (n−1)th harmonic frequency, and a measured nth harmonic frequency,
wherein the processor is configured to:
calculate a first difference between the measured (n−1)th harmonic frequency and the measured fundamental frequency,
calculate a second difference between the measured nth harmonic frequency and the measured fundamental frequency,
compare the first difference with a first pre-determined threshold to determine whether the first difference is greater than the first pre-determined threshold and modify at least one of the fundamental frequency of the first RF signal and the (n−1)th harmonic frequency of the second RF signal in response to determining that the first difference is greater than the first pre-determined threshold, and
compare the second difference with a second pre-determined threshold to determine whether the second difference is greater than the second pre-determined threshold and modify at least one of the fundamental frequency of the first RF signal and the nth harmonic frequency of the third RF signal in response to determining that the second difference is greater than the second pre-determined threshold.

14. The system of claim 10, wherein the measured parameter signal is an electrical signal, the system further comprising:
a processor coupled to the parameter sensor for receiving the electrical signal,
wherein the processor is configured to:
calculate a first difference between the measured phase at the (n−1)th harmonic frequency and the measured phase at the fundamental frequency,
calculate a second difference between of the measured phase at the nth harmonic frequency and the measured phase at the fundamental frequency,
compare the first difference with a first pre-determined threshold to determine whether the first difference is greater than the first pre-determined threshold,
compare the second difference with a second pre-determined threshold to determine whether the second difference is greater than the second pre-determined threshold,
wherein to adjust the second phase, the processor is configured to modify the second phase of the second RF signal in response to determining that the first difference is greater than the first pre-determined threshold, and
wherein to adjust the third phase, the processor is configured to modify the third phase of the third RF signal in response to determining that the second difference is greater than the second pre-determined threshold.

15. The system of claim 10, wherein the first RF signal has a first parameter level, the second RF signal has a second parameter level, and the third RF signal has a third parameter level, wherein the measured parameter signal is an electrical signal, the system further comprising:
a processor coupled to the parameter sensor for analyzing data within the electrical signal to identify a measured parameter level at the fundamental frequency, a measured parameter level at the (n−1)th harmonic frequency, and a measured parameter level at the nth harmonic frequency,
wherein the processor is configured to:
calculate a first difference between the measured parameter level at the (n−1)th harmonic frequency and the measured parameter level at the fundamental frequency,
calculate a second difference between the measured parameter level at the nth harmonic frequency and the measured parameter level at the fundamental frequency,
compare at least one of the first difference with a first pre-determined threshold and the second difference with a second pre-determined threshold,
modify at least one of the first parameter level of the first RF signal and the second parameter level of the second RF signal in response to determining that the first difference is greater than the first pre-determined threshold, and
modify at least one of the first parameter level of the first RF signal and the third parameter level of the third RF signal in response to determining that the second difference is greater than the second pre-determined threshold.

16. The system of claim 10, wherein the (n−1)th harmonic frequency is a second harmonic frequency and the nth harmonic frequency is a third harmonic frequency.

17. The system of claim 10, wherein at least one of the first RF signal, the second RF signal and the third RF signal is a continuous wave signal.

18. The system of claim 10, wherein the single RF match has a first input for receiving the first RF signal, a second input for receiving the second RF signal, and a third input for receiving the third RF signal.

19. A system comprising:
a controller configured to control a first radio frequency (RF) oscillator of a single RF generator to generate a first RF signal having a fundamental frequency and a first phase;
wherein the controller is configured to control a second RF oscillator of the single RF generator to generate a second RF signal having an (n−1)th harmonic frequency and a second phase based on the fundamental frequency and the first phase respectively, wherein n is an integer greater than two,
wherein the controller is configured to control a third RF oscillator of the single RF generator to generate a third RF signal having an nth harmonic frequency and a third phase based on the fundamental frequency and the first phase respectively,
wherein the first, second, and third RF signals are configured to be supplied to a single RF match, wherein the first RF signal is modified by the single RF match to output a first modified signal, wherein the second RF signal is modified by the single RF match to output a second modified signal, and the third RF signal is modified by the single RF match to output a third modified signal, wherein the first, second, and third modified signals are combined within the single RF match to generate a combined RF signal, wherein the combined RF signal is output based on the fundamental frequency and the first phase, the (n−1)th harmonic frequency and the second phase, and the nth harmonic frequency and the third phase,
wherein the controller of the single RF generator is configured to:
receive, from a sensor within the single RF match, a measured parameter signal;
determine a measured phase of the fundamental frequency, a measured phase of the (n−1)th harmonic frequency, and a measured phase of the nth harmonic frequency from the measured parameter signal;
adjust the second phase of the second RF signal based on the measured phase of the fundamental frequency and the measured phase of the (n−1)th harmonic frequency; and
adjust the third phase of the third RF signal based on the measured phase of the fundamental frequency and the measured phase of the nth harmonic frequency.

20. The system of claim 19, wherein the first, second, and third controllers are integrated into one controller.

21. The system of claim 19, wherein the combined RF signal is configured to be supplied to an electrode of a plasma chamber to control radial etch uniformity across a surface of a substrate during an etch operation.

22. The system of claim 19, wherein the (n−1)th harmonic frequency is locked with the fundamental frequency and the nth harmonic frequency is locked with the fundamental frequency, wherein the second phase is locked with the first phase and the third phase is locked with the first phase, wherein the first RF signal has a first parameter level, the second RF signal has a second parameter level, and the third RF signal has a third parameter level, wherein the second parameter level is locked with the first parameter level and the third parameter level is locked with the first parameter level.

23. The system of claim 19, a wherein the controller is coupled to the parameter sensor for analyzing data within an electrical signal received from the parameter sensor, wherein the measured parameter signal is the electrical signal,
wherein the controller is configured to:
analyze the data to identify a measured fundamental frequency, a measured (n−1)th harmonic frequency, and a measured nth harmonic frequency,
calculate a first difference between the measured (n−1)th harmonic frequency and the measured fundamental frequency,
calculate a second difference between the measured nth harmonic frequency and the measured fundamental frequency,
compare the first difference with a first pre-determined threshold to determine whether the first difference is greater than the first pre-determined threshold;
modify at least one of the fundamental frequency of the first RF signal and the (n−1)th harmonic frequency of the second RF signal in response to determining that the first difference is greater than the first pre-determined threshold,
compare the second difference with a second pre-determined threshold to determine whether the second difference is greater than the second pre-determined threshold, and
modify at least one of the fundamental frequency of the first RF signal and the nth harmonic frequency of the third RF signal in response to determining that the second difference is greater than the second pre-determined threshold.

24. The system of claim 19, wherein the controller is coupled to the parameter sensor for receiving an electrical signal from the parameter sensor, wherein the measured parameter signal is the electrical signal, wherein the controller is configured to:
  calculate a first difference between the measured phase at the (n−1)th harmonic frequency and the measured phase at the fundamental frequency,
  calculate a second difference between the measured phase at the nth harmonic frequency and the measured phases at the fundamental frequency,
  compare the first difference with a first pre-determined threshold to determine whether the first difference is greater than the first pre-determined threshold,
  compare the second difference with a second pre-determined threshold to determine whether the second difference is greater than the second pre-determined threshold,
  wherein to adjust the second phase, the controller is configured to modify the second phase of the second RF signal in response to determining that the first difference is greater than the first pre-determined threshold,
  wherein to adjust the third phase, the controller is configured to modify the third phase of the third RF signal in response to determining that the second difference is greater than the second pre-determined threshold.

25. The system of claim 19, wherein the controller is coupled to the parameter sensor for analyzing data within an electrical signal received from the parameter sensor, wherein the measured parameter signal is the electrical signal, wherein the controller is configured to:
  analyze the data to identify a measured parameter level at the fundamental frequency, a measured parameter level at the (n−1)th harmonic frequency, and a measured parameter level at the nth harmonic frequency,
  calculate a first difference between the measured parameter level at the (n−1)th harmonic frequency and the measured parameter level at the fundamental frequency,
  calculate a second difference between the measured parameter level at the nth harmonic frequency and the measured parameter level at the fundamental frequency,
  compare at least one of the first difference with a first pre-determined threshold and the second difference with a second pre-determined threshold,
  modify at least one of a first parameter level of the first RF signal and a second parameter level of the second RF signal in response to determining that the first difference is greater than the first pre-determined threshold, and
  modify at least one of the first parameter level of the first RF signal and a third parameter level of the third RF signal in response to determining that the second difference is greater than the second pre-determined threshold.

26. The system of claim 19, wherein the (n−1)th harmonic frequency is a second harmonic frequency and the nth harmonic frequency is a third harmonic frequency.

27. The system of claim 19, wherein at least one of the first RF signal, the second RF signal and the third RF signal is a continuous wave signal.

28. The system of claim 19, wherein the first RF signal is supplied to a first input of the single RF match, the second RF signal is supplied to a second input of the single RF match, and the third RF signal is supplied to a third input of the single RF match.

29. The method of claim 1, wherein the measured parameter signal is generated based on a magnetic field.

* * * * *